US012575395B2

(12) United States Patent
Na et al.

(10) Patent No.: US 12,575,395 B2
(45) Date of Patent: Mar. 10, 2026

(54) SEMICONDUCTOR DEVICE

(71) Applicant: SAMSUNG ELECTRONICS CO., LTD., Suwon-si (KR)

(72) Inventors: Sang Cheol Na, Suwon-si (KR); Kyoung Woo Lee, Suwon-si (KR); Min Chan Gwak, Suwon-si (KR); Guk Hee Kim, Suwon-si (KR); Beom Jin Kim, Suwon-si (KR); Young Woo Kim, Suwon-si (KR); Anthony Dongick Lee, Suwon-si (KR); Myeong Gyoon Chae, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 378 days.

(21) Appl. No.: 18/457,311

(22) Filed: Aug. 28, 2023

(65) Prior Publication Data

US 2025/0079265 A1      Mar. 6, 2025

(30) Foreign Application Priority Data

Oct. 11, 2022    (KR) ......................... 10-2022-0129835
Mar. 2, 2023    (KR) ......................... 10-2023-0027846

(51) Int. Cl.
H01L 23/48         (2006.01)
H10D 30/01         (2025.01)
         (Continued)

(52) U.S. Cl.
CPC ......... H01L 23/481 (2013.01); H10D 30/014 (2025.01); H10D 30/024 (2025.01);
         (Continued)

(58) Field of Classification Search
CPC . H01L 23/481; H01L 21/7682; H01L 23/485; H10D 30/014; H10D 30/024;
         (Continued)

(56) References Cited

U.S. PATENT DOCUMENTS 11,257,764 B2    2/2022   Hiblot et al.
11,365,601 B2    6/2022   Chiang et al.
         (Continued)

FOREIGN PATENT DOCUMENTS

CN            114864496 A      8/2022
KR      10-2022-0079474        6/2022

*Primary Examiner* — Victor A Mandala
(74) *Attorney, Agent, or Firm* — MORGAN, LEWIS & BOCKIUS LLP

(57)                ABSTRACT

A semiconductor device includes a substrate that includes a first surface and a second surface, a first source/drain pattern disposed on the first surface of the substrate, a second source/drain pattern disposed on the first surface of the, a first source/drain contact disposed on the first source/drain pattern and connected to the first source/drain pattern, a second source/drain contact disposed on the second source/drain pattern and connected to the second source/drain pattern, a rear wiring line disposed on the second surface of the substrate, a first contact connection via that connects the rear wiring line with the first source/drain contact, a second contact connection via that connects the rear wiring line with the second source/drain contact and is spaced apart from the first contact connection via, and an air gap structure disposed between the first contact connection via and the second contact connection via.

20 Claims, 42 Drawing Sheets

(51) Int. Cl.

| | |
|---|---|
| *H10D 30/43* | (2025.01) |
| *H10D 30/62* | (2025.01) |
| *H10D 30/67* | (2025.01) |
| *H10D 62/10* | (2025.01) |
| *H10D 64/23* | (2025.01) |
| *H10D 84/01* | (2025.01) |
| *H10D 84/03* | (2025.01) |
| *H10D 84/85* | (2025.01) |

(52) U.S. Cl.
CPC .......... *H10D 30/43* (2025.01); *H10D 30/6211* (2025.01); *H10D 30/6219* (2025.01); *H10D 30/6729* (2025.01); *H10D 30/6735* (2025.01); *H10D 30/6757* (2025.01); *H10D 62/121* (2025.01); *H10D 64/258* (2025.01); *H10D 84/0167* (2025.01); *H10D 84/0186* (2025.01); *H10D 84/0188* (2025.01); *H10D 84/0193* (2025.01); *H10D 84/038* (2025.01); *H10D 84/853* (2025.01)

(58) Field of Classification Search
CPC .............. H10D 30/43; H10D 30/6211; H10D 30/6219; H10D 30/6729; H10D 30/6735; H10D 30/6757; H10D 62/121; H10D 64/258; H10D 84/0167; H10D 84/0186; H10D 84/0188; H10D 84/0193; H10D 84/038; H10D 84/853; H10D 84/0151; H10D 84/0149; H10D 84/0153; H10D 84/0158; H10D 84/832; H10D 84/834
See application file for complete search history.

(56) References Cited

U.S. PATENT DOCUMENTS

| | | | |
|---|---|---|---|
| 11,404,548 | B2 | 8/2022 | Yu et al. |
| 11,410,876 | B2 | 8/2022 | Chang et al. |
| 2021/0343578 | A1 | 11/2021 | Chang et al. |
| 2022/0020735 | A1 | 1/2022 | Song et al. |
| 2022/0037193 | A1 | 2/2022 | Yu et al. |
| 2022/0165856 | A1* | 5/2022 | Yu ...................... H10D 30/6757 |
| 2022/0181300 | A1 | 6/2022 | Uebmann et al. |
| 2023/0022101 | A1* | 1/2023 | Chou ................. H10D 84/0151 |
| 2023/0420525 | A1* | 12/2023 | Wang ................... H10D 62/121 |
| 2024/0021497 | A1* | 1/2024 | Liao ...................... H10D 84/83 |
| 2024/0079465 | A1* | 3/2024 | Cheng ................. H10D 62/121 |
| 2025/0248099 | A1* | 7/2025 | Kim ................... H10D 30/0194 |
| 2025/0266293 | A1* | 8/2025 | Chang ............... H10D 30/6729 |

* cited by examiner

SEMICONDUCTOR DEVICE

CROSS-REFERENCE TO RELATED APPLICATION

This application claims priority under 35 U.S.C. 119 from Korean Patent Application No. 10-2022-0129835, filed on Oct. 11, 2022, and Korean Patent Application No. 10-2023-0027846, filed on Mar. 2, 2023, both in the Korean Intellectual Property Office, the contents of both which are herein incorporated by reference in their entireties.

TECHNICAL FIELD

Embodiments of the present disclosure are directed to a semiconductor device.

DISCUSSION OF THE RELATED ART

A scaling technique for increasing a density of a semiconductor device is a multi-gate transistor in which a multi-channel active pattern (or silicon body) of a fin or nanowire shape is formed on a substrate and a gate is formed on a surface of the multi-channel active pattern.

Since this multi-gate transistor uses a three-dimensional channel, it is easy to scale the multi-gate transistor. In addition, even though a gate length of the multi-gate transistor is not increased, a current control capability is increased. In addition, a short channel effect (SCE) in which a potential of a channel area is affected by a drain voltage can be effectively suppressed.

As a pitch size of a semiconductor device is reduced, studies for reducing capacitance and ensuring electrical stability between contacts in the semiconductor device will be required.

SUMMARY

Embodiments of the present disclosure provide a semiconductor device with increased element performance and reliability.

According to an embodiment of the present disclosure, there is provided a semiconductor device that includes a substrate that includes a first surface and a second surface that are opposite to each other in a first direction, a first source/drain pattern disposed on the first surface of the substrate, a second source/drain pattern disposed on the first surface of the substrate and that is spaced apart from the first source/drain pattern in a second direction, a first source/drain contact disposed on the first source/drain pattern and that is connected to the first source/drain pattern, a second source/drain contact disposed on the second source/drain pattern and that is connected to the second source/drain pattern, a rear wiring line disposed on the second surface of the substrate, a first contact connection via that connects the rear wiring line with the first source/drain contact, a second contact connection via that connects the rear wiring line with the second source/drain contact and is spaced apart from the first contact connection via in the second direction, and an air gap structure disposed between the first contact connection via and the second contact connection via.

According to another embodiment of the present disclosure, there is provided a semiconductor device that includes a substrate that includes a first surface and a second surface that are opposite to each other in a first direction, a first fin-type pattern that protrudes from the first surface of the substrate in the first direction and extends in a second direction, a second fin-type pattern that protrudes from the first surface of the substrate in the first direction, extends in the second direction and is spaced apart from the first fin-type pattern in the second direction, a gate structure disposed on the first fin-type pattern and that extends in a third direction, wherein the gate structure includes a gate electrode and a gate insulating layer, where the gate electrode includes a long sidewall that extends in the third direction and a short sidewall that extends in the second direction, a first source/drain pattern disposed on the first fin-type pattern and that is connected to the first fin-type pattern, a second source/drain pattern disposed on the second fin-type pattern and that is connected to the second fin-type pattern, a first source/drain contact disposed on the first source/drain pattern and that is connected to the first source/drain pattern, a second source/drain contact disposed on the second source/drain pattern and that is connected to the second source/drain pattern, a rear wiring line disposed on the second surface of the substrate, a first contact connection via that connects the rear wiring line with the first source/drain contact and overlaps the first source/drain contact in the third direction, a second contact connection via that connects the rear wiring line with the second source/drain contact and overlaps the second source/drain contact in the third direction, and an air gap structure disposed between the first contact connection via and the second contact connection via.

According to still another embodiment of the present disclosure, there is provided a semiconductor device that includes a substrate that includes a first surface and a second surface that are opposite to each other in a first direction, a first element isolation structure disposed on the first surface of the substrate and that extends in a second direction, a second element isolation structure disposed on the first surface of the substrate and that extends in the second direction and is spaced apart from the first element isolation structure in a third direction, a first fin-type pattern that protrudes from the first surface of the substrate in the first direction and extends in the third direction, a second fin-type pattern that protrudes from the first surface of the substrate in the first direction, extends in the third direction and is spaced apart from the first fin-type pattern in the second direction, a gate electrode disposed on the first fin-type pattern and that extends in the second direction, a first source/drain pattern disposed on the first fin-type pattern and that is connected to the first fin-type pattern, a second source/drain pattern disposed on the second fin-type pattern and that is connected to the second fin-type pattern, a first source/drain contact disposed on the first source/drain pattern and that is connected to the first source/drain pattern, a second source/drain contact disposed on the second source/drain pattern and that is connected to the second source/drain pattern, first and second rear wiring lines disposed on the second surface of the substrate, a first contact connection via connected to the first rear wiring line between the first element isolation structure and the second element isolation structure, a second contact connection via connected to the second rear wiring line between the first element isolation structure and the second element isolation structure and that is spaced apart from the first contact connection via in the second direction, an air gap structure disposed between the first contact connection via and the second contact connection via, a first front wiring line disposed on the first element isolation structure and the second element isolation structure and that extends in the third direction and connects the first contact connection via with the first source/drain contact, and a second front wiring line disposed on the first element isolation structure and the second element isolation structure and that extends in the third direction and connects the second contact connection via with the second source/drain contact.

BRIEF DESCRIPTION OF THE DRAWINGS

Figure 22:
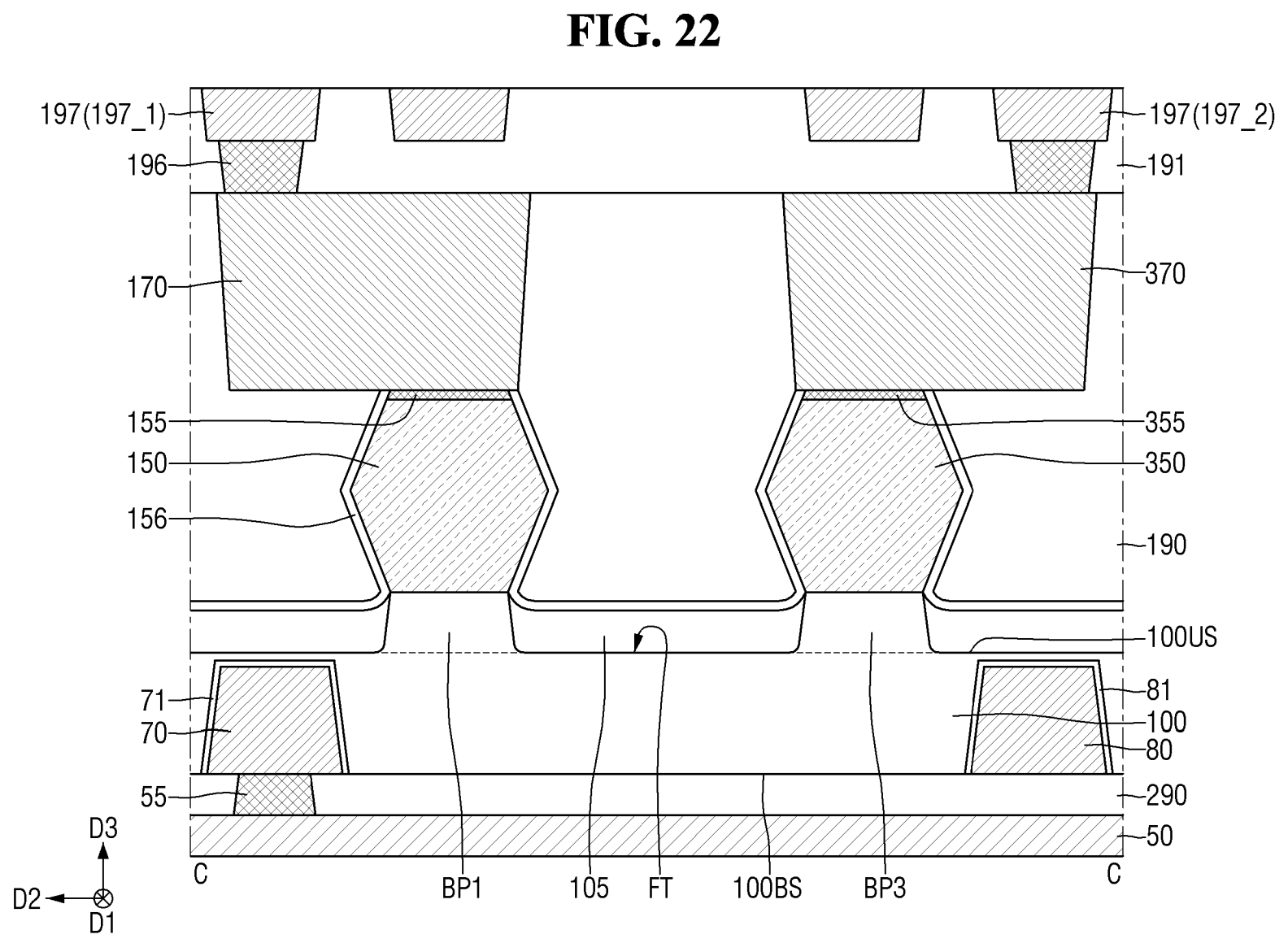

FIGS. 21 to 25 are cross-sectional views taken along lines A-A, C-C, D-D, F-F and G-G of FIG. 20.

FIGS. 26 to 39 illustrate intermediate steps of a method for manufacturing a semiconductor device according to some embodiments.

DETAILED DESCRIPTION

As shown, a semiconductor device according to some embodiments includes, but is not necessarily limited to, a fin-type transistor (FinFET) that includes a channel area of a fin-type pattern shape, a transistor that includes a nanowire or a nanosheet, or a multi-bridge channel field effect transistor (MBCFET™) by way of example.

A semiconductor device according to some embodiments may include a tunneling transistor (tunneling FET), a three-dimensional (3D) transistor or a vertical transistor (Vertical FET). A semiconductor device according to some embodiments may include a planar transistor. In addition, the technical spirits of the present disclosure may be applied to two-dimensional (2D) material based transistors (FETs) and a heterogeneous structure thereof. In addition, a semiconductor device according to some embodiments may include a bipolar junction transistor, a laterally diffused metal oxide semiconductor (LDMOS) transistor, etc.

Hereinafter, a semiconductor device according to some embodiments of the present disclosure will be described with reference to FIGS. 1 to 7.

Figure 1:
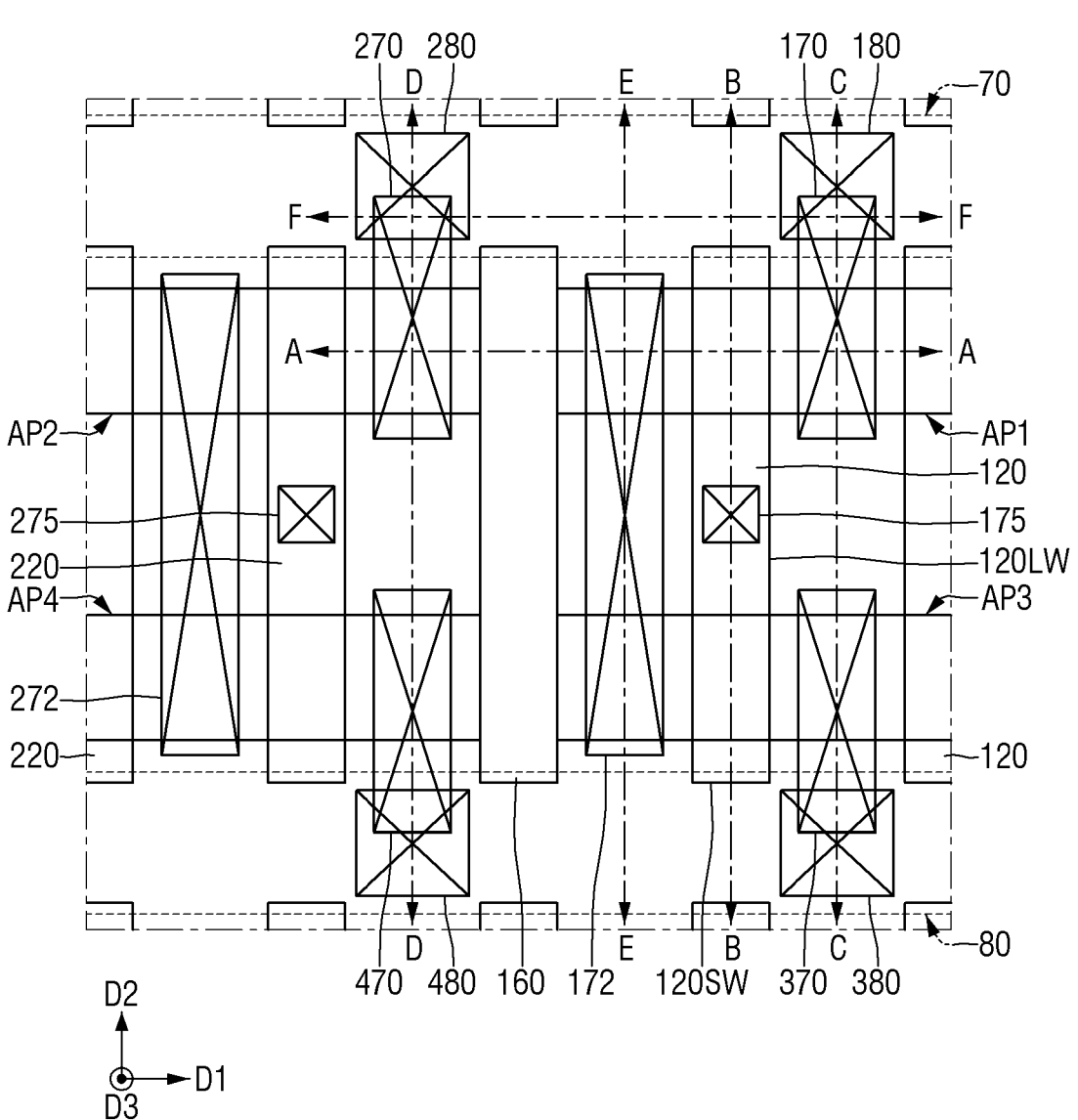
FIG. 1 is a layout view of a semiconductor device according to some embodiments.

FIG. 1 is a layout view of a semiconductor device according to some embodiments. FIGS. 2 to 7 are cross-sectional views taken along lines A-A, B-B, C-C, D-D, E-E and F-F of FIG. 1.

For convenience of illustration, a front wiring line 197 and a front wiring via 196 are not shown in FIG. 1.

Referring to FIGS. 1 to 7, a semiconductor device according to some embodiments includes a first substrate 100, a first active pattern AP1, a second active pattern AP2, a third active pattern AP3, a fourth active pattern AP4, a first rear wiring line 50, a second rear wiring line 60, a first buried conductive pattern 70, a second buried conductive pattern 80, a plurality of first gate electrodes 120, a plurality of second gate electrodes 220, a first source/drain pattern 150, a second source/drain pattern 250, a third source/drain pattern 350, a fourth source/drain pattern 450, a first element isolation structure 160, a first source/drain contact 170, a second source/drain contact 270, a third source/drain contact 370, a fourth source/drain contact 470, a first contact connection via 180, a second contact connection via 280, a third contact connection via 380, a fourth contact connection via 480, a first air gap structure 185ST, and a front wiring structure 195.

The substrate 100 includes a first surface 100US and a second surface 100BS that are opposite to each other in a third direction D3. Since the gate electrode 120 and the source/drain patterns 150, 250, 350 and 450 are disposed on the first surface 100US of the substrate, the first surface 100US of the substrate is an upper surface of the substrate 100. The second surface 100BS of the substrate that is opposite to the first surface 100US of the substrate is a lower surface of the substrate 100.

The substrate 100 may be made of a semiconductor material, or may include a semiconductor material. The substrate 100 may be a silicon substrate or a silicon-on-insulator (SOI) substrate. Alternatively, the substrate 100 includes, for example, at least one of silicon germanium, silicon germanium on insulator (SGOI), indium antimonide, lead telluride, indium arsenide, indium phosphide, gallium arsenide or gallium antimonide, but is not necessarily limited thereto.

Each of the active patterns AP1, AP2, AP3 and AP4 is disposed on the substrate 100. For example, each of the active patterns AP1, AP2, AP3 and AP4 is disposed on the first surface 100US of the substrate. Each of the active patterns AP1, AP2, AP3 and AP4 extends in a first direction D1.

The first active pattern AP1 is spaced apart from the second active pattern AP2 in the first direction D1. The first active pattern AP1 and the second active pattern AP2 are aligned along a line that extends in the first direction D1.

The third active pattern AP3 is spaced apart from the fourth active pattern AP4 in the first direction D1. The third active pattern AP3 and the fourth active pattern AP4 are aligned along a line that extends in the first direction D1.

The first active pattern AP1 is spaced apart from the third active pattern AP3 in a second direction D2. The second active pattern AP2 is spaced apart from the fourth active pattern AP4 in the second direction D2.

The first active pattern AP1 and the second active pattern AP2 are disposed in an area in which transistors of the same conductivity type are formed. The third active pattern AP3 and the fourth active pattern AP4 are disposed in an area in which transistors of the same conductivity type are formed.

For example, the first active pattern AP1 is disposed in an area in which P-type transistors are formed. The third active pattern AP3 is disposed in an area in which N-type transistors are formed.

Each of the active patterns AP1, AP2, AP3 and AP4 is a multi-channel active pattern. For example, the first active pattern AP1 includes a first lower pattern BP1 and a plurality of first sheet patterns NS1. The second active pattern AP2 includes a second lower pattern BP2 and a plurality of second sheet patterns NS2. The third active pattern AP3 includes a third lower pattern BP3 and a plurality of third sheet patterns NS3. The fourth active pattern AP4 includes a fourth lower pattern BP4. In addition, the fourth active pattern AP4 includes a plurality of fourth sheet patterns like the third active pattern AP3. In a semiconductor device according to some embodiments, each of the active patterns AP1, AP2, AP3 and AP4 includes a nanosheet or a nanowire.

Each of the lower patterns BP1. BP2, BP3 and BP4 protrudes from the substrate 100. For example, each of the lower patterns BP1, BP2, BP3 and BP4 protrudes from the first surface 100US of the substrate. Each of the lower patterns BP1, BP2, BP3 and BP4 is a fin-type pattern.

Each of the lower patterns BP1, BP2, BP3 and BP4 extends in the first direction D1. The first lower pattern BP1 is spaced apart from the second lower pattern BP2 in the first direction D1. The third lower pattern BP3 is spaced apart from the fourth lower pattern BP4 in the first direction D1. The first lower pattern BP1 is spaced apart from the third lower pattern BP3 in the second direction D2. The second lower pattern BP2 is spaced apart from the fourth lower pattern BP4 in the second direction D2.

Each of the lower patterns BP1, BP2, BP3 and BP4 is separated by a fin trench FT that extends in the first direction D1. For example, the first surface 100US of the substrate is a bottom surface of the fin trench FT. Each of the lower patterns BP1, BP2, BP3 and BP4 includes sidewalls that extend in the first direction D1. The sidewalls of each of the lower patterns BP1, BP2, BP3 and BP4 are defined by the fin trench FT.

The plurality of first sheet patterns NS1 are disposed on the first lower pattern BP1. The plurality of first sheet patterns NS1 are spaced apart from the first lower pattern BP1 in the third direction D3. The plurality of second sheet patterns NS2 are disposed on the second lower pattern BP2. The plurality of second sheet patterns NS2 are spaced apart from the second lower pattern BP2 in the third direction D3. The plurality of third sheet patterns NS3 are disposed on the third lower pattern BP3. The plurality of third sheet patterns NS3 are spaced apart from the third lower pattern BP3 in the third direction D3.

In addition, the plurality of fourth sheet patterns are disposed on the fourth lower pattern BP4. The plurality of fourth sheet patterns are spaced apart from the fourth lower pattern BP4 in the third direction D3. The sheet patterns NS1, NS2 and NS3 are disposed on the first surface 100US of the substrate.

The first direction D1 crosses the second direction D2 and the third direction D3. In addition, the second direction D2 crosses the third direction D3. The third direction D3 is a thickness direction of the first substrate 100. In an embodiment, the first direction D1, the second direction D2, and the third direction D3 are mutually perpendicular.

Each of the sheet patterns NS1, NS2 and NS3 includes an upper surface and a lower surface that are opposite to each other in the third direction D3. Each of the lower surfaces of the sheet patterns NS1, NS2 and NS3 face the substrate 100. Although three sheet patterns NS1, NS2 and NS3 are shown as being disposed in the third direction D3, this is for convenience of illustration, and embodiments of the present disclosure are not necessarily limited thereto.

Each of the sheet patterns NS1, NS2 and NS3 includes an uppermost sheet pattern farthest away from the substrate 100. For example, upper surfaces of the active patterns AP1, AP2 and AP3 are the upper surface of the uppermost sheet pattern of the sheet patterns NS1, NS2 and NS3. An upper surface of the fourth active pattern AP4 is an upper surface of the uppermost sheet pattern of the fourth sheet patterns.

Each of the lower patterns BP1, BP2, BP3 and BP4 is formed by etching a portion of the substrate 100 or includes an epitaxial layer grown from the substrate 100. Each of the lower patterns BP1, BP2, BP3 and BP4 includes at least one of silicon or germanium, which are elemental semiconductor materials. Each of the lower patterns BP1, BP2, BP3 and BP4 may include a compound semiconductor, and may include, for example, a Group IV-IV compound semiconductor or a Group III-V compound semiconductor.

The group IV-IV compound semiconductor may be a binary compound or ternary compound that includes at least two of carbon (C), silicon (Si), germanium (Ge) or tin (Sn), or a compound that includes at least two of carbon (C), silicon (Si), germanium (Ge) or tin (Sn) that are doped with a group IV element.

The group III-V compound semiconductor is, for example, one of a binary compound, a ternary compound or a quaternary compound that is formed by combination of at least one of aluminum (Al), gallium (Ga) or indium (In), which are group III elements, and one of phosphorus (P), arsenic (As) and antimony (Sb), which are group V elements.

Each of the sheet patterns NS1, NS2 and NS3 includes one of silicon or germanium, a Group IV-IV compound semiconductor or a Group III-V compound semiconductor. A width of the first sheet pattern NS1 in the second direction D2 is increased or decreased in proportion to a width of the first lower pattern BP1 in the second direction D2. The first sheet patterns NS1 disposed on the first lower pattern BP1 have the same width in the second direction D2, but are not necessarily limited thereto.

A field insulating layer 105 is disposed on the substrate 100. For example, the field insulating layer 105 is disposed on the first surface 100US of the substrate. The field insulating layer 105 fills at least a portion of the fin trench FT that separates the lower patterns BP1, BP2, BP3 and BP4.

The field insulating layer 105 is disposed on the substrate 100 between the lower patterns BP1, BP2, BP3 and BP4. For example, the field insulating layer 105 covers all sidewalls of the lower patterns BP1, BP2, BP3 and BP4. However, in some embodiments, the field insulating layer 105 covers a portion of the sidewalls of the lower pattern BP1, BP2, BP3 and BP4. For example, a portion of the lower patterns BP1, BP2, BP3 and BP4 protrudes in the third direction D3 above an upper surface of the field insulating layer 105.

The field insulating layer 105 does not cover an upper surface of the first lower pattern BP1. The field insulating layer 105 does not cover upper surfaces of the second to fourth lower patterns BP2, BP3 and BP4. Each of the sheet patterns NS1, NS2 and NS3 is disposed above the upper surface of the field insulating layer 105.

The field insulating layer 105 includes, for example, one of an oxide layer, a nitride layer, an oxynitride layer or their combination. The field insulating layer 105 is shown as a single layer, but this is for convenience of illustration, and embodiments are not necessarily limited thereto.

A plurality of first gate structures GS1 and a plurality of second gate structures GS2 are disposed on the first surface 100US of the substrate. Each of the first gate structure GS1 and the second gate structure GS2 extends in the second direction D2.

The first gate structures GS1 are spaced apart from each other in the first direction D1. The first gate structures GS1 are adjacent to each other in the first direction D1.

The second gate structures GS2 are spaced apart from each other in the first direction D1. The second gate structures GS2 are adjacent to each other in the first direction D1.

The first gate structure GS1 is disposed on the first active pattern AP1 and the third active pattern AP3. The first gate structure GS1 crosses the first active pattern AP1 and the third active pattern AP3.

The first gate structure GS1 crosses the first lower pattern BP1 and the third lower pattern BP3. The first gate structure GS1 surrounds each first sheet pattern NS1. The first gate structure GS1 surrounds each third sheet pattern NS3.

The second gate structure GS2 is disposed on the second active pattern AP2 and the fourth active pattern AP4. The second gate structure GS2 crosses the second active pattern AP2 and the fourth active pattern AP4.

The second gate structure GS2 crosses the second lower pattern BP2 and the fourth lower pattern BP4. The second gate structure GS2 surrounds each second sheet pattern NS2. The second gate structure GS2 surrounds each fourth sheet pattern.

The first gate structure GS1 is shown as being disposed over the first active pattern AP1 and the third active pattern AP3, but is not necessarily limited thereto. In some embodiments, a portion of the first gate structure GS1 is divided into two portions by a gate isolation structure disposed on the field insulating layer 105, and thus are separately disposed on the first active pattern AP1 and the third active pattern AP3. The aforementioned description of the first gate structure GS1 applies to the second gate structure GS2.

The first gate structure GS1 includes, for example, a first gate electrode 120, a first gate insulating layer 130, a first gate spacer 140, and a first gate capping pattern 145. The second gate structure GS2 includes, for example, a second gate electrode 220, a second gate insulating layer 230, a second gate spacer 240, and a second gate capping pattern 245.

The first gate structure GS1 includes a plurality of first inner gate structures INT_GS1 disposed between adjacent first sheet patterns NS1 in the third direction D3 and between the first lower pattern BP1 and the first sheet pattern NS1. The first inner gate structure INT_GS1 is disposed between the upper surface of the first lower pattern BP1 and the lower surface of the first sheet pattern NS1, and between the upper surface of the first sheet pattern NS1 and the lower surface of the first sheet pattern NS1 that face each other in the third direction D3.

The number of the first inner gate structures INT_GS1 is the same as the number of the first sheet patterns NS1. The first inner gate structure INT GS1 is in contact with the upper surface of the first lower pattern BP1, the upper surface of the first sheet pattern NS1 and the lower surface of the first sheet pattern NS1.

The first inner gate structure INT_GS1 includes a first gate electrode 120 and a first gate insulating layer 130 that are disposed between adjacent first sheet patterns NS1 and between the first lower pattern BP1 and the first sheet pattern NS1. In addition, the first inner gate structure INT_GS1 is disposed between adjacent third sheet patterns NS3 in the third direction D3 and between the third lower pattern BP3 and the third sheet pattern NS3.

The second gate structure GS2 includes a plurality of second inner gate structures INT_GS2 disposed between adjacent second sheet patterns NS2 in the third direction D3 and between the second lower pattern BP2 and the second sheet pattern NS2. In addition, the second inner gate structure INT_GS2 is disposed between adjacent fourth sheet patterns in the third direction D3 and between the fourth lower pattern BP4 and the fourth sheet pattern. The description of the second inner gate structure INT_GS2 is substantially the same as that of the first inner gate structure INT_GS1.

The following description will be based on the first active pattern AP1 and the first gate structure GS1, and the third active pattern AP3 and the first gate structure GS1. The description of the second gate structure GS2 is substantially the same as that of the first gate structure GS1.

The first gate electrode 120 is disposed on the first lower pattern BP1 and the third lower pattern BP3. The first gate electrode 120 crosses the first lower pattern BP1 and the third lower pattern BP3. The first gate electrode 120 surrounds the first sheet pattern NS1 and the third sheet pattern NS3.

The first gate electrode 120 include a long sidewall 120LW that extends in the second direction D2 and a short sidewall 120SW that extends in the first direction D1. In the cross-sectional view shown in FIG. 2, an upper surface of the first gate electrode 120 is shown as being curved downward toward the substrate 100, but embodiments are not necessarily limited thereto. For example, in some embodiments, the upper surface of the first gate electrode 120 is planar.

The first gate electrode 120 and the second gate electrode 220 include at least one of a metal, a metal alloy, a conductive metal nitride, a metal silicide, a doped semiconductor material, a conductive metal oxide or a conductive metal oxynitride. The first gate electrode 120 and the second gate electrode 220 include at least one of, for example, titanium nitride (TIN), tantalum carbide (TaC), tantalum nitride (TaN), titanium silicon nitride (TiSiN), tantalum silicon nitride (TaSIN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAICN), titanium aluminum carbide (TiAIC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (NiPt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), or vanadium (V), or their combination, but embodiments are not necessarily limited thereto. The conductive metal oxide and the conductive metal oxynitride may include an oxidized form of the above-described materials, but are not necessarily limited thereto.

The first gate insulating layer 130 extends along the upper surface of the field insulating layer 105, the upper surface of the first lower pattern BP1 and the upper surface of the third lower pattern BP3. The first gate insulating layer 130 surrounds the plurality of first sheet patterns NS1. The first gate insulating layer 130 surrounds the plurality of third sheet patterns NS3. The first gate insulating layer 130 is disposed along the periphery of the first sheet pattern NS1 and the periphery of the third sheet pattern NS3. The first gate electrode 120 is disposed on the first gate insulating layer 130.

The first gate insulating layer 130 is disposed between the first gate electrode 120 and the first sheet pattern NS1 and between the first gate electrode 120 and the third sheet pattern NS3. In a semiconductor device according to some embodiments, the first gate insulating layer 130 in the first inner gate structure INT_GS1 is in contact with the first source/drain pattern 150 that will be described below.

The first gate insulating layer 130 and the second gate insulating layer 230 each include at least one of silicon oxide, silicon oxynitride, silicon nitride, or a high dielectric constant (high-k) material that has a dielectric constant greater than that of silicon oxide. The high dielectric constant material includes at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

Each of the first gate insulating layer 130 and the second gate insulating layer 230 is shown as a single layer, but this is for convenience of illustration, and embodiments are not necessarily limited thereto. In some embodiments, each of the first gate insulating layer 130 and the second gate insulating layer 230 includes a plurality of layers. For example, the first gate insulating layer 130 includes an interfacial layer and a high dielectric constant layer that are disposed between the first active pattern AP1 and the first gate electrode 120 and between the third active pattern AP3 and the first gate electrode 120. For example, the interfacial layer is not formed along a profile of the upper surface of the field insulating layer 105.

A semiconductor device according to some embodiments includes a negative capacitance (NC) FET based on a negative capacitor. For example, the first gate insulating layer 130 and the second gate insulating layer 230 include a ferroelectric material layer that has ferroelectric characteristics and a paraelectric material layer that has paraelectric characteristics.

The ferroelectric material layer has a negative capacitance, and the paraelectric material layer has a positive capacitance. For example, when two or more capacitors are connected in series, and the capacitance of each capacitor has a positive value, the total capacitance lower than the capacitance of each individual capacitor. On the other hand, when at least one of capacitances of two or more series-connected capacitors has a negative value, the total capacitance has a positive value that is greater than an absolute value of each individual capacitance.

When a ferroelectric material layer that has a negative capacitance and a paraelectric material layer that has a positive capacitance are connected in series, the total capacitance value of the series-connected ferroelectric material layer and the paraelectric material layer increases. Based on the increased total capacitance value, a transistor that has a ferroelectric material layer has a subthreshold swing (SS) that is less than 60 mV/decade at a room temperature.

The ferroelectric material layer has ferroelectric characteristics. The ferroelectric material layer includes at least one of, for example, hafnium oxide, hafnium zirconium oxide, barium strontium titanium oxide, barium titanium oxide, or lead zirconium titanium oxide. For example, the hafnium zirconium oxide is hafnium oxide doped with zirconium (Zr). For another example, the hafnium zirconium oxide may be a compound of hafnium (Hf), zirconium (Zr) and oxygen (O).

The ferroelectric material layer further includes a dopant. For example, the dopant is at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). A type of the dopant in the ferroelectric material layer varies depending on the ferroelectric material of the ferroelectric material layer.

When the ferroelectric material layer includes hafnium oxide, the dopant is at least one of gadolinium (Gd), silicon (Si), zirconium (Zr), aluminum (Al), or yttrium (Y).

When the dopant is aluminum (Al), the ferroelectric material layer includes aluminum of 3 at % to 8 at % (atomic %). For example, a ratio of the dopant is a ratio of aluminum to a sum of hafnium and aluminum.

When the dopant is silicon (Si), the ferroelectric material layer includes silicon of 2 at % to 10 at %. When the dopant is yttrium (Y), the ferroelectric material layer includes yttrium of 2 at % to 10 at %. When the dopant is gadolinium (Gd), the ferroelectric material layer includes gadolinium of 1 at % to 7 at %. When the dopant is zirconium (Zr), the ferroelectric material layer includes zirconium of 50 at % to 80 at %.

The paraelectric material layer has paraelectric characteristics. The paraelectric material layer includes at least one of, for example, silicon oxide or a metal oxide that has a high dielectric constant. The metal oxide in the paraelectric material layer includes, but is not limited to, at least one of hafnium oxide, zirconium oxide, or aluminum oxide.

The ferroelectric material layer and the paraelectric material layer may include the same material. Although the ferroelectric material layer has ferroelectric characteristics, the paraelectric material layer does not have ferroelectric characteristics. For example, when the ferroelectric material layer and the paraelectric material layer include hafnium oxide, a crystal structure of hafnium oxide in the ferroelectric material layer differs from that of hafnium oxide in the paraelectric material layer.

The ferroelectric material layer has a thickness that affects the ferroelectric characteristics. The thickness of the ferroelectric material layer is, for example, 0.5 nm to 10 nm, but is not necessarily limited thereto. Since a threshold thickness that indicates ferroelectric characteristics varies depending on each ferroelectric material, the thickness of the ferroelectric material layer varies depending on the ferroelectric material.

For example, the first gate insulating layer 130 and the second gate insulating layer 230 include one ferroelectric material layer. For another example, the first gate insulating layer 130 and the second gate insulating layer 230 include a plurality of ferroelectric material layers that are spaced apart from each other. The first gate insulating layer 130 and the second gate insulating layer 230 have a stacked layer structure in which a plurality of ferroelectric material layers and a plurality of paraelectric material layers are alternately stacked.

The first gate spacer 140 is disposed on the sidewall of the first gate electrode 120. For example, the first gate spacer 140 is disposed on the long sidewall 120LW of the first gate electrode. The first gate spacer 140 is not disposed between the first lower pattern BP1 and the first sheet pattern NS1 and between adjacent first sheet patterns NS1 in the third direction D3.

The second gate spacer 240 is disposed on a sidewall of the second gate electrode 220. The second gate spacer 240 is not disposed between the second lower pattern BP2 and the second sheet pattern NS2 and between adjacent second sheet patterns NS2 in the third direction D3.

The first gate spacer 140 and the second gate spacer 240 include at least one of, for example, silicon nitride (SIN), silicon oxynitride (SION), silicon oxide (SiO$_2$), silicon oxycarbonitride (SiOCN), silicon boron nitride (SiBN), silicon oxyboron nitride (SiOBN), silicon oxycarbide (SiOC) or their combination. Each of the first gate spacer 140 and the second gate spacer 240 is shown as a single layer, but this is for convenience of illustration and embodiments are not necessarily limited thereto.

The first gate capping pattern 145 is disposed on the first gate electrode 120. An upper surface of the first gate capping pattern 145 is an upper surface of the first gate structure GS1. The second gate capping pattern 245 is disposed on the second gate electrode 220. An upper surface of the second gate capping pattern 245 is an upper surface of the second gate structure GS2.

However, in some embodiments, the first gate capping pattern 145 is disposed between the first gate spacers 140, and the second gate capping pattern 245 is disposed between the second gate spacers 240.

The first gate capping pattern 145 and the second gate capping pattern 245 include at least one of, for example, silicon nitride (SIN), silicon oxynitride (SiON), silicon carbonitride (SiCN), silicon oxycarbonitride (SiOCN) or their combination.

The first source/drain pattern 150 is disposed on the first lower pattern BP1. The first source/drain pattern 150 is disposed on a side of the first gate electrode 120. The first source/drain pattern 150 is in contact with the first active pattern AP1. The first source/drain pattern 150 is in contact with the first sheet pattern NS1. The first source/drain pattern 150 is connected to the first sheet pattern NS1 and the first lower pattern BP1. For example, the first source/drain pattern 150 is in contact with the first inner gate structure INT_GS1.

The second source/drain pattern 250 is disposed on the second lower pattern BP2. The second source/drain pattern 250 is disposed on a side of the second gate electrode 220. The second source/drain pattern 250 is in contact with the second active pattern AP2. The second source/drain pattern 250 is in contact with the second sheet pattern NS2. The second source/drain pattern 250 is connected to the second sheet pattern NS2 and the second lower pattern BP2. For example, the second source/drain pattern 250 is in contact with the second inner gate structure INT_GS2.

The third source/drain pattern 350 is disposed on the third lower pattern BP3. The third source/drain pattern 350 is disposed on the side of the first gate electrode 120. The fourth source/drain pattern 450 is disposed on the fourth lower pattern BP4. The fourth source/drain pattern 450 is disposed on the side of the second gate electrode 220. In addition, the third source/drain pattern 350 is in contact with the third sheet pattern NS3. The fourth source/drain pattern 450 is in contact with the fourth sheet pattern.

Figure 2:
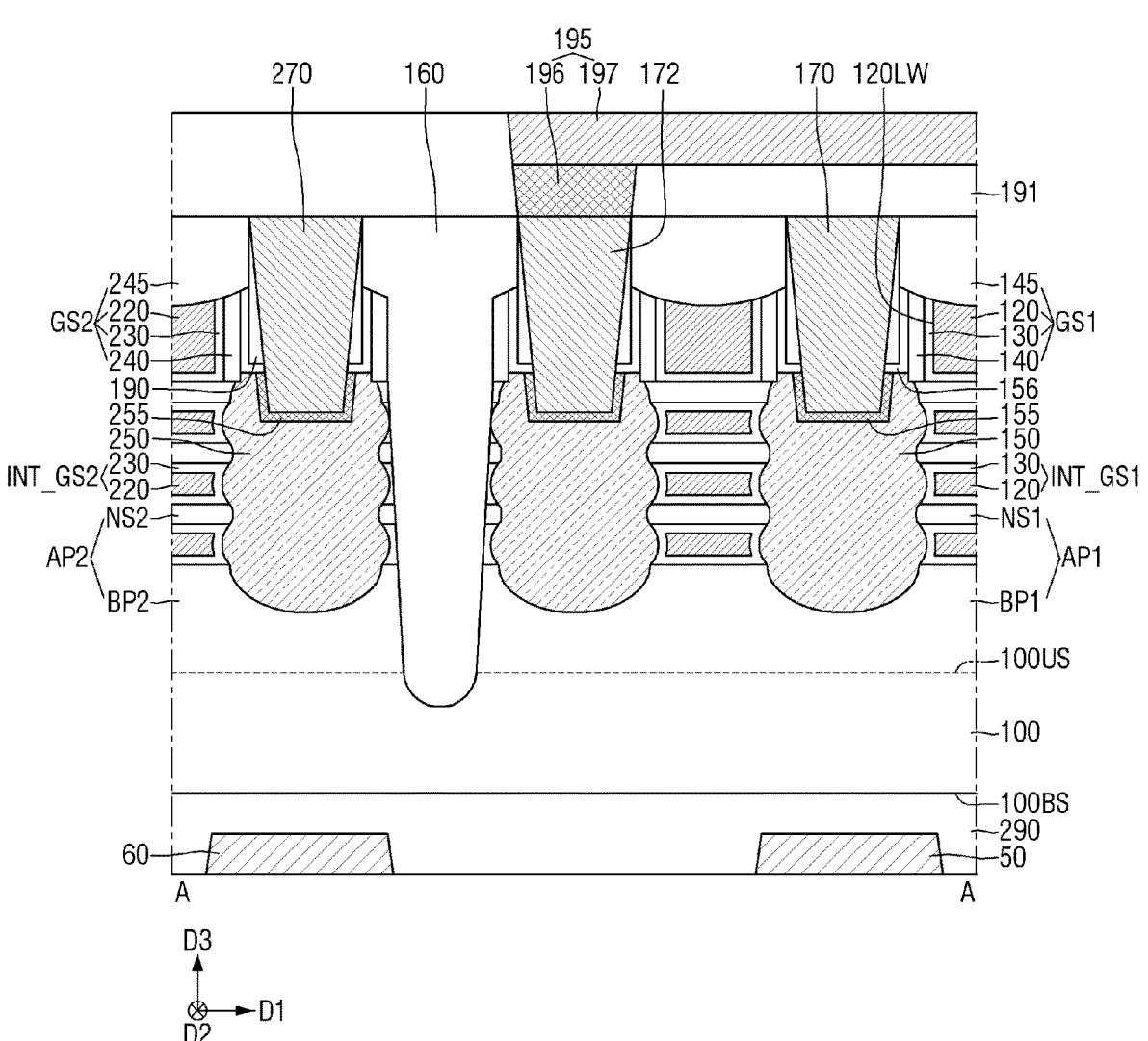
FIGS. 2 to 7 are cross-sectional views taken along lines A-A, B-B, C-C, D-D, E-E and F-F of FIG. 1.

For example, a cross-sectional view taken along the first direction D1 of the third active pattern AP3 and the fourth active pattern AP4 is similar to that of FIG. 2. The third source/drain pattern 350 is in contact with the first gate insulating layer 130 in the first inner gate structure INT_GS1. The fourth source/drain pattern 450 is in contact with the second gate insulating layer 230 in the second inner gate structure INT_GS2.

In addition, for another example, an inner spacer is further disposed between the first inner gate structure INT_GS1 and the third source/drain pattern 350 and between the second inner gate structure INT_GS2 and the fourth source/drain pattern 450. For example, the third source/drain pattern 350 is not in contact with the first gate insulating layer 130 in the first inner gate structure INT_GS1, and the fourth source/ drain pattern 450 is not in contact with the second gate insulating layer 230 included in the second inner gate structure INT_GS2.

The source/drain patterns 150, 250, 350 and 450 are disposed on the first surface 100US of the substrate. Since the first lower pattern BP1 is spaced apart from the second lower pattern BP2 in the first direction D1, the first source/drain pattern 150 is spaced apart from the second source/drain pattern 250 in the first direction D1. The third source/drain pattern 350 is spaced apart from the fourth source/drain pattern 450 in the first direction D1. The first source/drain pattern 150 is spaced apart from the third source/drain pattern 350 in the second direction D2. The second source/drain pattern 250 is spaced apart from the fourth source/drain pattern 450 in the second direction D2.

The first source/drain pattern 150 is included in a source/drain of a transistor that uses the first sheet pattern NS1 as a channel area. The second source/drain pattern 250 is included in a source/drain of a transistor that uses the second sheet pattern NS2 as a channel area. The third source/drain pattern 350 is included in a source/drain of a transistor that uses the third sheet pattern NS3 as a channel area. The fourth source/drain pattern 450 is included in a source/drain of a transistor that uses a fourth sheet pattern as a channel area.

Each of the source/drain patterns 150, 250, 350 and 450 includes an epitaxial pattern. Each of the source/drain patterns 150, 250, 350 and 450 includes a semiconductor material.

The first source/drain pattern 150 and the second source/drain pattern 250 include a p-type dopant. The p-type dopant includes, but is not necessarily limited to, at least one of boron (B) or gallium (Ga). The third source/drain pattern 350 and the fourth source/drain pattern 450 include an n-type dopant. The n-type dopant includes at least one of phosphorus (P), arsenic (As), antimony (Sb) or bismuth (Bi), but is not necessarily limited thereto.

A source/drain etching stop layer 156 extends along outer sidewalls of the gate spacer 140 and sidewalls of the source/drain patterns 150, 250, 350 and 450. The source/drain etching stop layer 156 extends along the upper surface of the field insulating layer 105.

The source/drain etching stop layer 156 does not extend along sidewalls of the first gate capping pattern 145 and sidewalls of the second gate capping pattern 245. However, in some embodiments, the source/drain etching stop layer 156 extends along the sidewalls of the first gate capping pattern 145 and the sidewalls of the second gate capping pattern 245.

The source/drain etching stop layer 156 includes at least one of, for example, silicon nitride (SIN), silicon oxynitride (SION), silicon oxycarbonitride (SIOCN), silicon boron nitride (SiBN), silicon oxyboron nitride (SiOBN), silicon oxycarbide (SiOC) or their combination.

The first element isolation structure 160 is disposed the substrate 100. The first element isolation structure 160 is disposed on the first surface 100US of the substrate. The first element isolation structure 160 extends in the second direction D2.

The first element isolation structure 160 is disposed between the first active pattern AP1 and the second active pattern AP2. The first element isolation structure 160 is disposed between the third active pattern AP3 and the fourth active pattern AP4. The first element isolation structure 160 is disposed between the first source/drain pattern 150 and the second source/drain pattern 250. In addition, the first element isolation structure 160 is disposed between the third source/drain pattern 350 and the fourth source/drain pattern 450.

The first element isolation structure 160 separates the first lower pattern BP1 from the second lower pattern BP2. The first element isolation structure 160 separates the third lower pattern BP3 from the fourth lower pattern BP4. Each of the first lower pattern BP1 and the second lower pattern BP2 extends from the first element isolation structure 160 in the first direction D1. In addition, each of the third lower pattern BP3 and the fourth lower pattern BP4 extends from the first element isolation structure 160 in the first direction D1.

A height of an upper surface of the first element isolation structure 160 is the same as that of the upper surface of the first gate capping pattern 145 based on the second surface 100BS of the substrate. However, in some embodiments, the upper surface of the first element isolation structure 160 is higher than the upper surface of the first gate capping pattern 145 based on the second surface 100BS of the substrate.

The first element isolation structure 160 includes an insulating material. The first element isolation structure 160 includes at least one of, for example, silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC) or their combination. The first element isolation structure 160 is shown as a single layer, but embodiments are not necessarily limited thereto.

An residual insulating pattern may be disposed between the first element isolation structure 160 and the first source/drain pattern 150. The residual insulating pattern may be disposed between the first element isolation structure 160 and the second source/drain pattern 250. The residual insulating pattern includes the same material as that of the gate insulating layers 130 and 230.

The first source/drain pattern 150 and the third source/drain pattern 350 are disposed between adjacent first gate electrodes 120 in the first direction D1. The first source/drain pattern 150 and the third source/drain pattern 350 are disposed between the first gate electrode 120 and the first element isolation structure 160.

The second source/drain pattern 250 and the fourth source/drain pattern 450 are disposed between adjacent second gate electrodes 220 in the first direction D1. The second source/drain pattern 250 and the fourth source/drain pattern 450 are disposed between the second gate electrode 220 and the first element isolation structure 160.

A first upper interlayer insulating layer 190 is disposed on the first surface 100US of the substrate. The first upper interlayer insulating layer 190 is disposed on the source/drain patterns 150, 250, 350 and 450. The first upper interlayer insulating layer 190 may be disposed on the first element isolation structure 160.

The first upper interlayer insulating layer 190 does not cover the upper surface of the first gate capping pattern 145 and the upper surface of the second gate capping pattern 245. The first upper interlayer insulating layer 190 includes at least one of, for example, silicon oxide, silicon nitride, silicon oxynitride or a low dielectric constant material. A dielectric constant of the low dielectric constant material has a value less than 3.9, which is the dielectric constant of the silicon oxide.

The first source/drain contact 170 is disposed on the first surface 100US of the substrate. The first source/drain contact 170 is disposed on the first source/drain pattern 150. The first source/drain contact 170 is electrically connected to the first source/drain pattern 150.

The first source/drain contact 170 is connected to the first rear wiring line 50 through the first contact connection via 180. In addition, a portion of the first source/drain contact 170 is not connected to the first contact connection via 180.

The second source/drain contact 270 is disposed on the first surface 100US of the substrate. The second source/drain contact 270 is disposed on the second source/drain pattern 250. The second source/drain contact 270 is electrically connected to the second source/drain pattern 250.

The second source/drain contact 270 is connected to the first rear wiring line 50 through the second contact connection via 280. In addition, a portion of the second source/drain contact 270 is not connected to the second contact connection via 280.

The third source/drain contact 370 is disposed on the first surface 100US of the substrate. The third source/drain contact 370 is disposed on the third source/drain pattern 350. The third source/drain contact 370 is electrically connected to the third source/drain pattern 350.

The third source/drain contact 370 is connected to the second rear wiring line 60 through the third contact connection via 380. In addition, a portion of the third source/drain contact 370 is not connected to the third contact connection via 380.

The fourth source/drain contact 470 is disposed on the first surface 100US of the substrate. The fourth source/drain contact 470 is disposed on the fourth source/drain pattern 450. The fourth source/drain contact 470 is electrically connected to the fourth source/drain pattern 450.

The fourth source/drain contact 470 is connected to the second rear wiring line 60 through the fourth contact connection via 480. In addition, a portion of the fourth source/drain contact 470 is not connected to the fourth contact connection via 480.

A first connection source/drain contact 172 is disposed on the first source/drain pattern 150 and the third source/drain pattern 350. The first connection source/drain contact 172 is electrically connected to the first source/drain pattern 150 and the third source/drain pattern 350.

A second connection source/drain contact 272 is disposed on the second source/drain pattern 250 and the fourth source/drain pattern 450. The second connection source/drain contact 272 is electrically connected to the second source/drain pattern 250 and the fourth source/drain pattern 450. The first connection source/drain contact 172 and the second connection source/drain contact 272 are not electrically connected to the first rear wiring line 50 and the second rear wiring line 60.

A height of an upper surface of the first source/drain contact 170 is the same as that of an upper surface of the second source/drain contact 270 based on the upper surface of the field insulating layer 105. The height of the upper surface of the first source/drain contact 170 is the same as that of an upper surface of the third source/drain contact 370 and that of an upper surface of the fourth source/drain contact 470 based on the upper surface of the field insulating layer 105.

A first contact silicide layer 155 is disposed between the first source/drain contact 170 and the first source/drain pattern 150 and between the first connection source/drain contact 172 and the first source/drain pattern 150. A second contact silicide layer 255 is disposed between the second source/drain contact 270 and the second source/drain pattern 250 and between the second connection source/drain contact 272 and the second source/drain pattern 250. A third contact silicide layer 355 is disposed between the third source/drain contact 370 and the third source/drain pattern 350 and between the first connection source/drain contact 172 and the third source/drain pattern 350. A fourth contact silicide layer 455 is disposed between the fourth source/drain contact 470 and the fourth source/drain pattern 450 and between the second connection source/drain contact 272 and the fourth source/drain pattern 450.

A gate contact 175 is disposed on the first gate electrode 120. The gate contact 175 passes through the first gate capping pattern 145. The gate contact 175 is connected to the first gate electrode 120. The gate contact 175 connects the front wiring line 197 with the first gate electrode 120. In addition, another gate contact is disposed between the front wiring line 197 and the second gate electrode 220.

The source/drain contacts 170, 270, 370 and 470 and the connection source/drain contacts 172 and 272 are shown as having a single conductive layer structure, but embodiments are not necessarily limited thereto. For example, in some embodiments, the source/drain contacts 170, 270, 370 and 470 and the connection source/drain contacts 172 and 272 have a multi-conductive layer structure that includes a contact barrier layer and a contact plug layer.

The gate contact 175 is shown as having a single conductive layer structure, but embodiments are not necessarily limited thereto. For example, in some embodiments, the gate contact 175 has a multi-conductive layer structure that includes a contact barrier layer and a contact plug layer.

The source/drain contacts 170, 270, 370 and 470, the connection source/drain contacts 172 and 272 and the gate contact 175 include at least one of, for example, a metal, a conductive metal nitride, a conductive metal carbide, a conductive metal oxide, a conductive metal carbonitride or a two-dimensional (2D) material. The contact silicide layers 155, 255, 355 and 455 include a metal silicide material.

The two-dimensional (2D) material includes one of a two-dimensional allotrope or a two-dimensional compound, and may include at least one of, for example, graphene, boron nitride (BN), molybdenum sulfide, molybdenum selenide, tungsten sulfide, tungsten selenide or tantalum sulfide, but is not necessarily limited thereto. For example, since the two-dimensional materials described above are illustrative, the two-dimensional material that may be included in a semiconductor device of the present disclosure is not necessarily limited by the above-described materials.

The first buried conductive pattern 70 and the second buried conductive pattern 80 are disposed in the substrate 100. In a plan view, the active patterns AP1, AP2, AP3 and AP4 are disposed between the first buried conductive pattern 70 and the second buried conductive pattern 80. However, in some embodiments, the first buried conductive pattern 70 and the second buried conductive pattern 80 pass through the substrate 100. For example, the first buried conductive pattern 70 and the second buried conductive pattern 80 extend from the second surface 100BS of the substrate to the first surface 100US of the substrate.

The first buried conductive pattern 70 extends in the first direction D1 along the first active pattern AP1 and the second active pattern AP2. The first buried conductive pattern 70 is connected to the first rear wiring line 50.

The first buried conductive pattern 70 is connected to the first source/drain contact 170 through the first contact connection via 180. The first buried conductive pattern 70 is connected to the second source/drain contact 270 through the second contact connection via 280.

The second buried conductive pattern 80 extends in the first direction D1 along the third active pattern AP3 and the fourth active pattern AP4. The second buried conductive pattern 80 is connected to the second rear wiring line 60.

The second buried conductive pattern 80 is connected to the third source/drain contact 370 through the third contact connection via 380. The second buried conductive pattern 80 is connected to the fourth source/drain contact 470 through the fourth contact connection via 480.

A first buried insulating liner 71 extends along sidewalls of the first buried conductive pattern 70. The first buried insulating liner 71 is disposed between the first buried conductive pattern 70 and the substrate 100. A second buried insulating liner 81 extends along sidewalls of the second buried conductive pattern 80. The second buried insulating liner 81 is disposed between the second buried conductive pattern 80 and the substrate 100. However, in some embodiments, the buried insulating liners 71 and 81 are not formed between the buried conductive patterns 70 and 80 and the substrate 100.

The first buried conductive pattern 70 and the second buried conductive pattern 80 are shown as having a single conductive layer structure, but are not necessarily limited thereto. For example, in some embodiments, the first buried conductive pattern 70 and the second buried conductive pattern 80 have a multi-conductive layer structure that includes a buried conductive barrier layer and a buried conductive plug layer.

The first buried conductive pattern 70 and the second buried conductive pattern 80 include at least one of, for example, a metal, a conductive metal nitride, a conductive metal carbide, a conductive metal oxide, a conductive metal carbonitride or a two-dimensional (2D) material.

The first rear wiring line 50 and the second rear wiring line 60 are disposed on the second surface 100BS of the substrate. For example, each of the first rear wiring line 50 and the second rear wiring line 60 extends in the second direction D2, but is not necessarily limited thereto.

The first rear wiring line 50 is connected to the first buried conductive pattern 70. The first rear wiring line 50 is connected to the first source/drain contact 170 and the second source/drain contact 270 through the first buried conductive pattern 70.

The second rear wiring line 60 is connected to the second buried conductive pattern 80. The second rear wiring line 60 is connected to the third source/drain contact 370 and the fourth source/drain contact 470 through the second buried conductive pattern 80.

For example, the first rear wiring line 50 and the second rear wiring line 60 are power lines that supply power to the semiconductor device. For another example, the first rear wiring line 50 and the second rear wiring line 60 are signal lines that supply an operation signal to the semiconductor device. For another example, one of the first rear wiring line 50 and the second rear wiring line 60 is a power line, and the other thereof is a signal line.

A first rear wiring via 55 is disposed between the first rear wiring line 50 and the first buried conductive pattern 70. The first rear wiring via 55 connects the first rear wiring line 50 with the first buried conductive pattern 70. A second rear wiring via 65 is disposed between the second rear wiring line 60 and the second buried conductive pattern 80. The second rear wiring via 65 connects the second rear wiring line 60 with the second buried conductive pattern 80.

The first rear wiring line 50 and the second rear wiring line 60 are shown as having a single conductive layer structure, but embodiments are not necessarily limited thereto. For example, in some embodiments, the first rear wiring line 50 and the second rear wiring line 60 have a multi-conductive layer structure. The first rear wiring via 55 and the second rear wiring via 65 are shown as having a single conductive layer structure, but are not necessarily limited thereto.

The first rear wiring line 50 and the second rear wiring line 60 include at least one of, for example, a metal, a conductive metal nitride, a conductive metal carbide, a conductive metal oxide, a conductive metal carbonitride or a two-dimensional (2D) material. The first rear wiring via 55 and the second rear wiring via 65 include at least one of, for example, a metal, a conductive metal nitride, a conductive metal carbide, a conductive metal oxide, a conductive metal carbonitride or a two-dimensional (2D) material.

The first rear wiring line 50 and the first rear wiring via 55 will be described by way of example. The first rear wiring line 50 and the first rear wiring via 55 is shown as having a well defined boundary, but is not necessarily limited thereto. In some embodiments, the first rear wiring line 50 and the first rear wiring via 55 have an integral structure without a well defined boundary surface.

A lower interlayer insulating layer 290 is disposed on the second surface 100BS of the substrate. The first rear wiring line 50, the first rear wiring via 55, the second rear wiring line 60 and the second rear wiring via 65 are disposed in the lower interlayer insulating layer 290. The lower interlayer insulating layer 290 includes at least one of, for example, silicon oxide, silicon nitride, silicon carbonitride, silicon oxynitride or a low dielectric constant material.

The first contact connection via 180 is disposed between the first source/drain contact 170 and the first buried conductive pattern 70. The first contact connection via 180 connects the first source/drain contact 170 with the first buried conductive pattern 70. The first contact connection via 180 connects the first source/drain contact 170 with the first rear wiring line 50. The first contact connection via 180 overlaps the first source/drain contact 170 in the second direction D2.

The second contact connection via 280 is disposed between the second source/drain contact 270 and the first buried conductive pattern 70. The second contact connection via 280 connects the second source/drain contact 270 with the first buried conductive pattern 70. The second contact connection via 280 connects the second source/drain contact 270 with the first rear wiring line 50. The second contact connection via 280 overlaps the second source/drain contact 270 in the second direction D2.

The first contact connection via 180 and the second contact connection via 280 are connected to the first buried conductive pattern 70 by passing through the source/drain etching stop layer 156 and the field insulating layer 105. The first contact connection via 180 is spaced apart from the second contact connection via 280 in the first direction D1. The first contact connection via 180 and the second contact connection via 280 are arranged in the first direction D1.

The third contact connection via 380 is disposed between the third source/drain contact 370 and the second buried conductive pattern 80. The third contact connection via 380 connects the third source/drain contact 370 with the second buried conductive pattern 80. The third contact connection via 380 connects the third source/drain contact 370 with the second rear wiring line 60. The third contact connection via 380 overlaps the third source/drain contact 370 in the second direction D2.

The fourth contact connection via 480 is disposed between the fourth source/drain contact 470 and the second buried conductive pattern 80. The fourth contact connection via 480 connects the fourth source/drain contact 470 with the second buried conductive pattern 80. The fourth contact connection via 480 connects the fourth source/drain contact 470 with the second rear wiring line 60. The fourth contact connection via 480 overlaps the fourth source/drain contact 470 in the second direction D2.

The third contact connection via 380 and the fourth contact connection via 480 are connected to the second buried conductive pattern 80 by passing through the source/drain etching stop layer 156 and the field insulating layer 105. The third contact connection via 380 is spaced apart from the fourth contact connection via 480 in the first direction D1. The third contact connection via 380 and the fourth contact connection via 480 are arranged in the first direction D1.

The first source/drain contact 170 connected to the first contact connection via 180 is shown as being aligned in the second direction D2 with the third source/drain contact 370 connected to the third contact connection via 380, but this is for convenience of illustration and is not necessarily limited thereto.

The first gate electrode 120 is disposed between the first source/drain pattern 150 connected to the first contact connection via 180 and the second source/drain pattern 250 connected to the second contact connection via 280.

However, in some embodiments, the second gate electrode 220 is disposed between the first source/drain pattern 150 connected to the first contact connection via 180 and the second source/drain pattern 250 connected to the second contact connection via 280. For another example, the first gate electrode 120 and the second gate electrode 220 are disposed between the first source/drain pattern 150 connected to the first contact connection via 180 and the second source/drain pattern 250 connected to the second contact connection via 280. For another example, the first gate electrode 120 and the second gate electrode 220 are not disposed between the first source/drain pattern 150 connected to the first contact connection via 180 and the second source/drain pattern 250 connected to the second contact connection via 280.

The first contact connection via 180 will be described by way of example. In the cross-sectional view shown in FIG. 4, a portion of the first contact connection via 180 overlaps the first source/drain contact 170 in the third direction D3, and the other portion of the first contact connection via 180 does not overlap the first source/drain contact 170 in the third direction D3.

However, in some embodiments, the first source/drain contact 170 fully covers the first contact connection via 180. For example, the first contact connection via 180 fully overlaps the first source/drain contact 170 in the third direction D3. For another example, the entire first contact connection via 180 does not overlap the first source/drain contact 170 in the third direction D3. The first contact connection via 180 and the first source/drain contact 170 are electrically connected to each other by a connection conductive pattern on the first upper interlayer insulating layer 190.

The first contact connection via 180 includes first sidewalls 180SW1 opposite to each other in the second direction D2, and second sidewalls 180SW21 and 180SW22 opposite to each other in the first direction D1. The second sidewalls 180SW21 and 180SW22 of the first contact connection via include a first sub-sidewall 180SW21 and a second sub-sidewall 180SW22. The first sub-sidewall 180SW21 is opposite to the second sub-sidewall 180SW22 in the first direction D1.

The second contact connection via 280 includes first sidewalls 280SW1 opposite to each other in the second direction D2, and second sidewalls 280SW21 and 280SW22 opposite to each other in the first direction D1. The second sidewalls 280SW21 and 280SW22 of the second contact connection via include a first sub-sidewall 280SW21 and a second sub-sidewall 280SW22. The first sub-sidewall 280SW21 is opposite to the second sub-sidewall 280SW22 in the first direction D1. The first sub-sidewall 280SW21 of the second contact connection via faces the first sub-sidewall 180SW21 of the first contact connection via.

The first contact connection via 180 includes a first point P1 and a second point P2. The first point P1 and the second point P2 are positioned below the first source/drain contact 170 and above the first rear wiring line 50. A first height H1 from the first rear wiring line 50 to the first point P1 is lower than a second height H2 from the first rear wiring line 50 to the second point P2.

Figure 4:
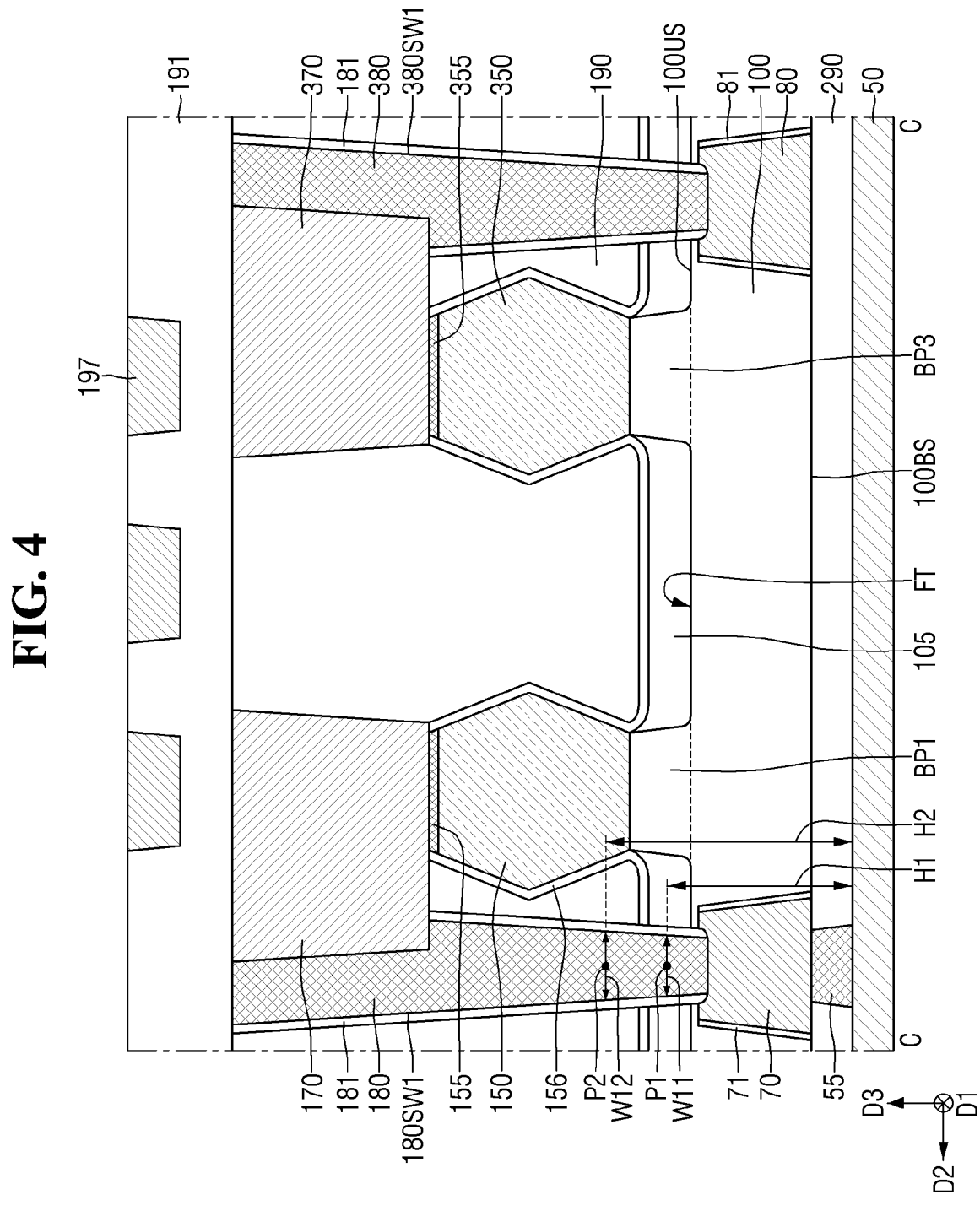
Figure 5:
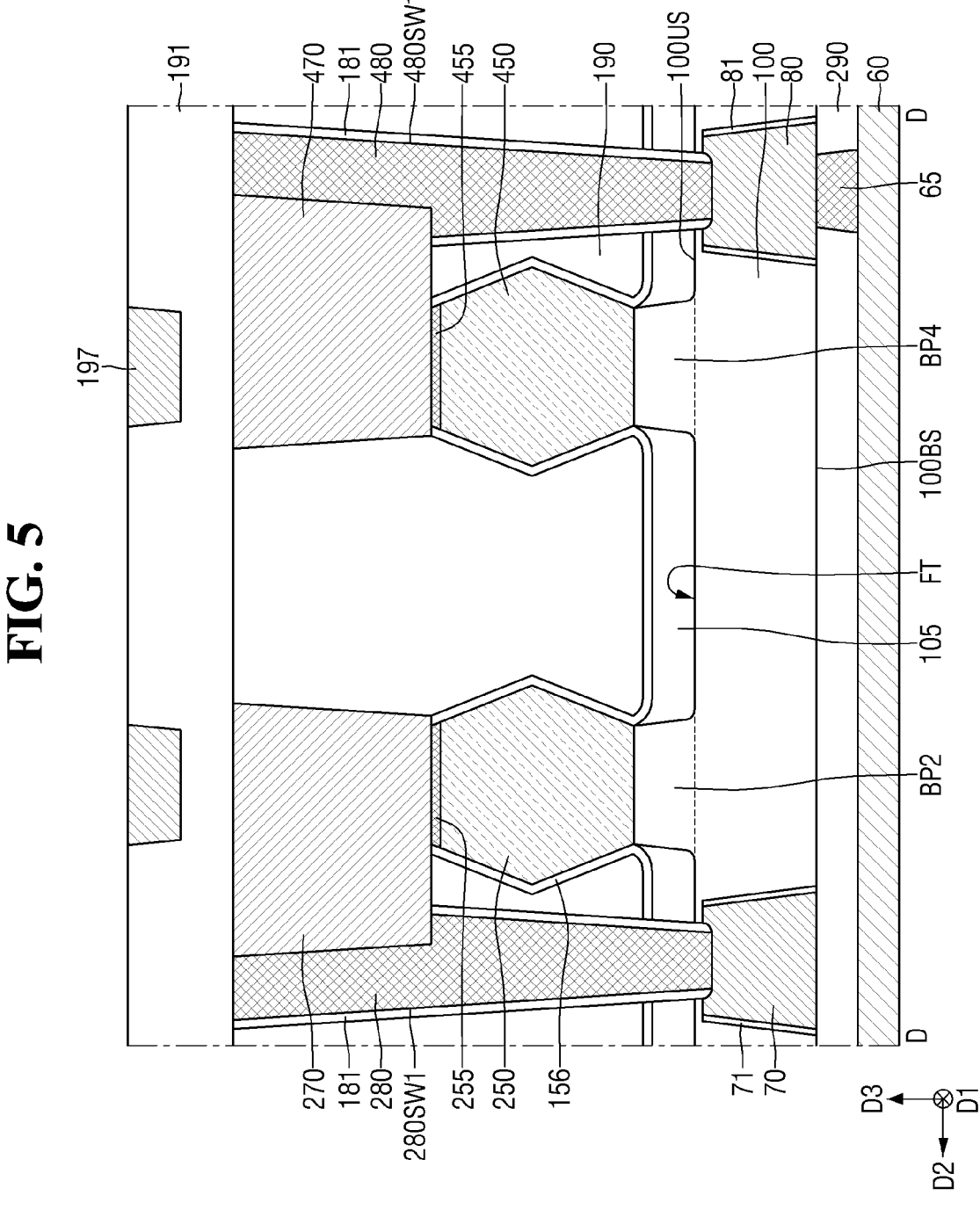
Figure 6:
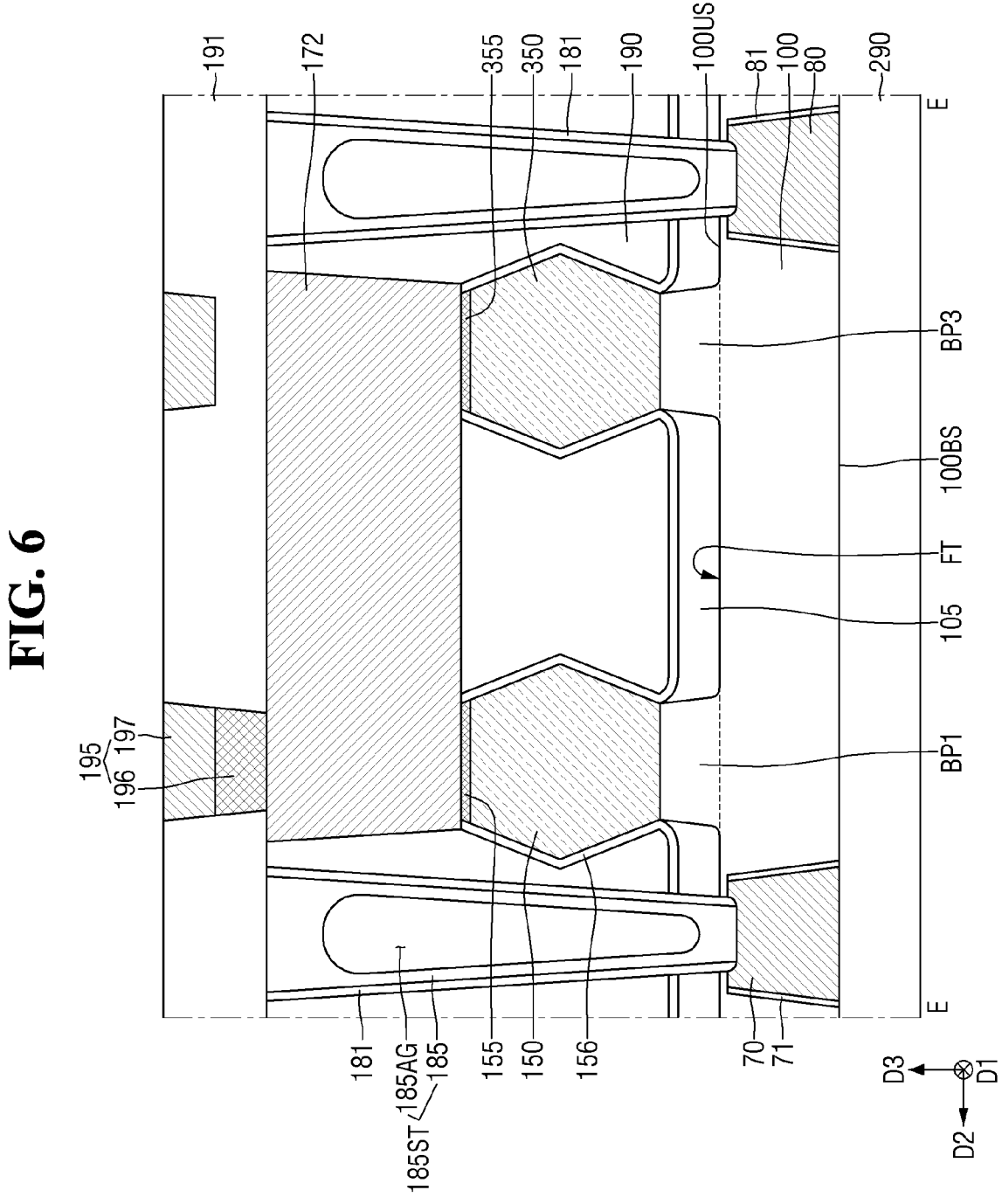

In FIG. 4, at the first height H1 from the first rear wiring line 50, the first contact connection via 180 has a first width W11 in the second direction D2. At the second height H2 from the first rear wiring line 50, the first contact connection via 180 has a second width W12 in the second direction D2. The first width W11 of the first contact connection via 180 is less than the second width W12 of the first contact connection via 180.

Figure 7:
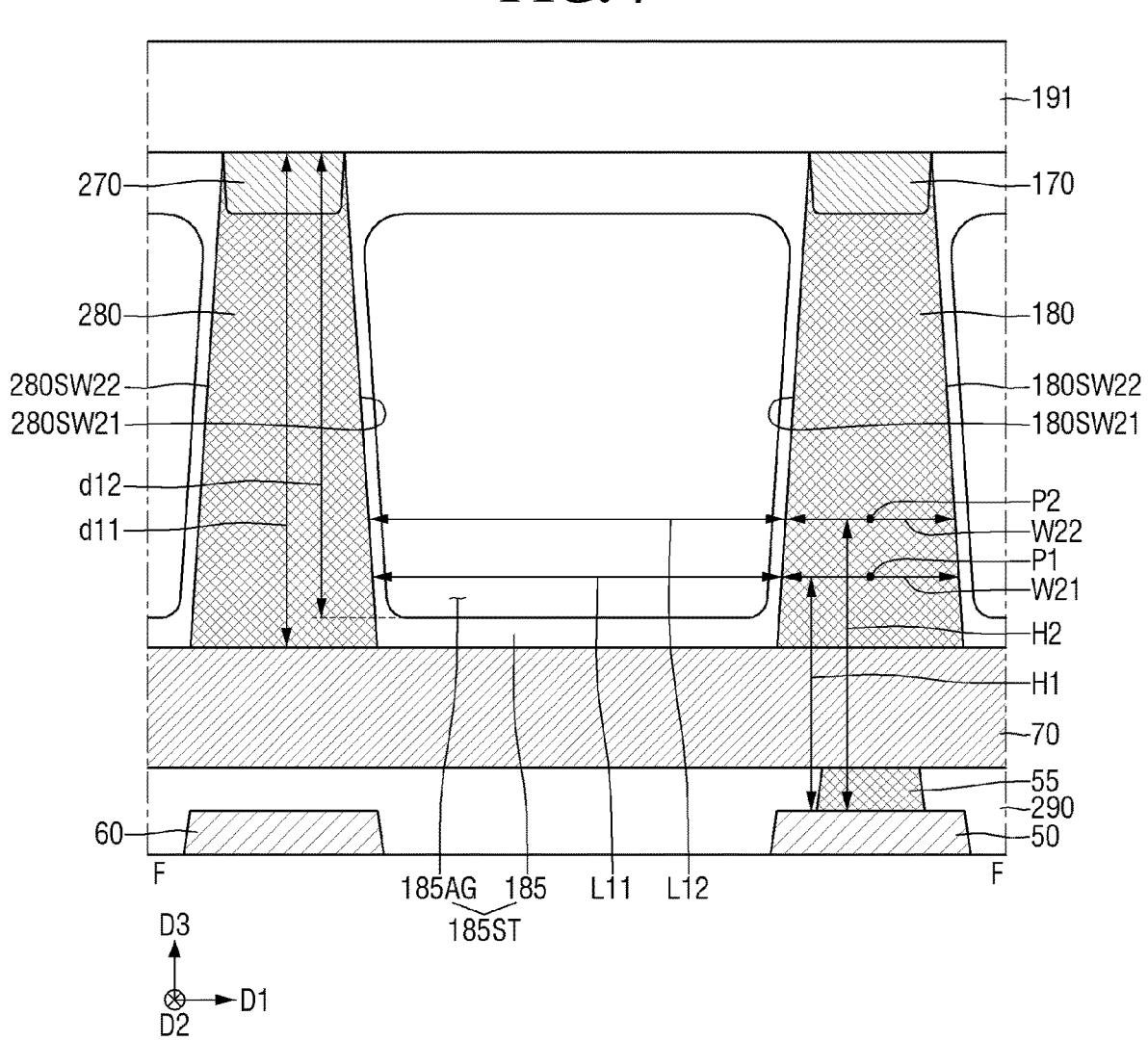

In FIG. 7, a width of the first contact connection via 180 in the first direction D1 decreases with increasing distance from the first rear wiring line 50. At the first height H1 from the first rear wiring line 50, the first contact connection via 180 has a third width W21 in the first direction D1. At the second height H2 from the first rear wiring line 50, the first contact connection via 180 has a fourth width W22 in the first direction D1. The third width W21 of the first contact connection via 180 is greater than the fourth width W22 of the first contact connection via 180.

The description of the width of the first contact connection via 180 is substantially the same as that of widths of the second to fourth contact connection vias 280, 380 and 480.

In FIG. 7, a distance between the first sub-sidewall 180SW21 of the first contact connection via and the first sub-sidewall 280SW21 of the second contact connection via increases with increasing distance from the first rear wiring line 50 and the second rear wiring line 60. At the first height H1 from the first rear wiring line 50, the first sub-sidewall 180SW21 of the first contact connection via may be spaced apart from the first sub-sidewall 280SW21 of the second contact connection via by a first spaced distance L11. At the second height H2 from the first rear wiring line 50, the first sub-sidewall 180SW21 of the first contact connection via may be spaced apart from the first sub-sidewall 280SW21 of the second contact connection via by a second spaced distance L12. The first spaced distance L11 is less than the second spaced distance L12.

The description of the spaced distance between the first contact connection via 180 and the second contact connection via 280 is substantially the same as that of a spaced distance between the third contact connection via 380 and the fourth contact connection via 480.

The third contact connection via 380 includes sidewalls 380SW1 opposite to each other in the second direction D2. The fourth contact connection via 480 includes sidewalls 480SW1 opposite to each other in the second direction D2.

A connection via liner 181 is disposed on the first sidewalls 180SW1 of the first contact connection via and the first sidewalls 280SW1 of the second contact connection via. The connection via liner 181 is disposed on the sidewalls 380SW1 of the third contact connection via and the sidewalls 480SW1 of the fourth contact connection via.

The contact connection vias 180, 280, 380 and 480 are shown as having a single conductive layer structure, but are not necessarily limited thereto. The contact connection vias 180, 280, 380 and 480 include at least one of, for example, a metal, a conductive metal nitride, a conductive metal carbide, a conductive metal oxide, a conductive metal carbonitride or a two-dimensional material.

The connection via liner 181 includes at least one of, for example, silicon nitride (SiN), silicon oxynitride (SION), silicon oxide ($SiO_2$), silicon oxycarbonitride (SIOCN), silicon boron nitride (SIBN), silicon oxyboron nitride (SiOBN), silicon oxycarbide (SIOC) or their combination.

The first air gap structure 185ST is disposed between the first contact connection via 180 and the second contact connection via 280. The first air gap structure 185ST is disposed between the third contact connection via 380 and the fourth contact connection via 480.

The first air gap structure 185ST extends in the first direction D1. For example, the first connection source/drain contact 172 is disposed between adjacent first air gap structures 185ST in the second direction D2. The first gate electrode 120 and the second gate electrode 220 are disposed between adjacent first air gap structures 185ST in the second direction D2. The short sidewall 120SW of the first gate electrode faces the first air gap structure 185ST.

Figure 3:
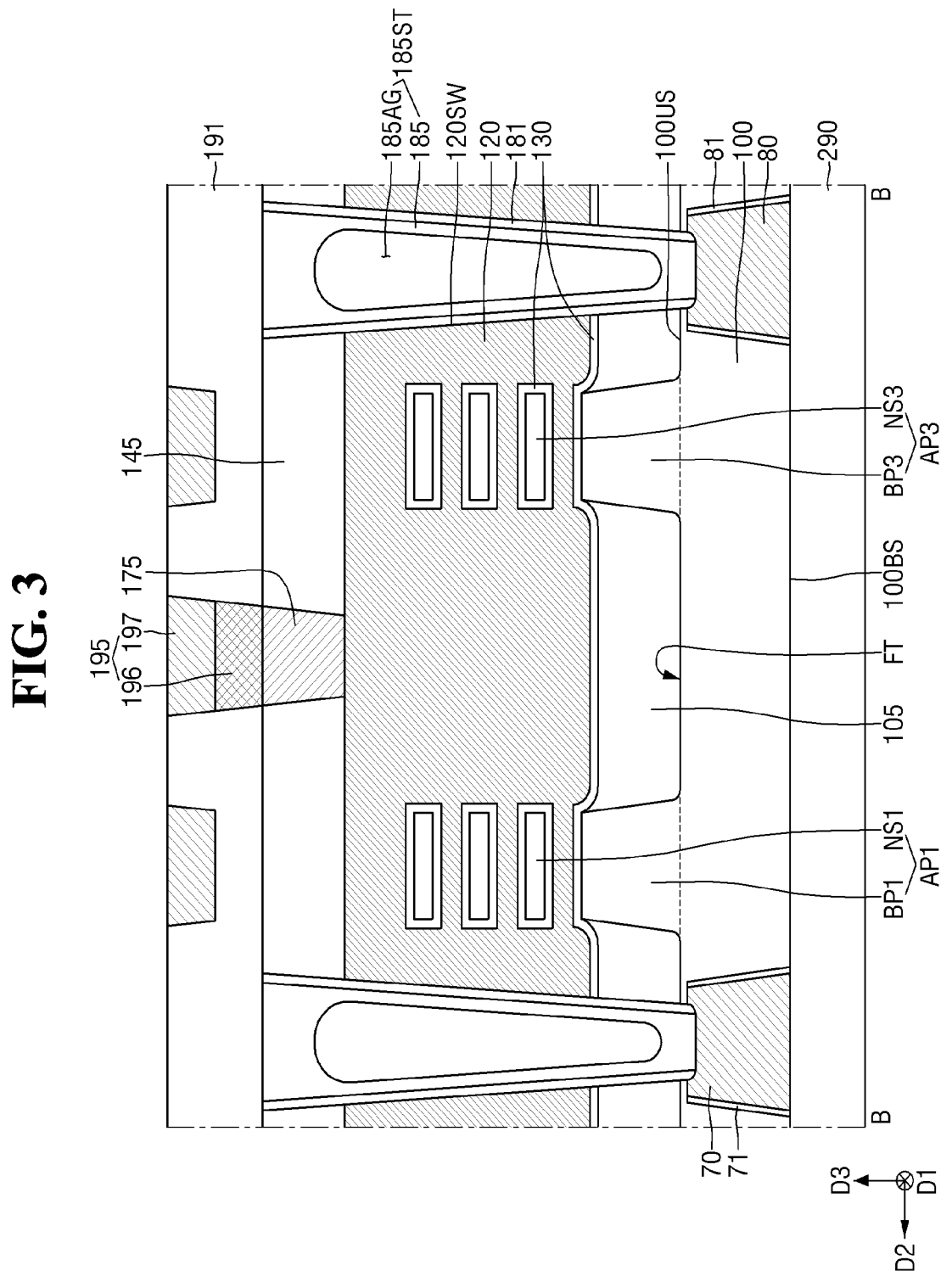

The first air gap structure 185ST is in contact with the second sidewalls 180SW21 and 180SW22 of the first contact connection via 180 and the second sidewalls 280SW21 and 280SW22 of the second contact connection via 280. In FIG. 3, the connection via liner 181 is disposed between the first air gap structure 185ST and the first gate electrode 120.

However, in some embodiments, the connection via liner 181 is not disposed between the first air gap structure 185ST and the first gate electrode 120.

The first air gap structure 185ST includes a first air gap liner 185 and a first air gap 185AG. The first air gap 185AG is disposed in the first air gap liner 185. The first air gap liner 185 surrounds the first air gap 185AG. The first air gap liner 185 includes at least one of, for example, silicon nitride (SIN), silicon oxynitride (SION), silicon oxide ($SiO_2$), silicon oxycarbonitride (SiOCN), silicon boron nitride (SiBN), silicon oxyboron nitride (SIOBN), silicon oxycarbide (SiOC) or their combination.

The first air gap 185AG is disposed on the lower interlayer insulating layer 290. The first air gap 185AG is not disposed in the lower interlayer insulating layer 290. In FIG. 7, a depth d12 from an upper surface of the second contact connection via 280 to a lowermost portion of the first air gap 185AG is less than a height d11 of the second contact connection via 280. The height d11 of the second contact connection via 280 is a depth from the upper surface of the second contact connection via 280 to a bottom surface of the second contact connection via 280.

In FIG. 3, the first gate insulating layer 130 is not disposed between the first gate electrode 120 and the first air gap structure 185ST. The first gate insulating layer 130 does not extend in the third direction D3 along the short sidewall 120 of the first gate electrode.

The first air gap structure 185ST lowers capacitance between the first contact connection via 180 and the second contact connection via 280 that are adjacent to each other in the first direction D1. In addition, the first air gap structure 185ST is disposed between the second contact connection via 280 and the second gate electrode 220. The first air gap structure 185ST lowers capacitance between the second contact connection via 280 and the second gate electrode

220. Since the capacitance between the conductive patterns is lowered, performance and reliability of the semiconductor device are increased.

A second upper interlayer insulating layer 191 is disposed on the first upper interlayer insulating layer 190, the first gate structure GS1, the second gate structure GS2, the source/drain contacts 170, 270, 370 and 470, the contact connection vias 180, 280, 380 and 480 and the first air gap structure 185ST. The second upper interlayer insulating layer 191 includes at least one of, for example, silicon oxide, silicon nitride, silicon oxynitride or a low dielectric constant material.

The front wiring structure 195 is disposed in the second interlayer insulating layer 191. The front wiring structure 195 is disposed on the first surface 100US of the substrate. The front wiring structure 195 includes a front wiring via 196 and a front wiring line 197.

The front wiring structure 195 is connected to the source/drain contacts 170, 270, 370 and 470, the connection source/drain contacts 172 and 272 and the gate contact 175.

Each of the front wiring via 196 and the front wiring line 197 includes at least one of, for example, a metal, a conductive metal nitride, a conductive metal carbide, a conductive metal oxide, a conductive metal carbonitride or a two-dimensional material.

Each of the front wiring via 196 and the front wiring line 197 is shown as a single conductive layer structure, but is not necessarily limited thereto. For example, in some embodiments, at least one of the front wiring via 196 or the front wiring line 197 has a multi-conductive layer structure. For another example, the front wiring structure 195 has an integral structure without a well-defined boundary surface between the front wiring via 196 and the front wiring line 197.

Figure 8:
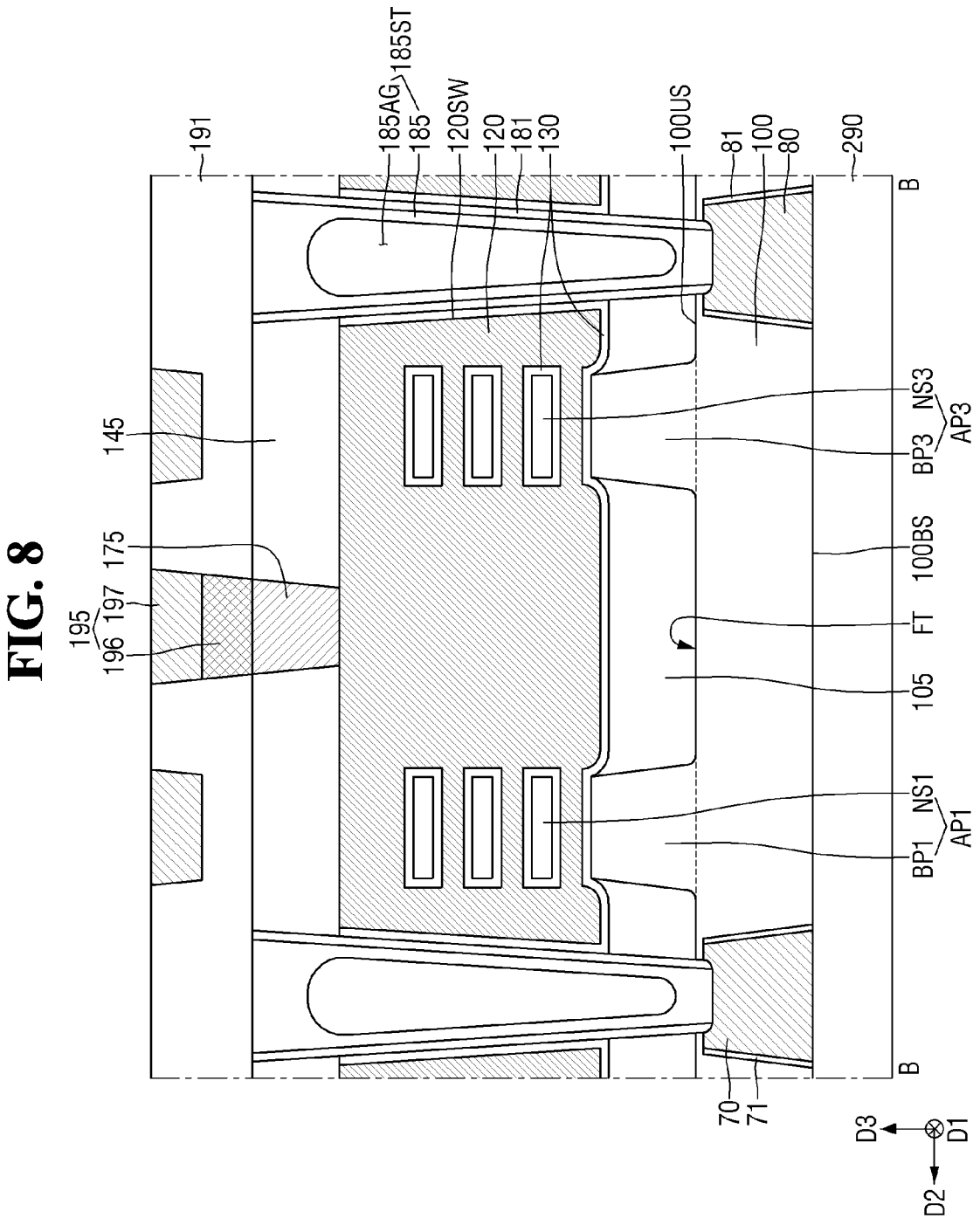
FIG. 8 illustrates a semiconductor device according to some embodiments.
Figure 9:
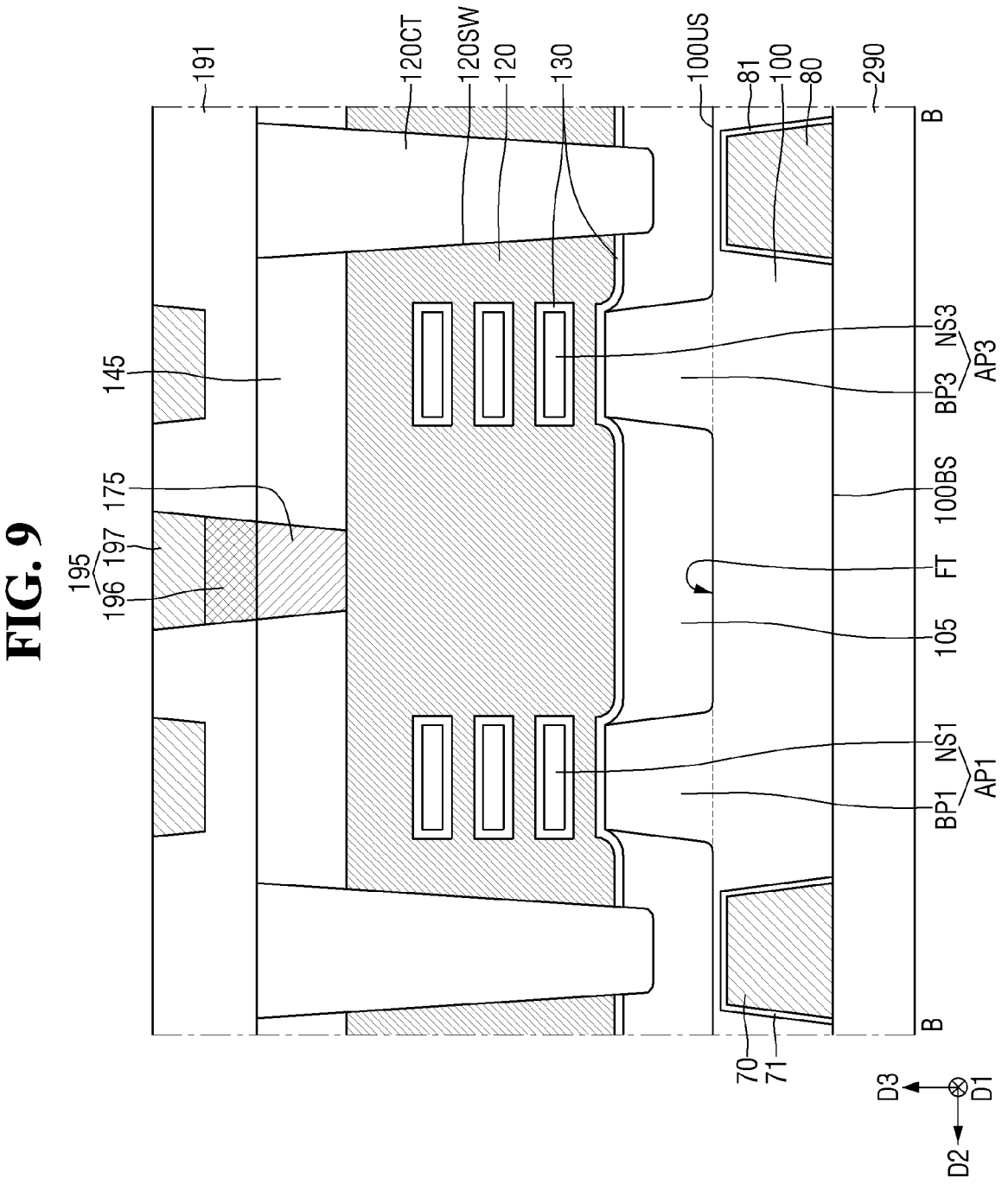
FIGS. 9 and 10 illustrate a semiconductor device according to some embodiments.
Figure 10:
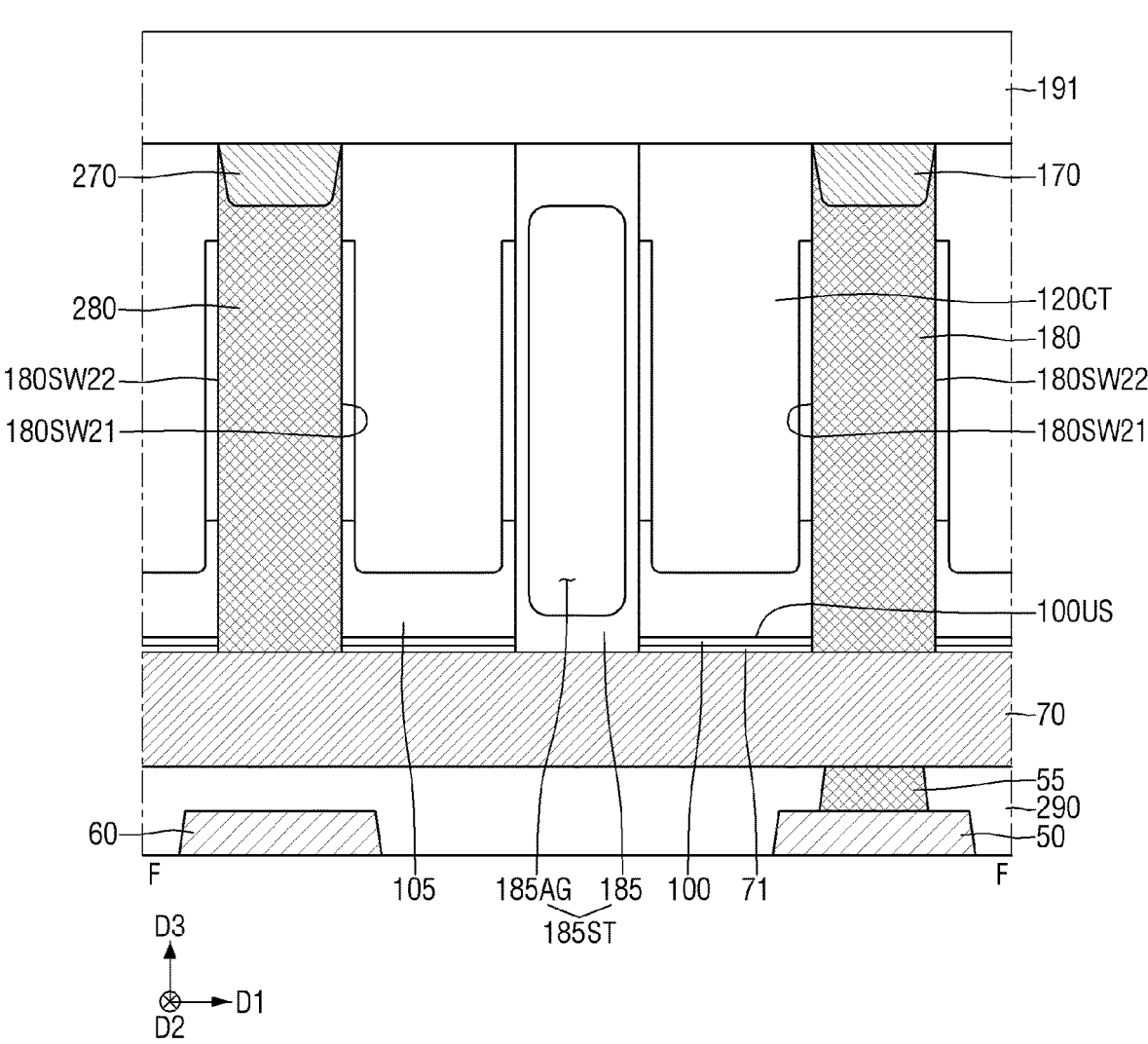
Figure 11:
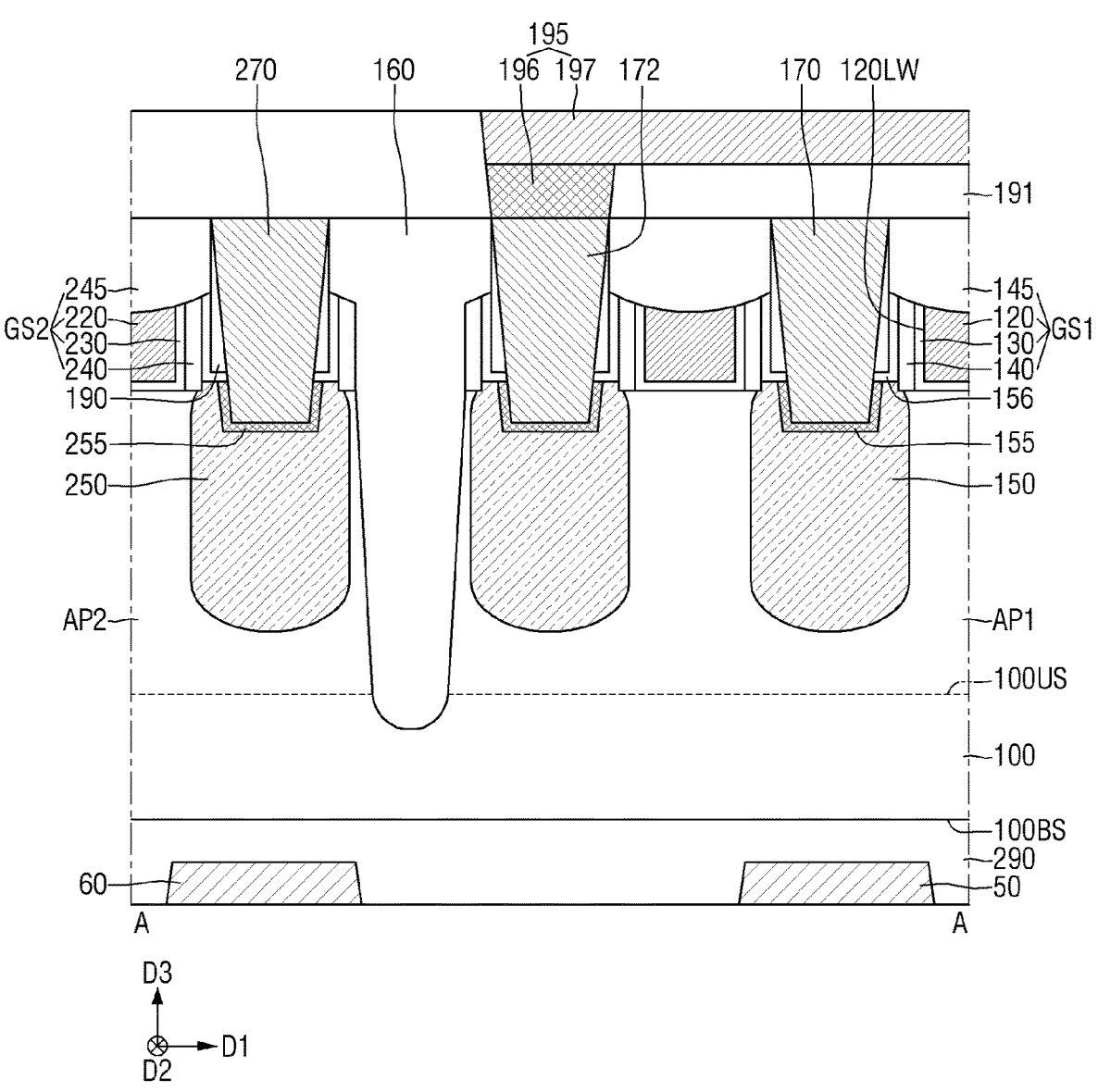
FIGS. 11 and 12 illustrate a semiconductor device according to some embodiments.
Figure 12:
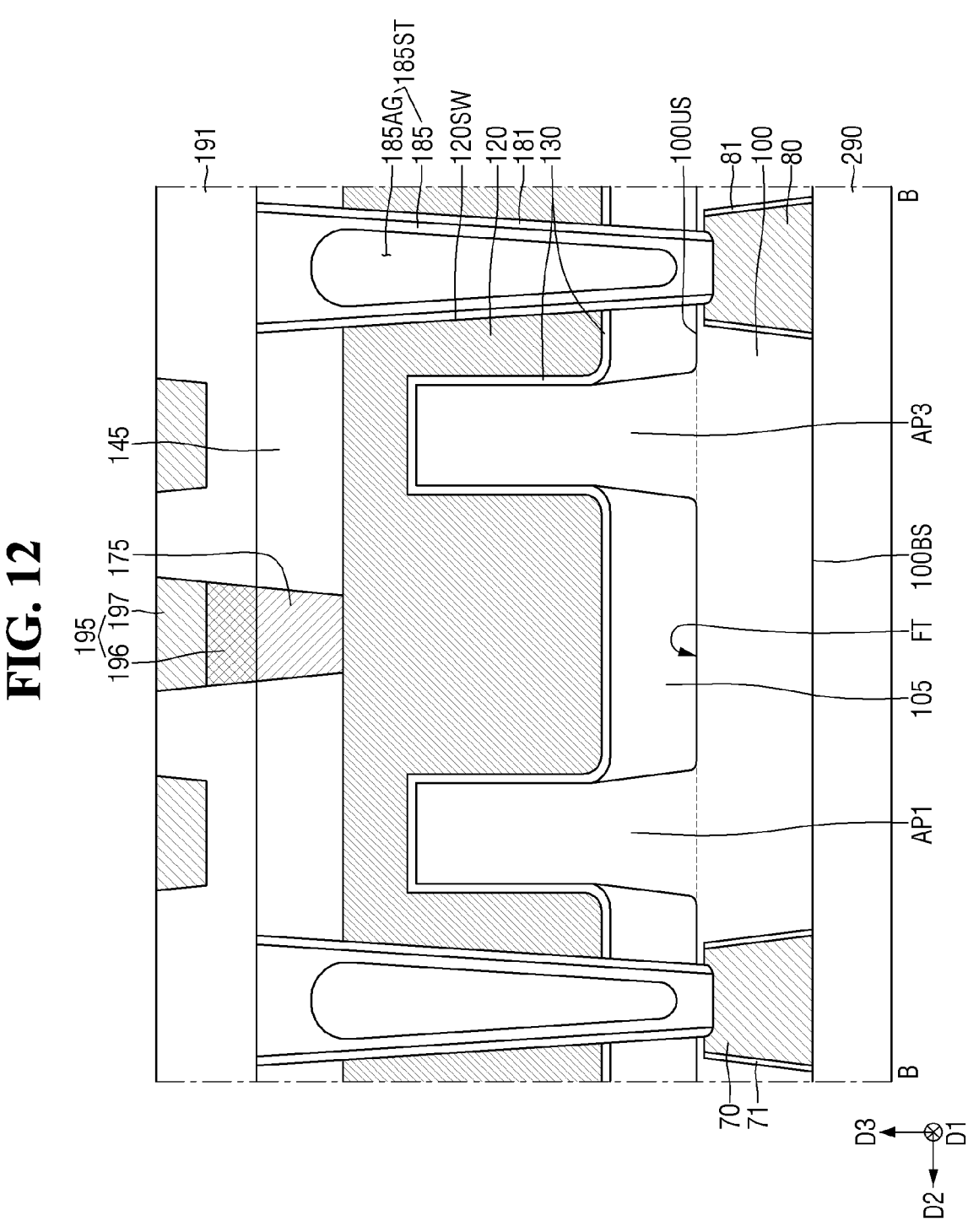

FIG. 8 illustrates a semiconductor device according to some embodiments. FIGS. 9 and 10 illustrate a semiconductor device according to some embodiments. FIGS. 11 and 12 illustrate a semiconductor device according to some embodiments. For convenience of description, the following description will be based on differences from those described with reference to FIGS. 1 to 7.

Referring to FIG. 8, in a semiconductor device according to some embodiments, the first gate insulating layer 130 is disposed between the first gate electrode 120 and the first air gap structure 185ST.

The first gate insulating layer 130 extends in the third direction D3 along the short sidewall 120 of the first gate electrode.

Referring to FIGS. 9 and 10, a semiconductor device according to some embodiments further includes a gate isolation structure 120CT.

The gate isolation structure 120CT is disposed between the first contact connection via 180 and the second contact connection via 280 that are adjacent to each other in the first direction D1. In addition, the gate isolation structure 120CT is disposed between the third contact connection via 380 and the fourth contact connection via 480 that are adjacent to each other in the first direction D1.

The short sidewall 120SW of the first gate electrode faces the gate isolation structure 120CT. The gate isolation structure 120CT overlaps the first gate electrode 120 in the second direction D2.

The first air gap structure 185ST is formed between the gate isolation structures 120CT adjacent to each other in the first direction D1.

In FIG. 10, a gate liner is disposed on a sidewall of the gate isolation structure 120CT. The gate liner is disposed between the gate isolation structure 120CT and the first air gap structure 185ST. The gate liner includes the same material as each of the first gate spacer (140 in FIG. 2) and the second gate spacer (240 in FIG. 2).

The gate isolation structure 120CT includes an insulating material. The gate isolation structure 120CT includes at least one of, for example, silicon nitride (SIN), silicon oxynitride (SION), silicon oxide (SiO$_2$), silicon oxycarbonitride (SiOCN), silicon boron nitride (SiBN), silicon oxyboron nitride (SiOBN), silicon oxycarbide (SiOC) or their combination. The gate isolation structure 120CT is shown as a single layer, but is not necessarily limited thereto.

A width of the first contact connection via 180 in the first direction D1 is constant with increasing distance from the first rear wiring line 50. A distance between the first sub-sidewall 180SW21 of the first contact connection via and the first sub-sidewall 280SW21 of the second contact connection via is constant with increasing distance away from the first rear wiring line 50 and the second rear wiring line 60.

Referring to FIGS. 11 and 12, in a semiconductor device according to some embodiments, none of the active patterns AP1, AP2, AP3 and AP4 includes a sheet pattern.

The active pattern AP1, AP2, AP3 and AP4 are fin-type patterns that protrude above the upper surface of the field insulating layer 105. In FIG. 12, the field insulating layer 105 covers a portion of the sidewalls of the active patterns AP1, AP2, AP3 and AP4.

The first gate structure GS1 does not yet include the first inner gate structure INT GS1. The second gate structure GS2 does not yet include the second inner gate structure INT_GS2.

Figure 13:
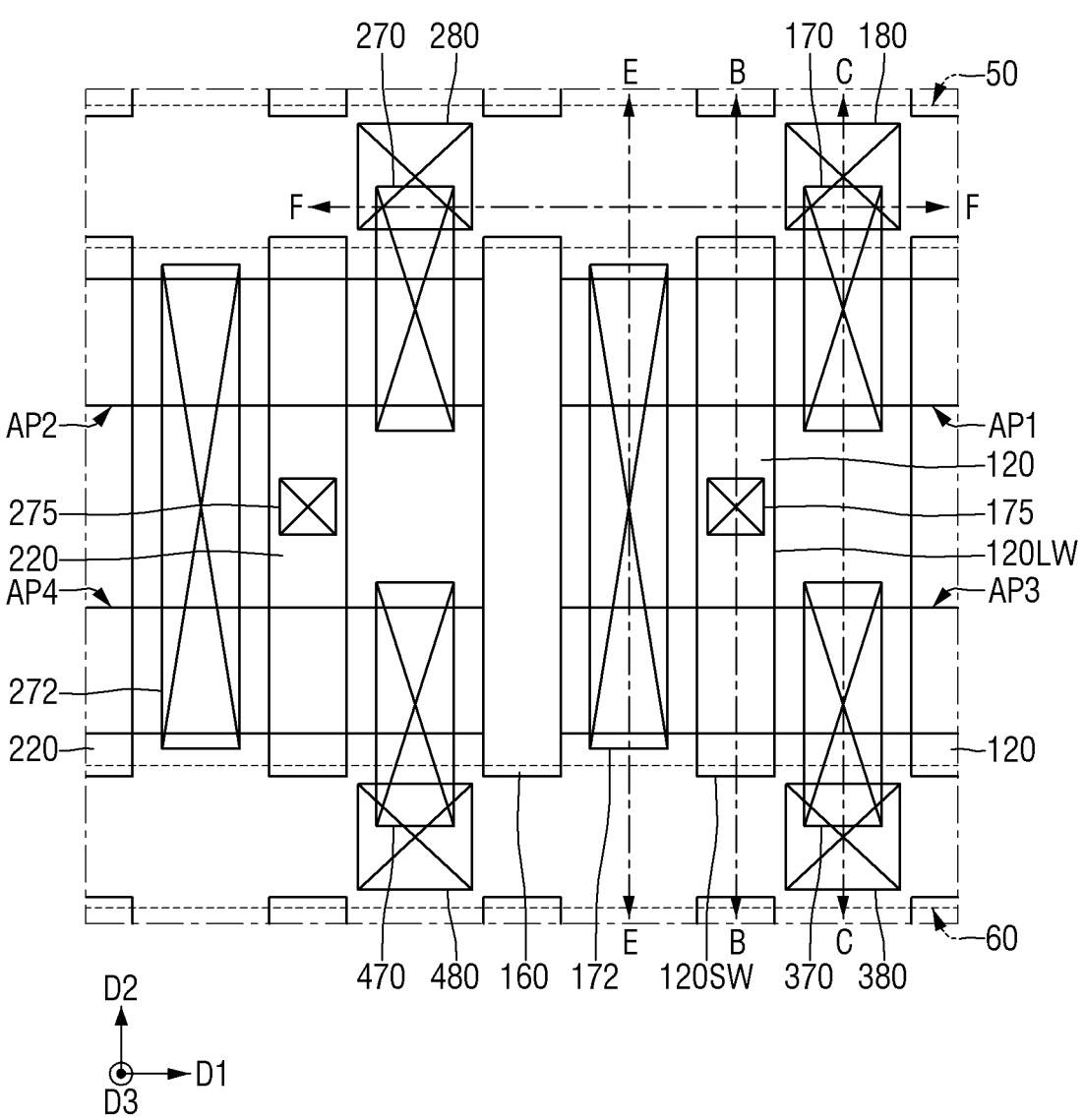
FIG. 13 is a layout view of a semiconductor device according to some embodiments.
Figure 14:
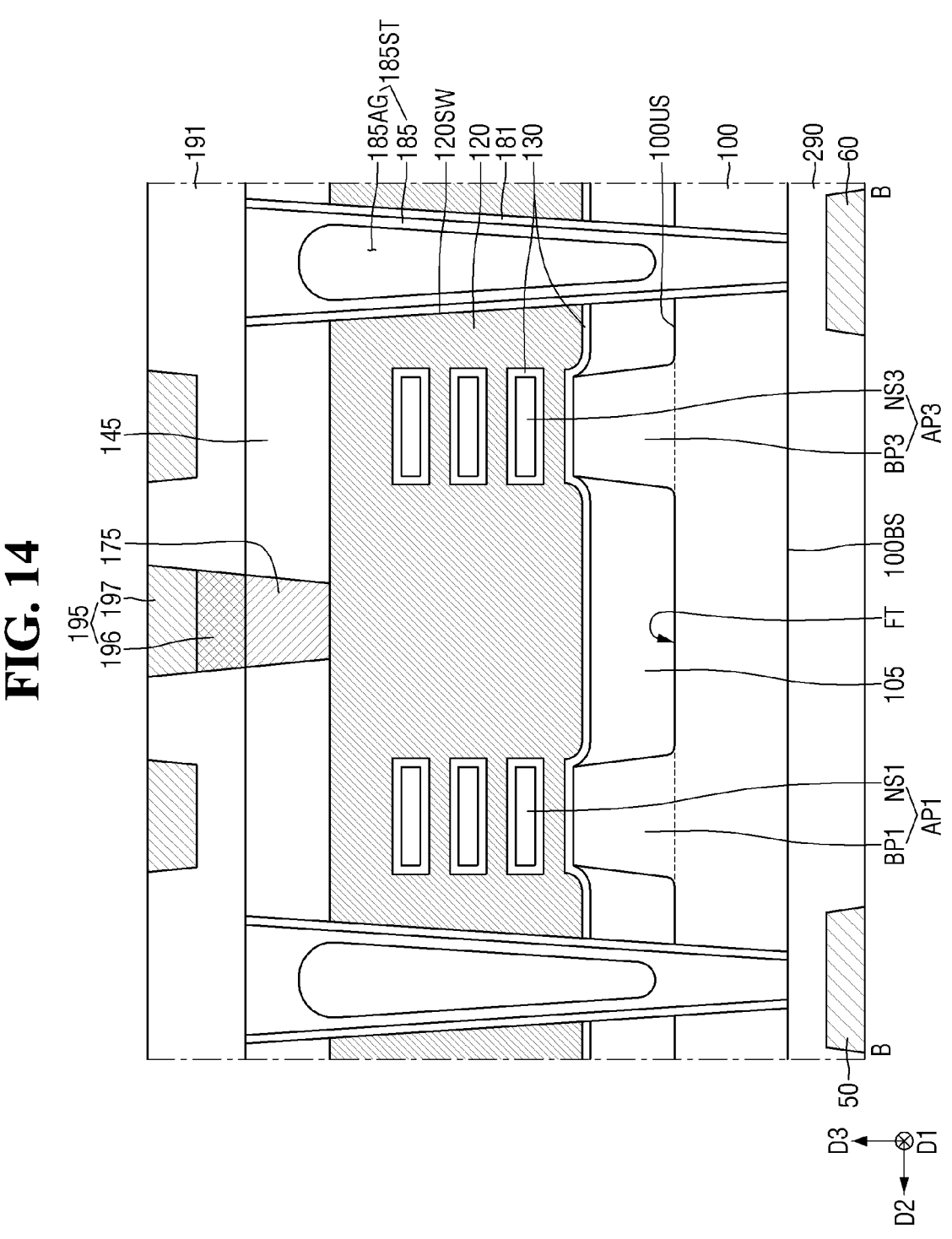
FIGS. 14 to 17 are cross-sectional views taken along lines B-B, C-C, E-E and F-F of FIG. 13.
Figure 15:
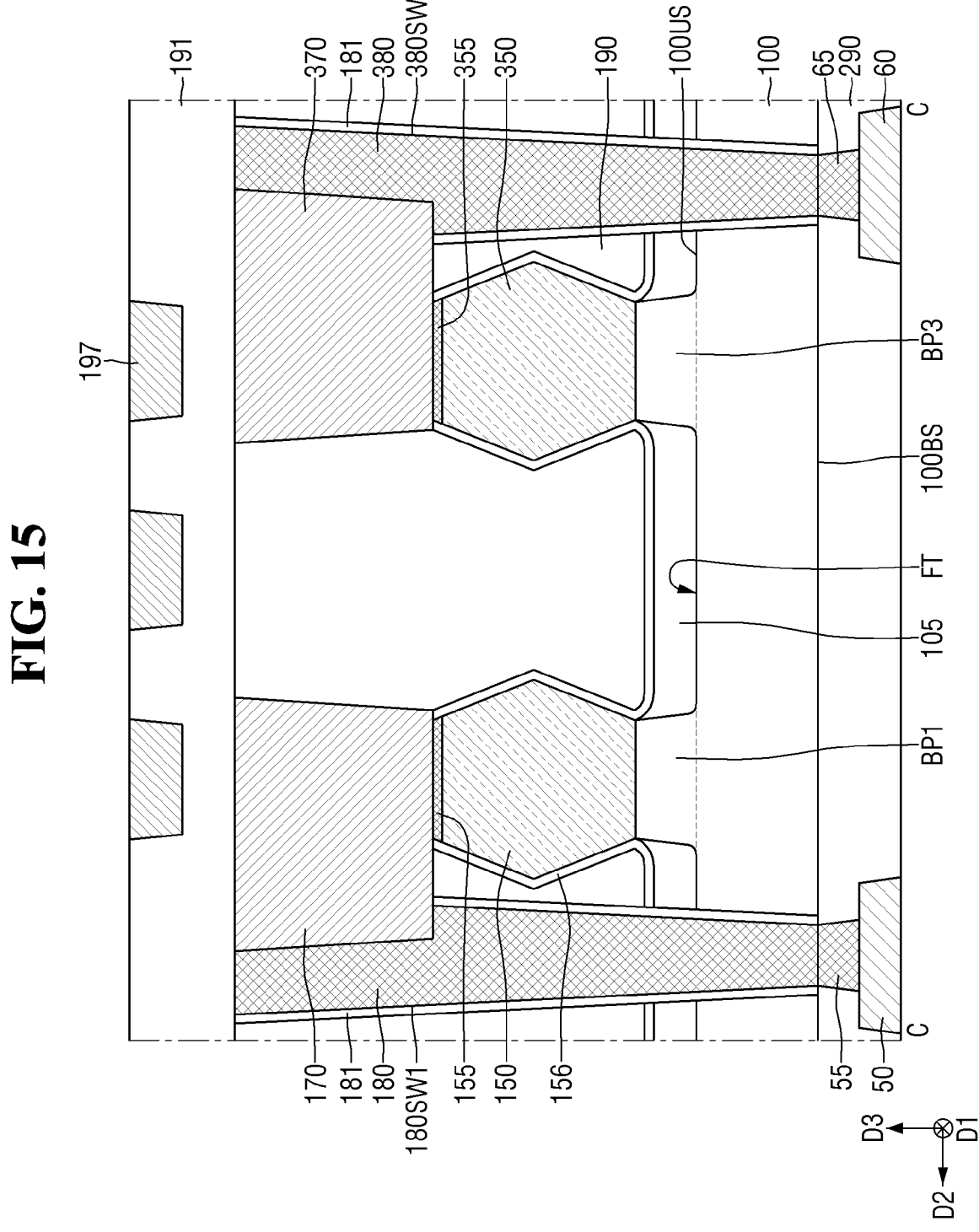
Figure 16:
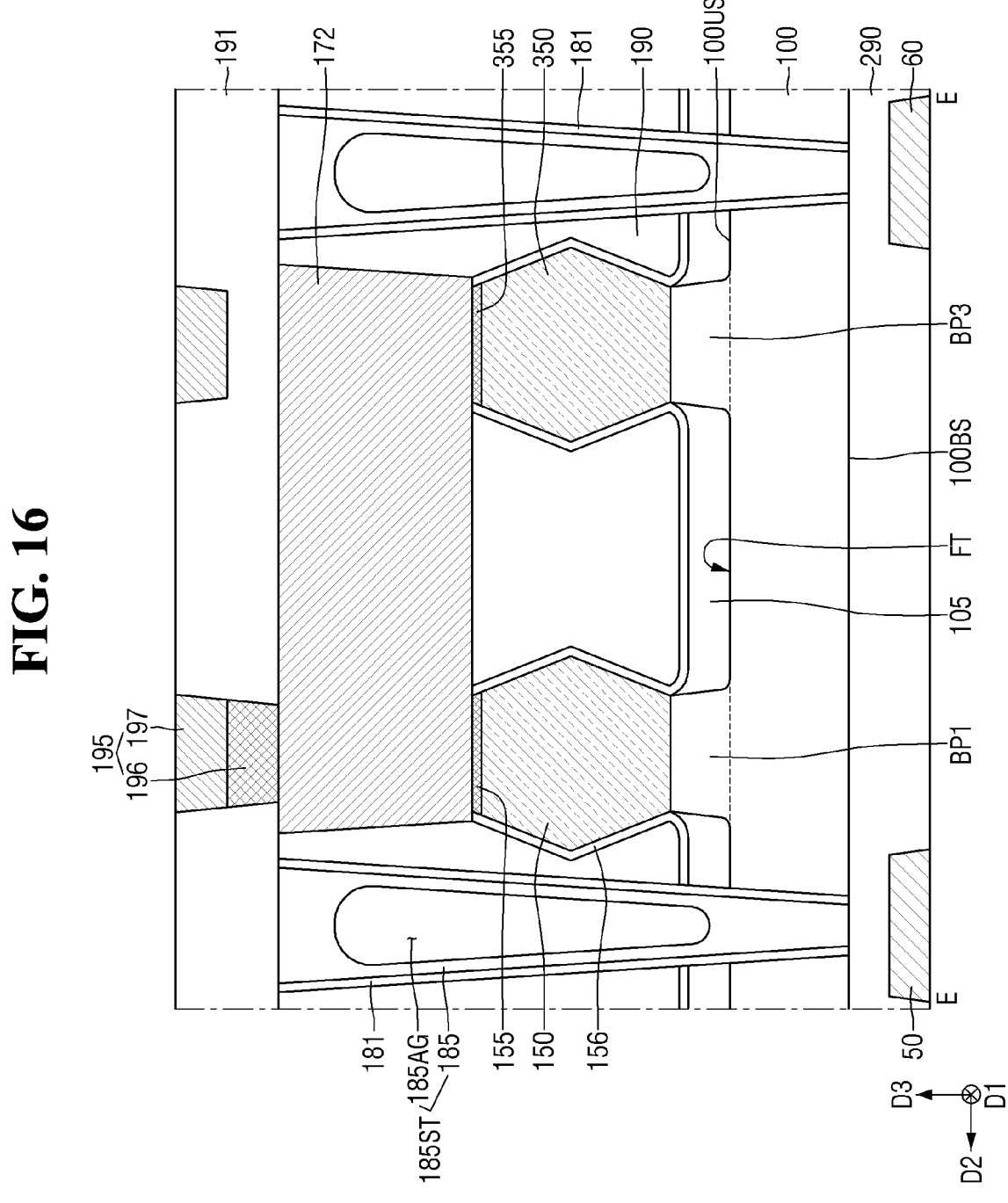
Figure 17:
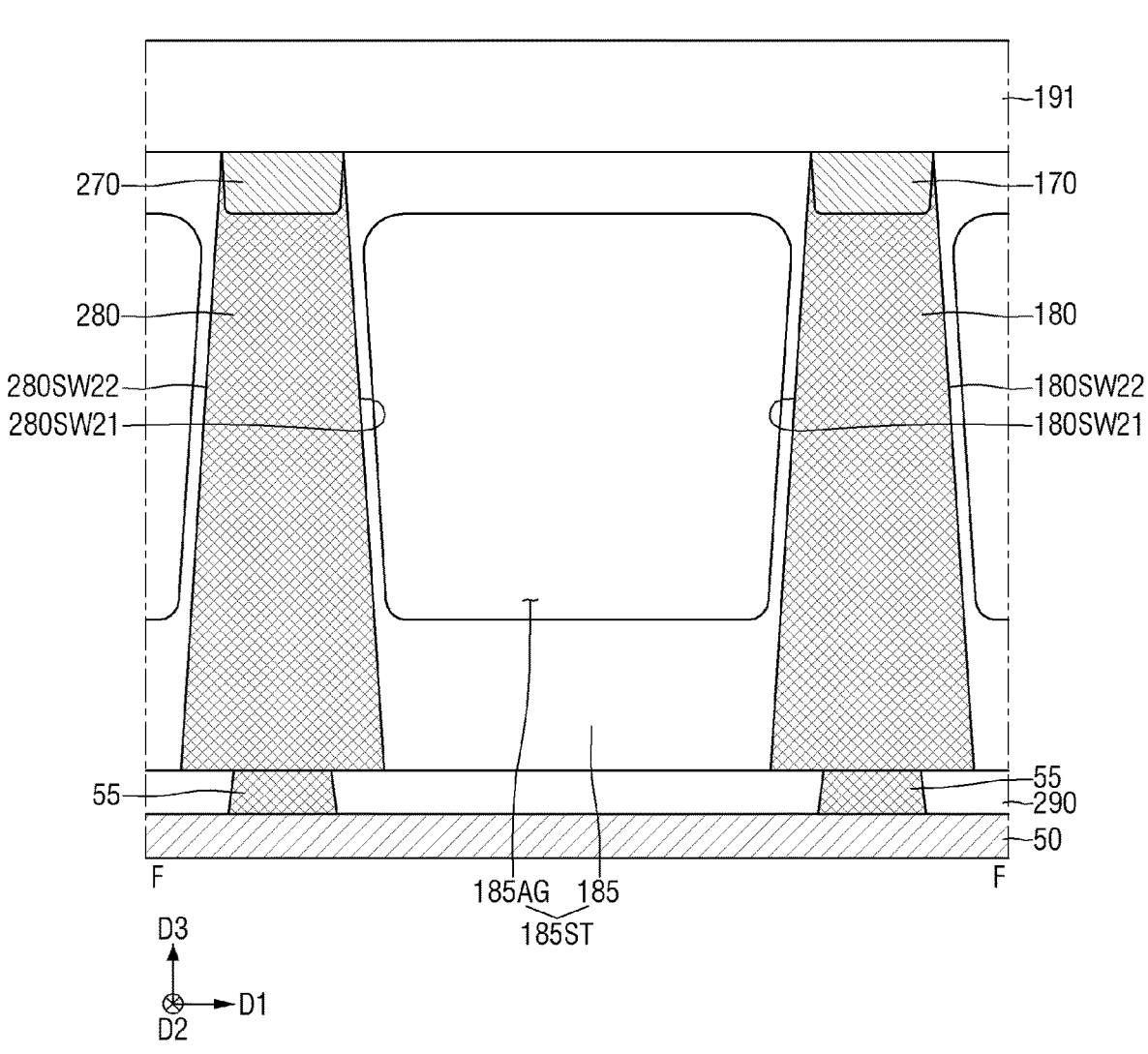

FIG. 13 is a layout view of a semiconductor device according to some embodiments. FIGS. 14 to 17 are cross-sectional views taken along lines B-B, C-C, E-E and F-F of FIG. 13. For convenience of description, the following description will be based on differences from those described with reference to FIGS. 1 to 7.

Referring to FIGS. 13 to 17, in a semiconductor device according to some embodiments, the first contact connection via 180 and the third contact connection via 380 pass through the substrate 100.

In addition, the second contact connection via 280 and the fourth contact connection via 480 pass through the substrate 100.

The first contact connection via 180 is directly connected to the first rear wiring via 55. The third contact connection via 380 is directly connected to the second rear wiring via 65.

However, embodiments are not necessarily limited thereto, and in some embodiments, the first rear wiring via 55 is not disposed between the first contact connection via 180 and the first rear wiring line 50, and the second rear wiring via 65 is not disposed between the third contact connection via 380 and the second rear wiring line 60. For example, the first contact connection via 180 is directly connected to the first rear wiring line 50, and the third contact connection via 380 is directly connected to the second rear wiring line 60.

The first air gap structure 185ST passes through the substrate 100.

Figure 18:
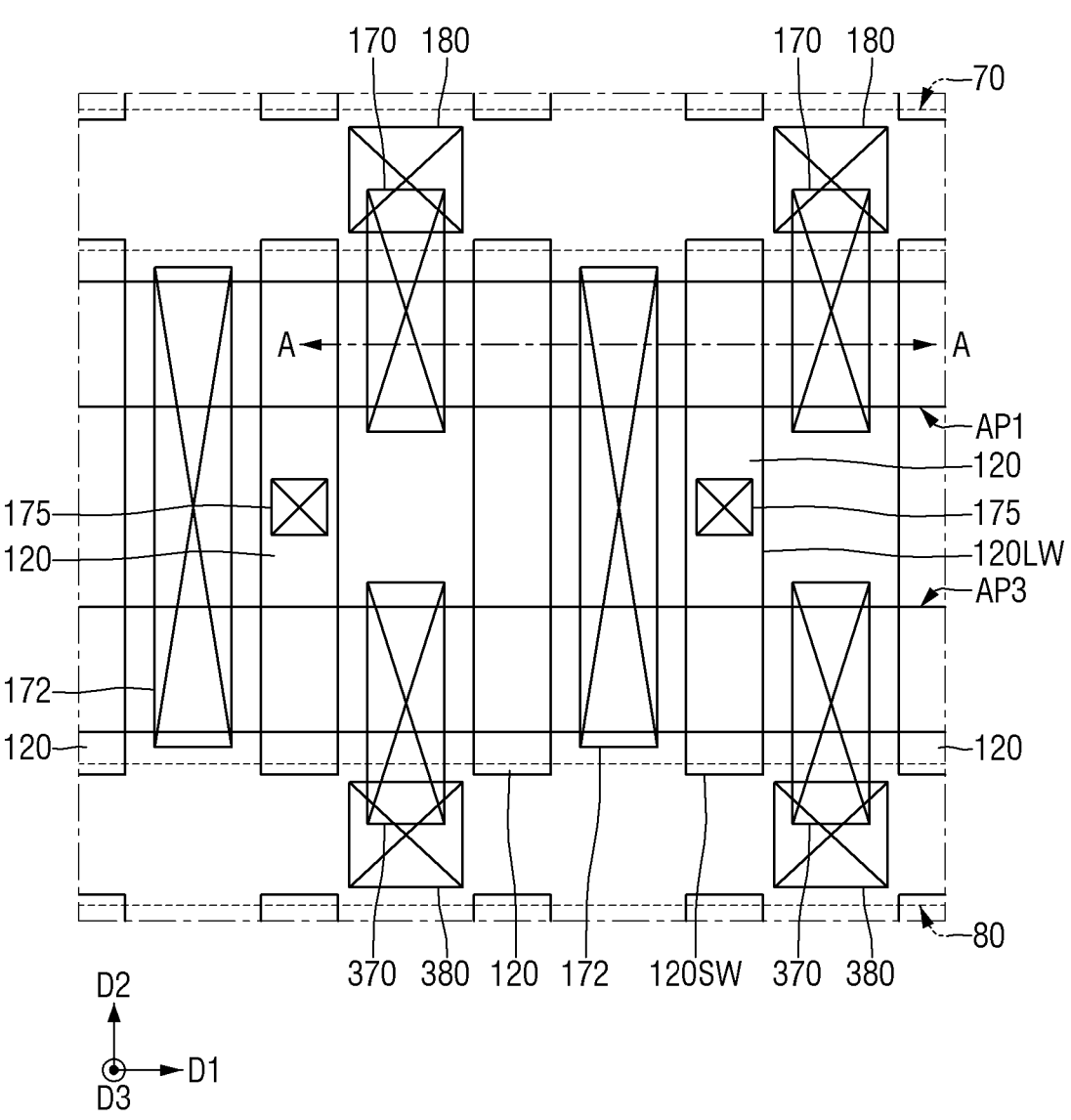
Figure 19:
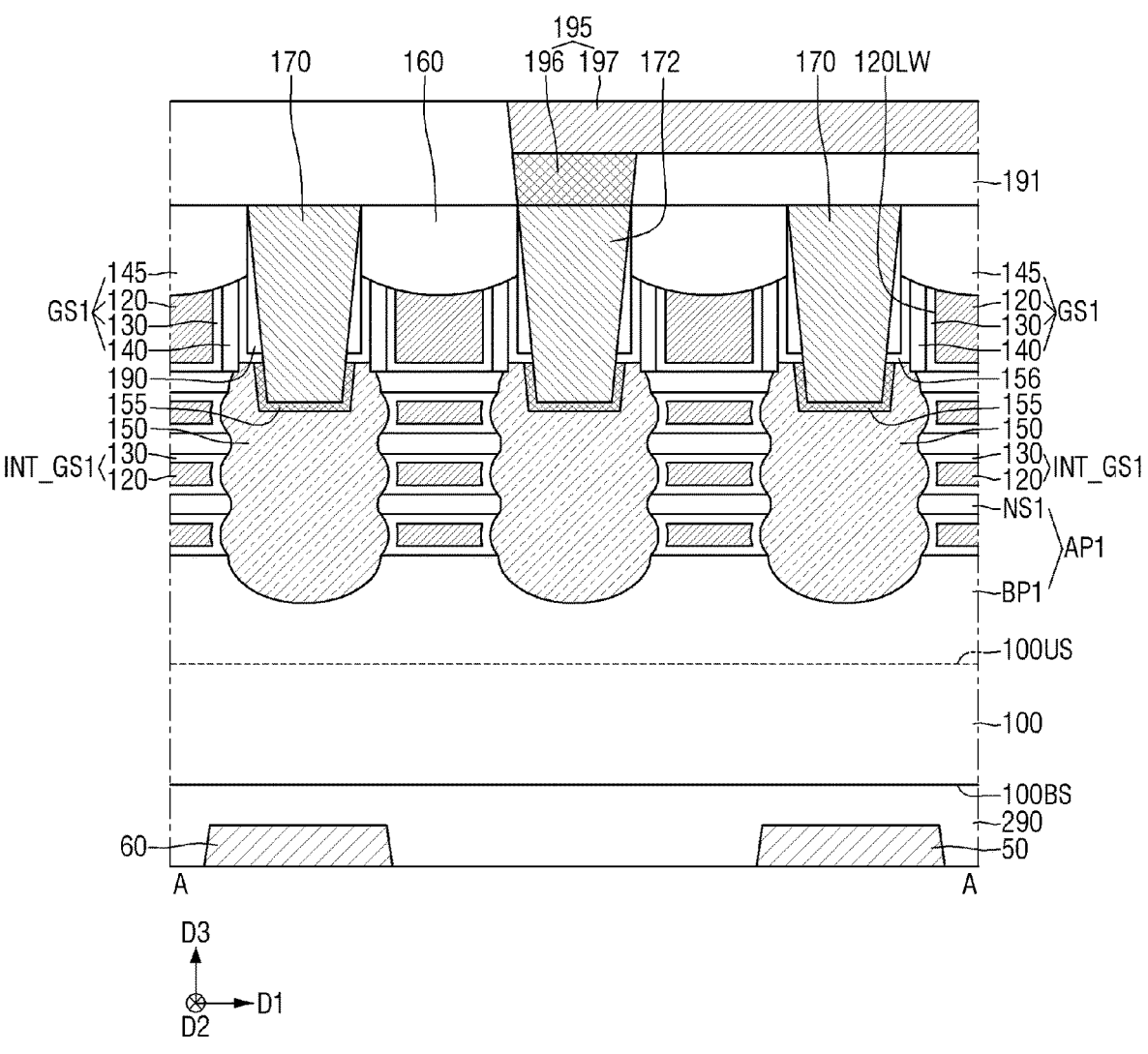
FIG. 19 is a cross-sectional view taken along line A-A of FIG. 18.

FIG. 18 is a layout view of a semiconductor device according to some embodiments. FIG. 19 is a cross-sectional view taken along line A-A of FIG. 18. For convenience of description, the following description will be based on differences from those described with reference to FIGS. 1 to 7.

For reference, cross-sectional views taken along lines B-B, C-C and E-E of FIG. 1 would the same as in FIG. 18. A cross-sectional view taken along line D-D of FIG. 1 and a cross-sectional view taken along line C-C of FIG. 1 would be the same in FIG. 18. A cross-sectional view in FIG. 18 that corresponds to that taken along line F-F of FIG. 1 would be the same as FIG. 7 except that the third contact connection via 380 of FIG. 7 is changed to the first contact connection via 180.

Referring to FIGS. 18 and 19, in an embodiment, a plurality of first source/drain patterns 150 are connected to the first wiring line 50 through a plurality of first contact connection vias 180.

A plurality of third source/drain patterns 350 are connected to the second wiring line 60 through a plurality of third contact connection vias 380.

The first active pattern AP1 of FIG. 19 is connected as one, unlike the first and second active patterns AP1 and AP2 of FIG. 2.

Figure 20:
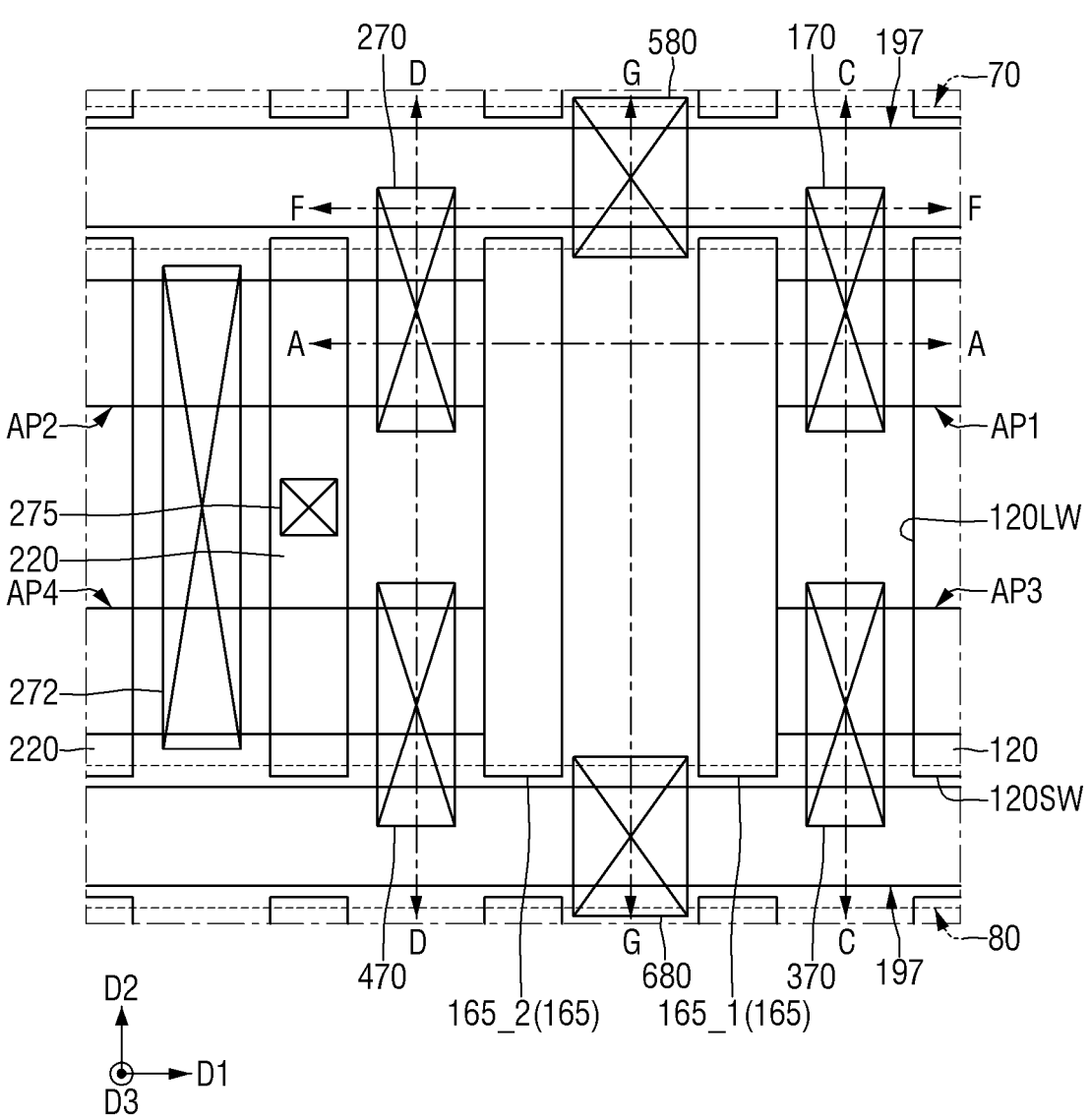
FIG. 20 is a layout view of a semiconductor device according to some embodiments.
Figure 21:
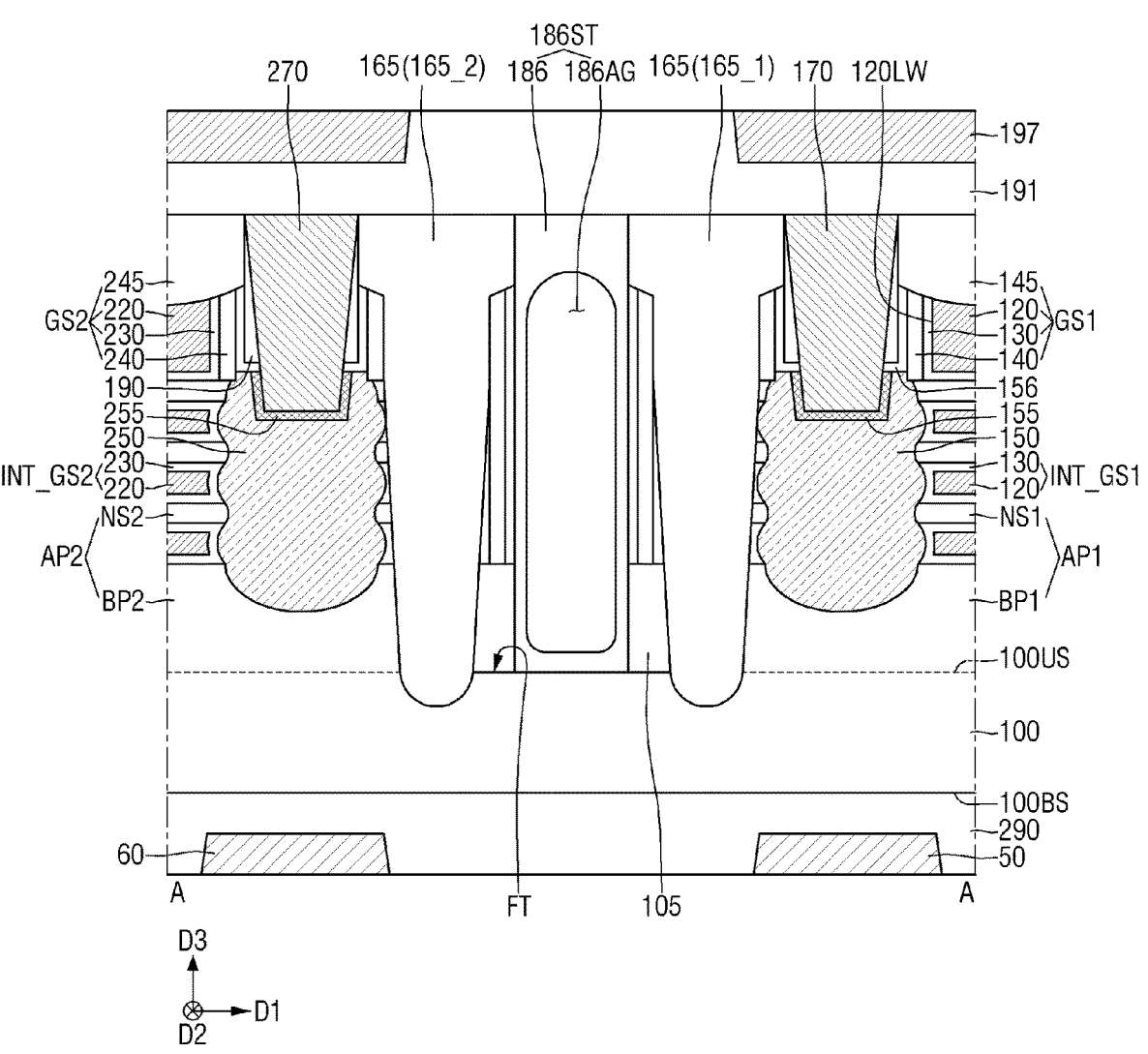
Figure 23:
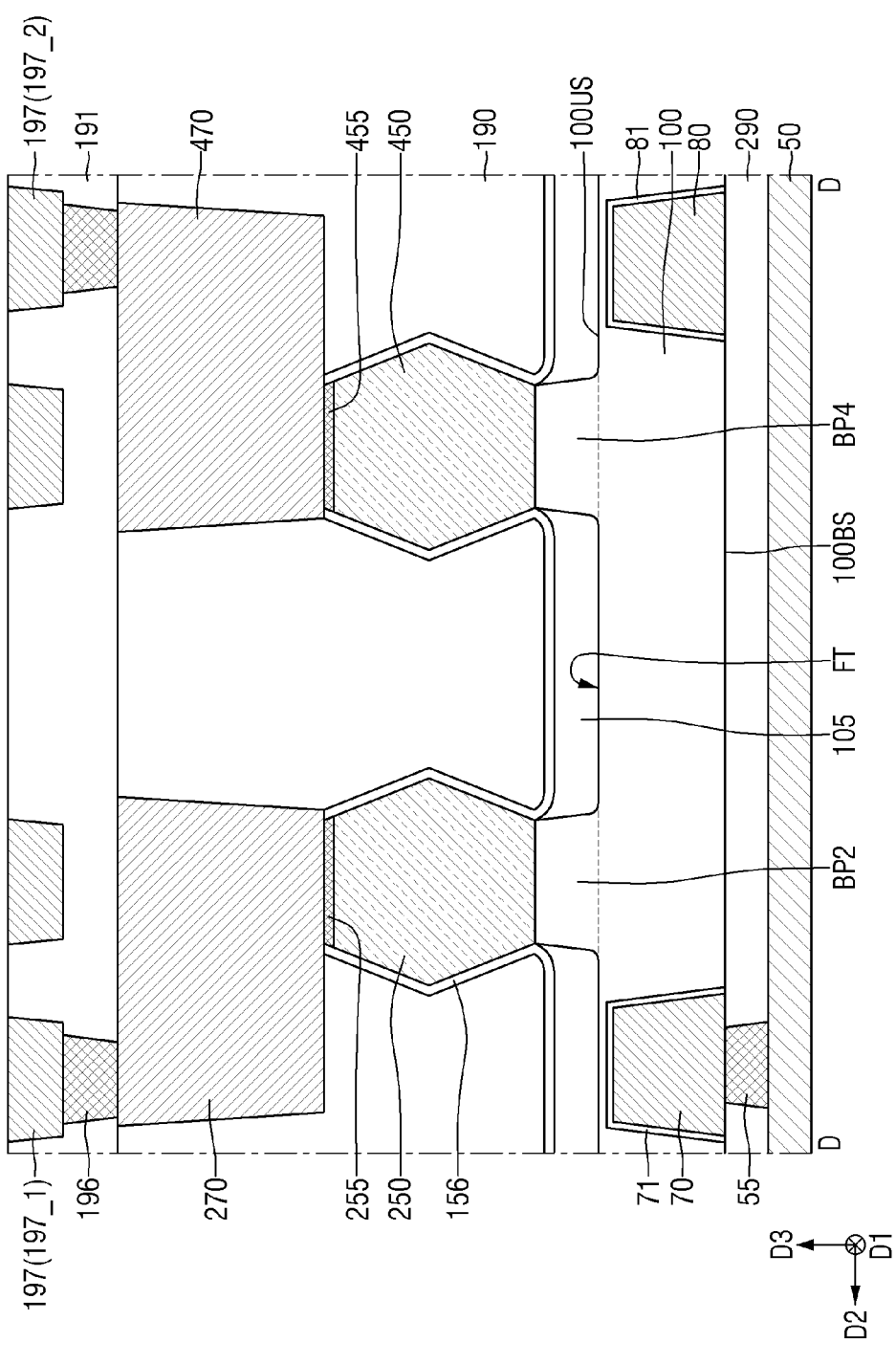
Figure 24:
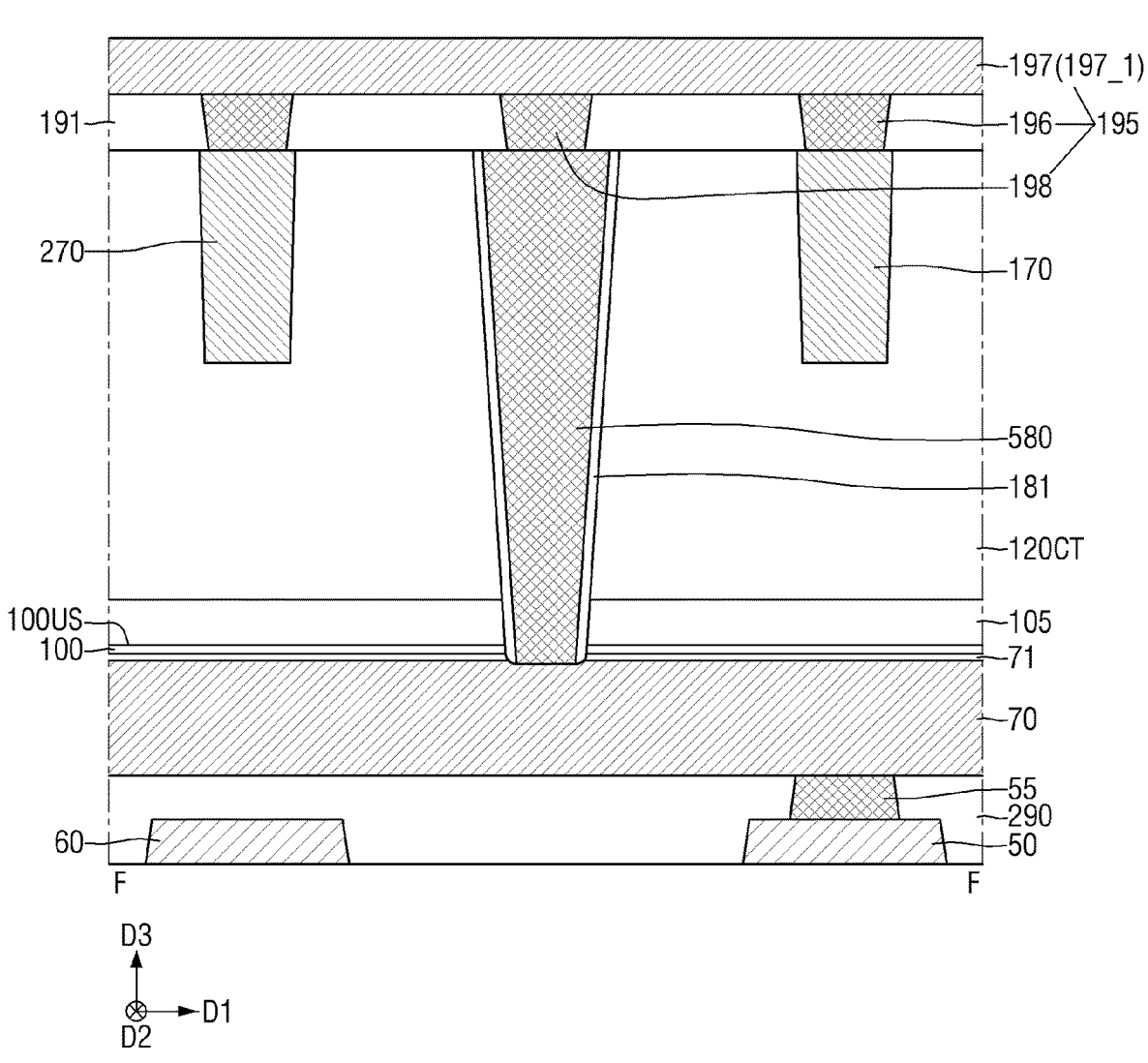
Figure 25:
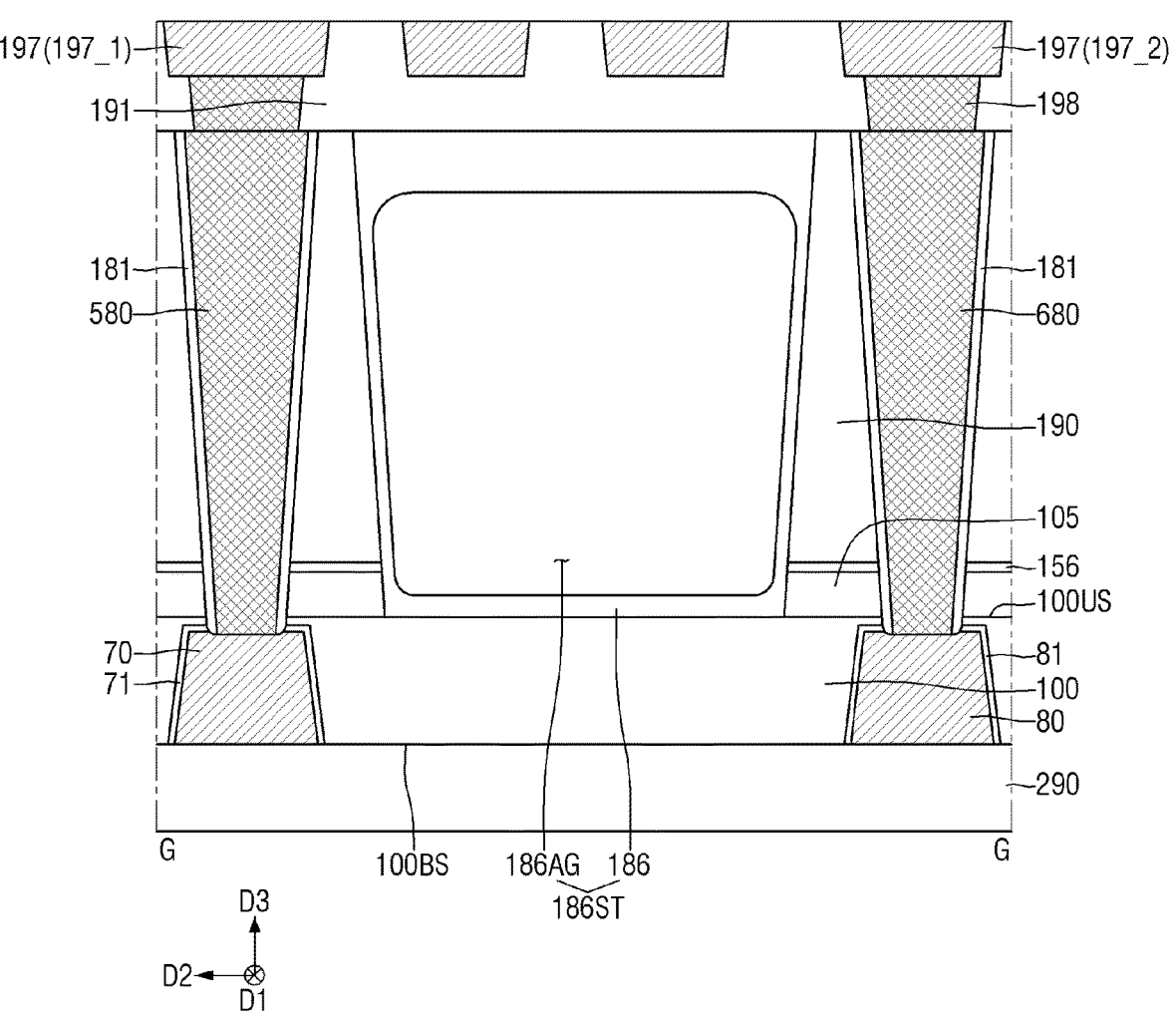

FIG. 20 is a layout view of a semiconductor device according to some embodiments. FIGS. 21 to 25 are cross-sectional views taken along lines A-A, C-C, D-D, F-F and G-G of FIG. 20. For convenience of description, the following description will be based on differences from those described with reference to FIGS. 1 to 7.

Referring to FIGS. 21 to 25, in a semiconductor device according to some embodiments, a pair of second element isolation structures 165 are disposed between the first active pattern AP1 and the second active pattern AP2 and between the third active pattern AP3 and the fourth active pattern AP4.

The pair of second element isolation structures 165 is disposed on the substrate 100. The pair of second element isolation structures 165 are disposed on the first surface 100US of the substrate.

The pair of second element isolation structures 165 includes a first sub-element isolation structure 165_1 and a second sub-element isolation structure 165_2. Each of the first sub-element isolation structure 165_1 and the second sub-element isolation structure 165_2 extends in the second direction D2. The first sub-element isolation structure 165_1 is spaced apart from the second sub-element isolation structure 165_2 in the first direction D1.

The second element isolation structure 165 separates the first lower pattern BP1 from the second lower pattern BP2. The second element isolation structure 165 separates the third lower pattern BP3 from the fourth lower pattern BP4. The first active pattern AP1 and the second active pattern AP2 are not disposed between the first sub-element isolation structure 165_1 and the second sub-element isolation structure 165_2. For example, the first lower pattern BP1 and the second lower pattern BP2 are not disposed between the first sub-element isolation structure 165_1 and the second sub-element isolation structure 165_2. A portion of the field insulating layer 105 is disposed between the first sub-element isolation structure 165_1 and the second sub-element isolation structure 165_2 that are adjacent to each other in the first direction D1.

However, embodiments are not necessarily limited thereto, and in some embodiments, a dummy active pattern that contains a semiconductor material is disposed between the first sub-element isolation structure 165_1 and the second sub-element isolation structure 165_2.

The first lower pattern BP1 is adjacent to the first sub-element isolation structure 165_1 in the first direction D1. The second lower pattern BP2 is adjacent to the second sub-element isolation structure 165_2 in the first direction D1. In addition, the third lower pattern BP3 is adjacent to the first sub-element isolation structure 165_1 in the first direction D1. The fourth lower pattern BP4 is adjacent to the second sub-element isolation structure 165_2 in the first direction D1.

A height of an upper surface of the first sub-element isolation structure 165_1 is the same as that of the upper surface of the first gate capping pattern 145, based on the second surface 100BS of the substrate. However, embodiments are not necessarily limited thereto, and in some embodiments, the upper surface of the first sub-element isolation structure 165_1 is higher than that of the first gate capping pattern 145, based on the second surface 100BS of the substrate.

The second element isolation structure 165 includes an insulating material. Each of the first sub-element isolation structure 165_1 and the second sub-element isolation structure 165_2 is shown as a single layer, but embodiments are not necessarily limited thereto.

A fifth contact connection via 580 is disposed between the first sub-element isolation structure 165_1 and the second sub-element isolation structure 165_2. The fifth contact connection via 580 connects the first buried conductive pattern 70 with the first source/drain contact 170. The fifth contact connection via 580 connects the first buried conductive pattern 70 with the second source/drain contact 270. The fifth contact connection via 580 is connected to the first rear wiring line 50.

The fifth contact connection via 580 does not overlap the first source/drain contact 170 in the second direction D2. The fifth contact connection via 580 does not overlap the second source/drain contact 270 in the second direction D2. The fifth contact connection via 580 is spaced apart from the first source/drain contact 170 in the first direction D1. The fifth contact connection via 580 is spaced apart from the second source/drain contact 270 in the first direction D1.

A sixth contact connection via 680 is disposed between the first sub-element isolation structure 165_1 and the second sub-element isolation structure 165_2. The sixth contact connection via 680 connects the second buried conductive pattern 80 with the third source/drain contact 370. The sixth contact connection via 680 connects the second buried conductive pattern 80 with the fourth source/drain contact 470. The sixth contact connection via 680 is connected to the second rear wiring line 60.

The sixth contact connection via 680 does not overlap the third source/drain contact 370 in the second direction D2. The sixth contact connection via 680 does not overlap the fourth source/drain contact 470 in the second direction D2. The sixth contact connection via 680 is spaced apart from the third source/drain contact 370 in the first direction D1. The sixth contact connection via 680 is spaced apart from the fourth source/drain contact 470 in the first direction D1.

The fifth contact connection via 580 is connected to the first buried conductive pattern 70 by passing through the source/drain etching stop layer 156 and the field insulating layer 105. The sixth contact connection via 680 is connected to the second buried conductive pattern 80 by passing through the source/drain etching stop layer 156 and the field insulating layer 105. The fifth contact connection via 580 is spaced apart from the sixth contact connection via 680 in the second direction D2. The fifth contact connection via 580 and the sixth contact connection via 680 are arranged in the second direction D2.

A width of the fifth contact connection via 580 in the first direction D1 increases with increasing distance from the first rear wiring line 50. A width of the fifth contact connection via 580 in the second direction D2 increases with increasing distance from the first rear wiring line 50. The description of the width of the fifth contact connection via 580 is substantially the same as that of a width of the sixth contact connection via 680.

The front wiring structure 195 further includes a wiring connection via 198 that connects the front wiring line 197 with the contact connection vias 580 and 680. The front wiring line 197 includes a first front wiring line 197_1 and a second front wiring line 197_2. Each of the first front wiring line 197_1 and the second front wiring line 197_2 extends in the first direction D1.

The first front wiring line 197_1 connects the first source/drain contact 170 with the fifth contact connection via 580. The first front wiring line 197_1 connects the second source/drain contact 270 with he fifth contact connection via 580.

The second front wiring line 197_2 connects a third source/drain contact 370 with the sixth contact connection via 680. The second front wiring line 197_2 connects the fourth source/drain contact 470 with the sixth contact connection via 680.

A second air gap structure 186ST is disposed between the fifth contact connection via 580 and the sixth contact connection via 680. The second air gap structure 186ST is disposed between the first sub-element isolation structure 165_1 and the second sub-element isolation structure 165_2. The second air gap structure 186ST extends in the second direction D2.

The second air gap structure 186ST includes a second air gap liner 186 and a second air gap 186AG. The second air gap 186AG is formed in the second air gap liner 186. The second air gap liner 186 surrounds the second air gap 186AG.

The second air gap structure 186ST is disposed on the substrate 100. However, embodiments are not necessarily limited thereto, and in some embodiments, a portion of the second air gap structure 186ST is disposed in the substrate 100. The first upper interlayer insulating layer 190 is disposed between the second air gap structure 186ST and the fifth contact connection via 580 and between the second air gap structure 186ST and the sixth contact connection via 680.

FIGS. 26 to 39 illustrate intermediate steps of a method for manufacturing a semiconductor device according to some embodiments. A semiconductor device described with reference to FIGS. 1 to 19 can be manufactured using FIGS. 26 to 39.

Figure 26:
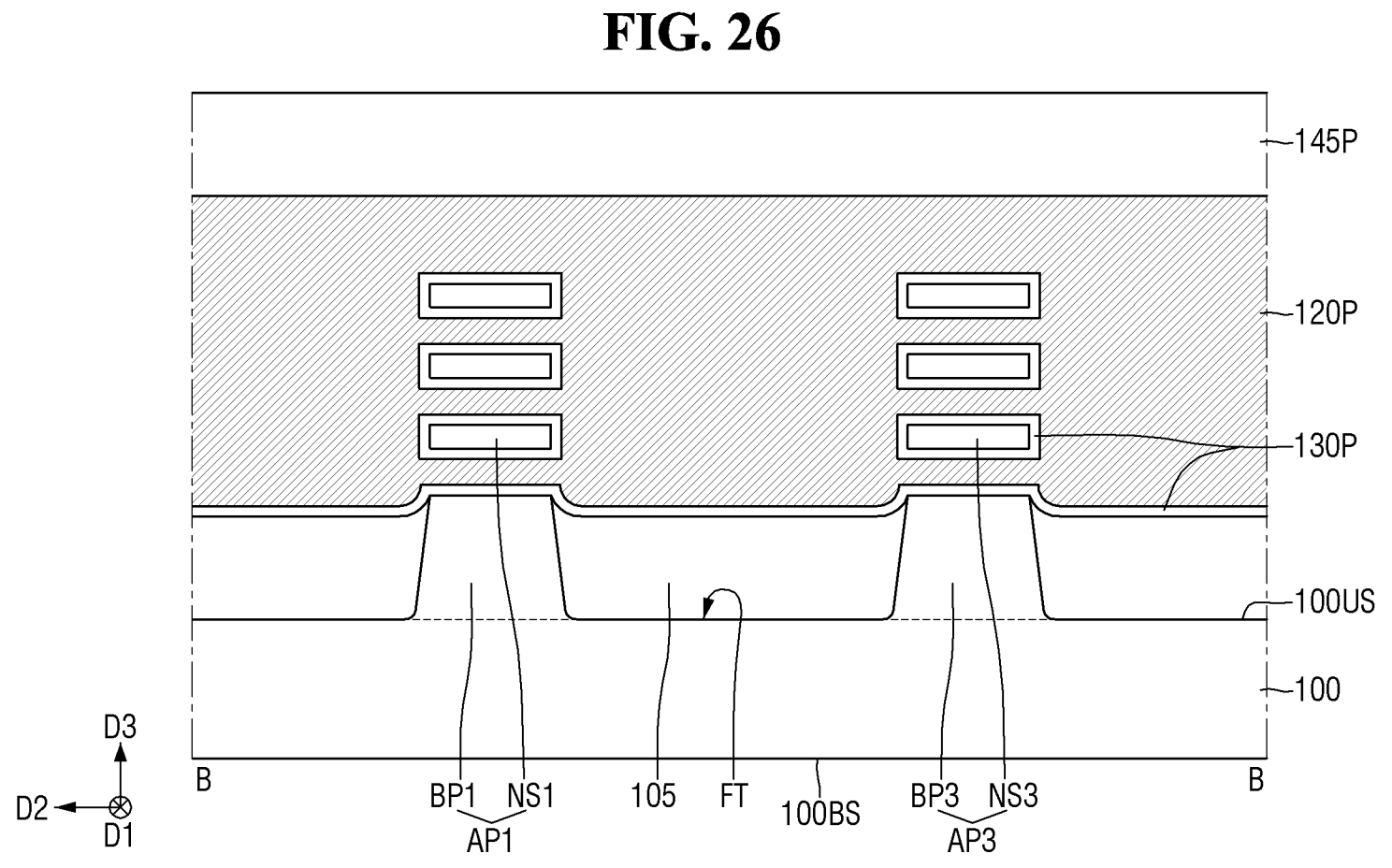
Figure 27:
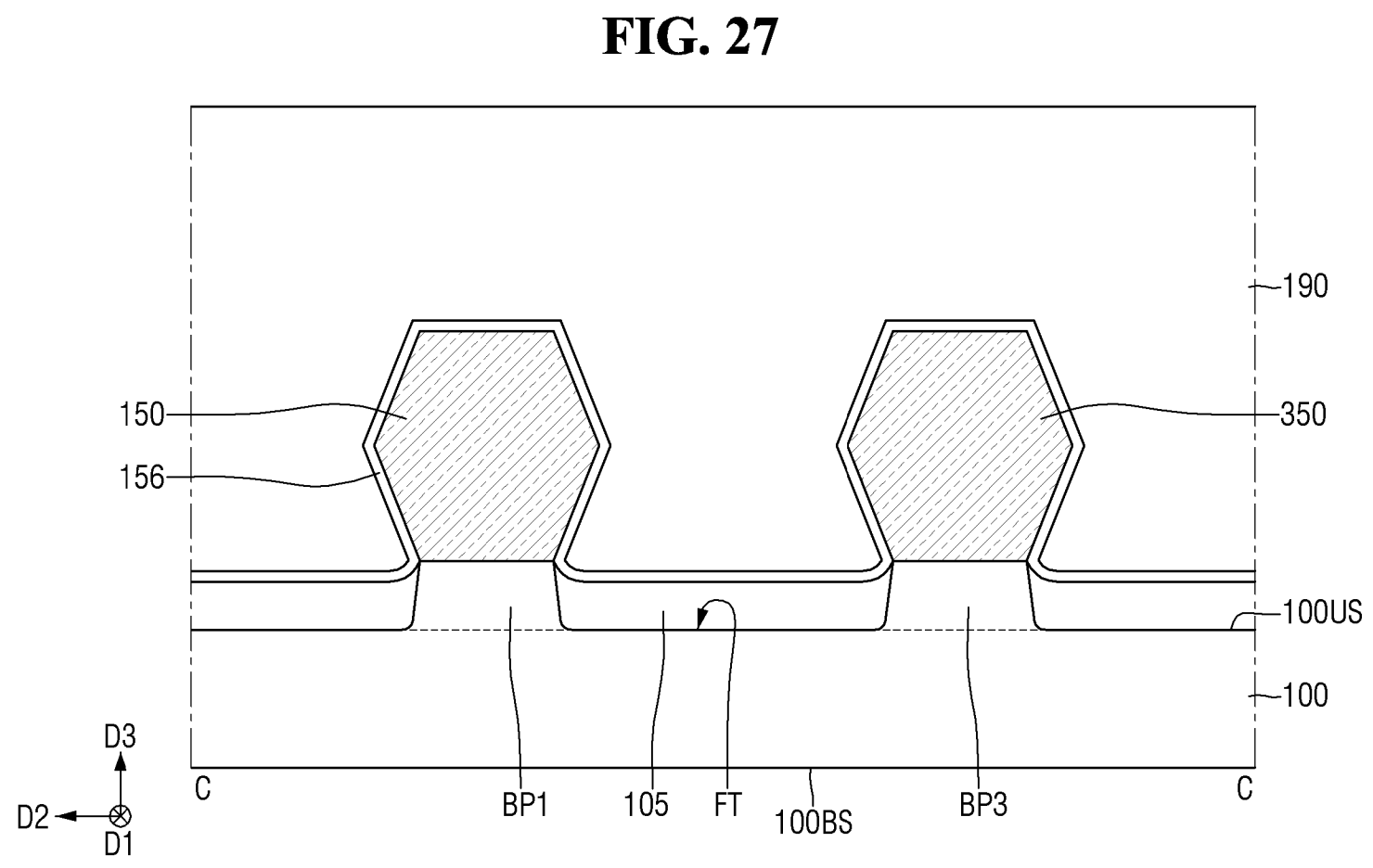
Figure 28:
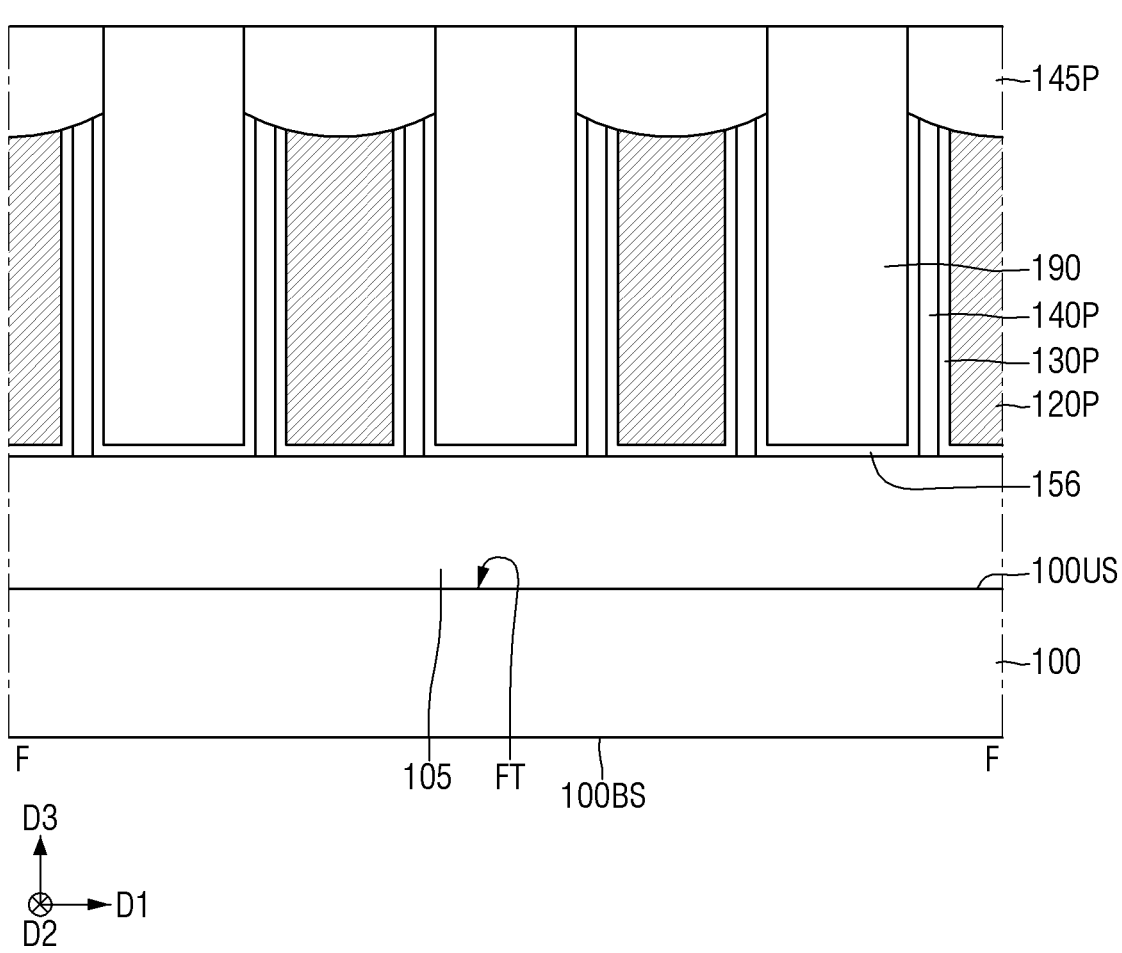

Referring to FIGS. 26 to 28, in an embodiment, the first source/drain pattern 150 is formed on the first lower pattern BP1. The third source/drain pattern 350 is formed on the third lower pattern BP3.

The source/drain etching stop layer 156 is formed along a profile of the first source/drain pattern 150 and the third source/drain pattern 350. The source/drain etching stop layer 156 is formed along the upper surface of the field insulating layer 105. The first upper interlayer insulating layer 190 is formed on the source/drain etching stop layer 156.

A pre-gate insulating layer 130P and a pre-gate electrode 120P are formed on the field insulating layer 105. The pre-gate insulating layer 130P and the pre-gate electrode 120P are formed between pre-gate spacers 140P. The pre-gate insulating layer 130P and the pre-gate electrode 120P are formed on the first lower pattern BP1 and the third lower pattern BP3. The pre-gate insulating layer 130P and the pre-gate electrode 120P surround the first sheet pattern NS1 and the third sheet pattern NS3. A pre-gate capping pattern 145P is formed on the pre-gate insulating layer 130P and the pre-gate electrode 120P.

Figure 29:
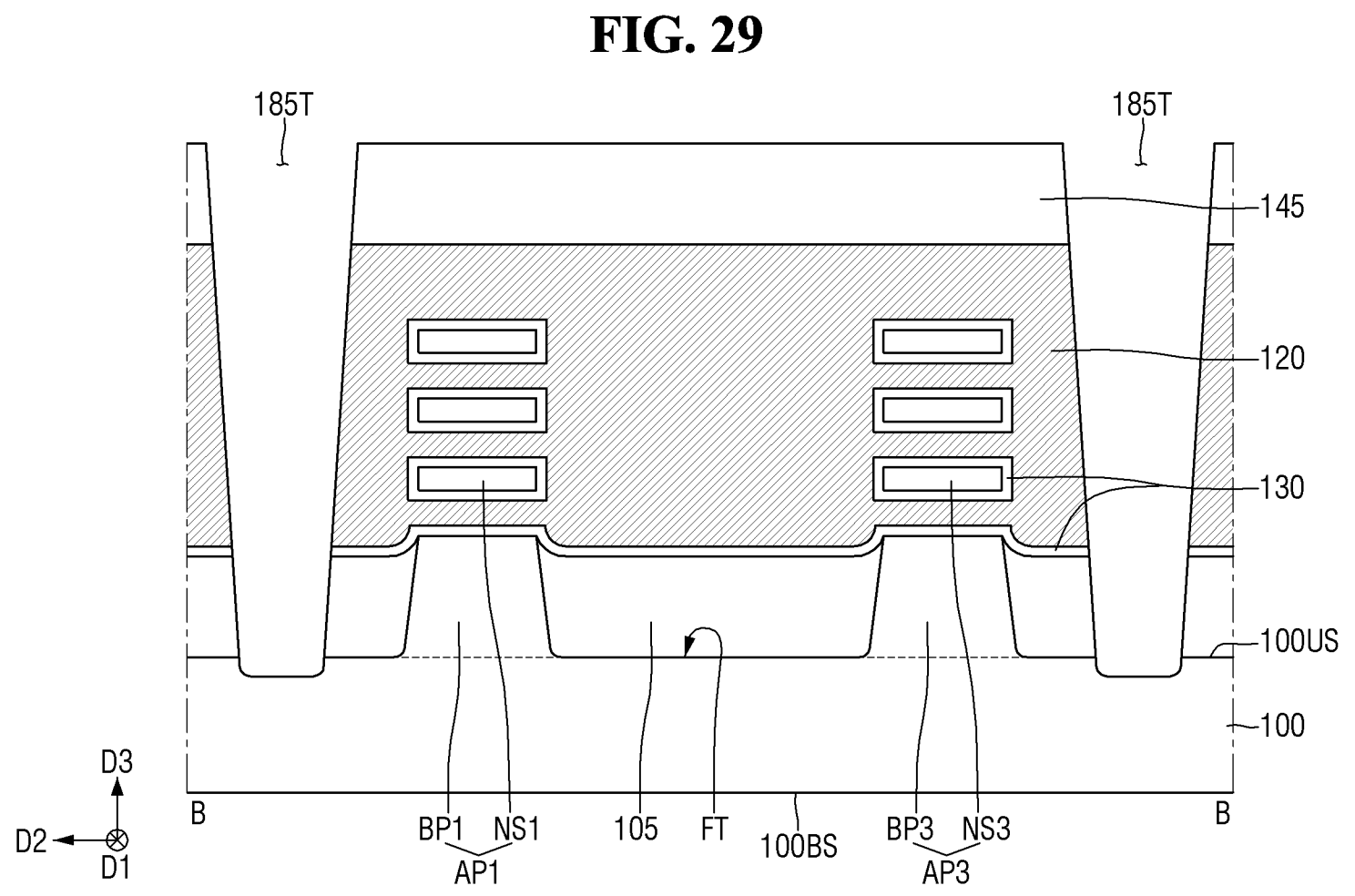
Figure 30:
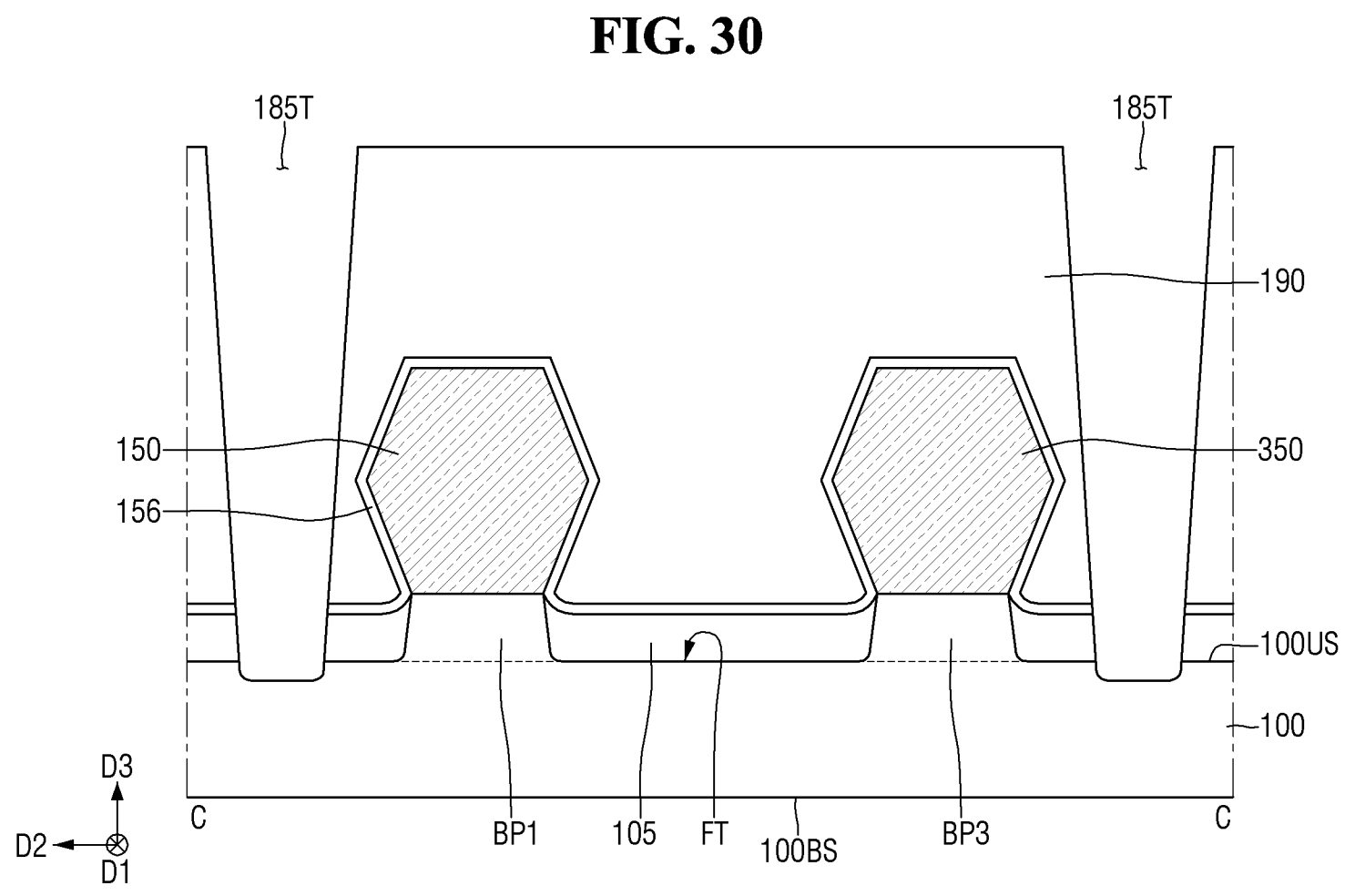
Figure 31:
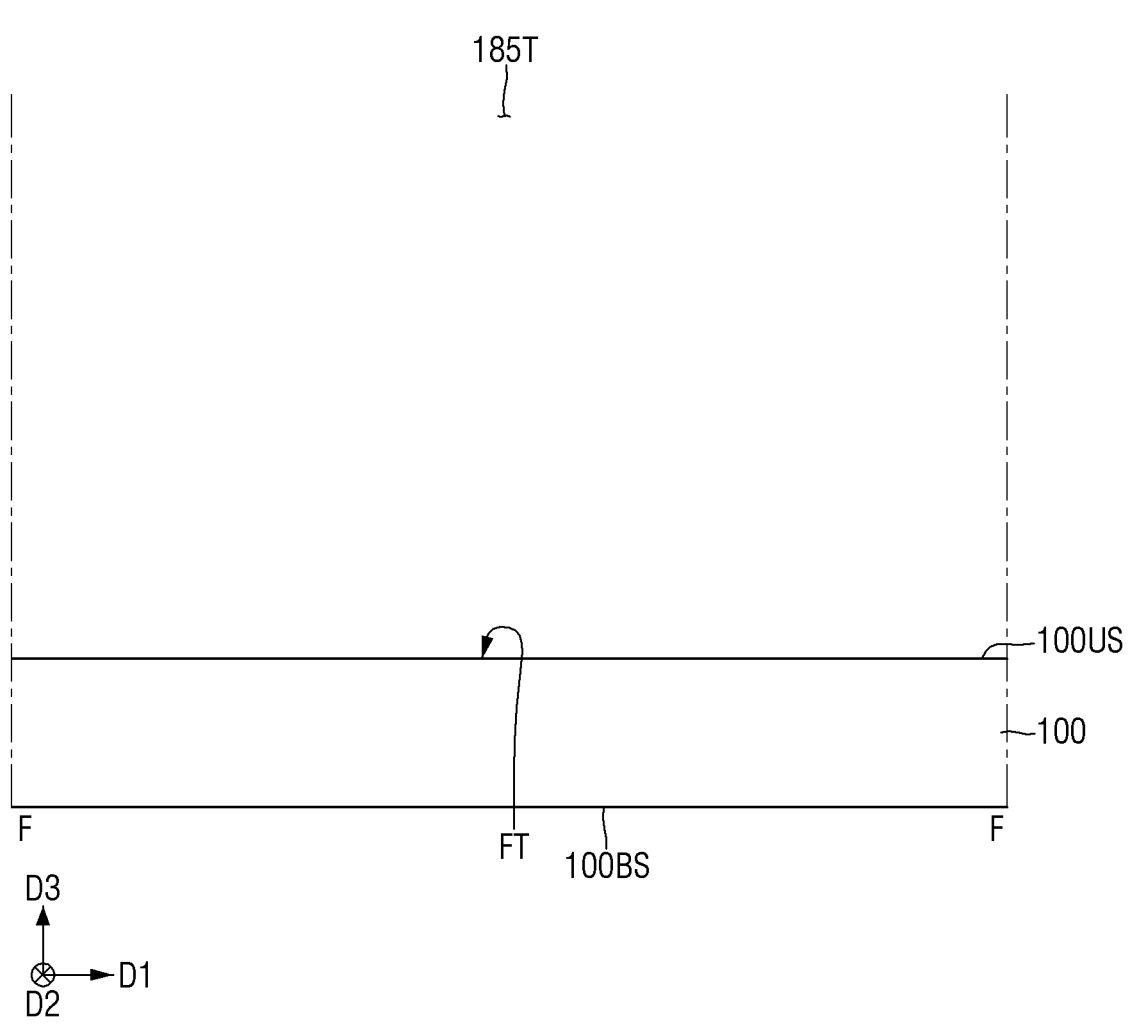

Referring to FIGS. 29 to 31, in an embodiment, a first connection via trench 185T is formed.

The first connection via trench 185T extends in the first direction D1. The first connection via trench 18ST cuts the pre-gate insulating layer 130P, the pre-gate electrode 120P, the pre-gate spacer 140P and the pre-gate capping pattern 145P. As a result, the first gate electrode 120, the first gate insulating layer 130 and the first gate capping pattern 145 are formed. In addition, the first gate spacer (140 in FIG. 2) is formed on the long sidewall of the first gate electrode 120. While the pre-gate insulating layer 130P, the pre-gate electrode 120P, the pre-gate spacer 140P and the pre-gate capping pattern 145P are being cut, the first upper interlayer insulating layer 190, the source/drain etching stop layer 156 and the field insulating layer 105 are removed.

A portion of the first connection via trench 185T is formed in the substrate 100.

Figure 32:
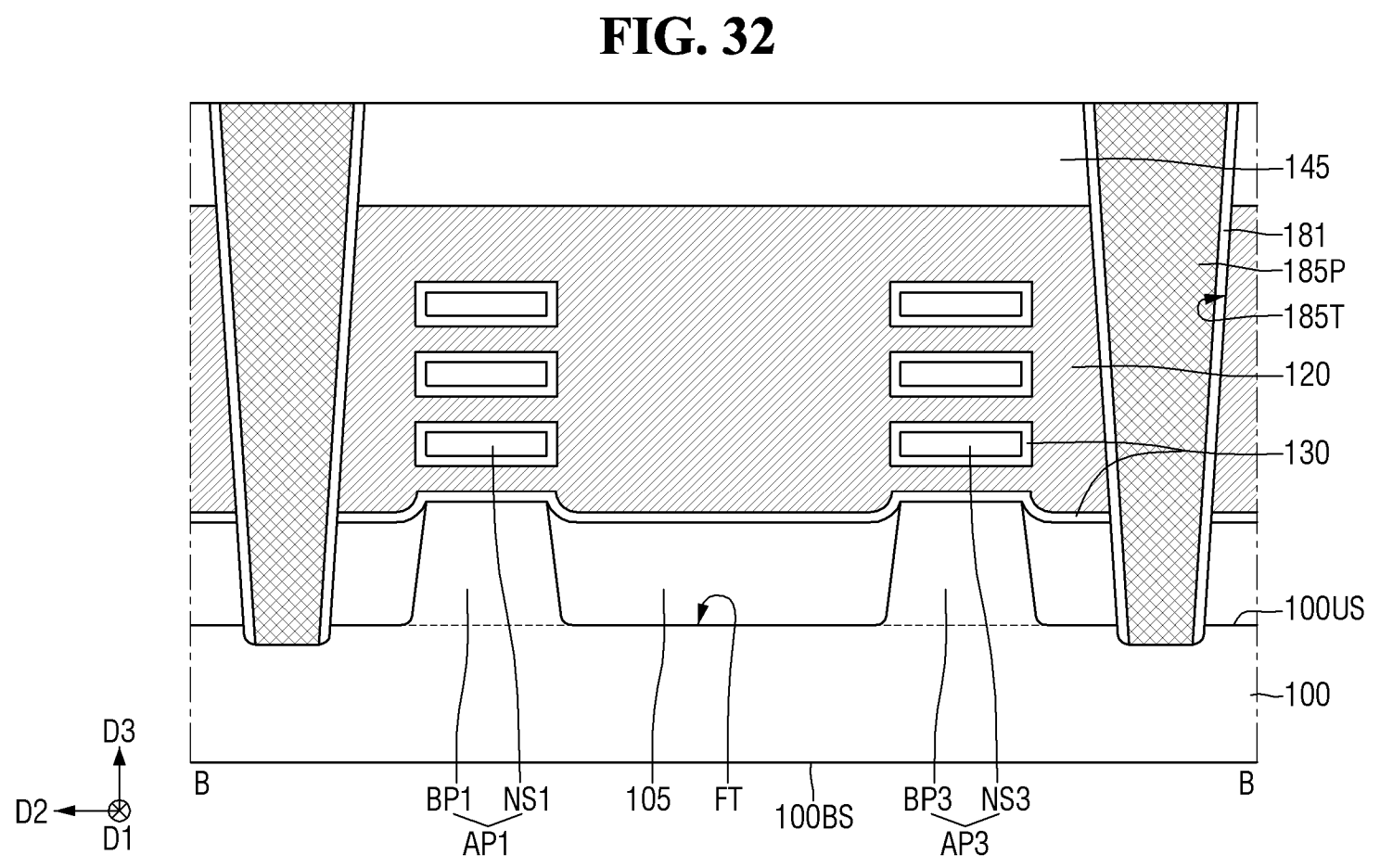
Figure 33:
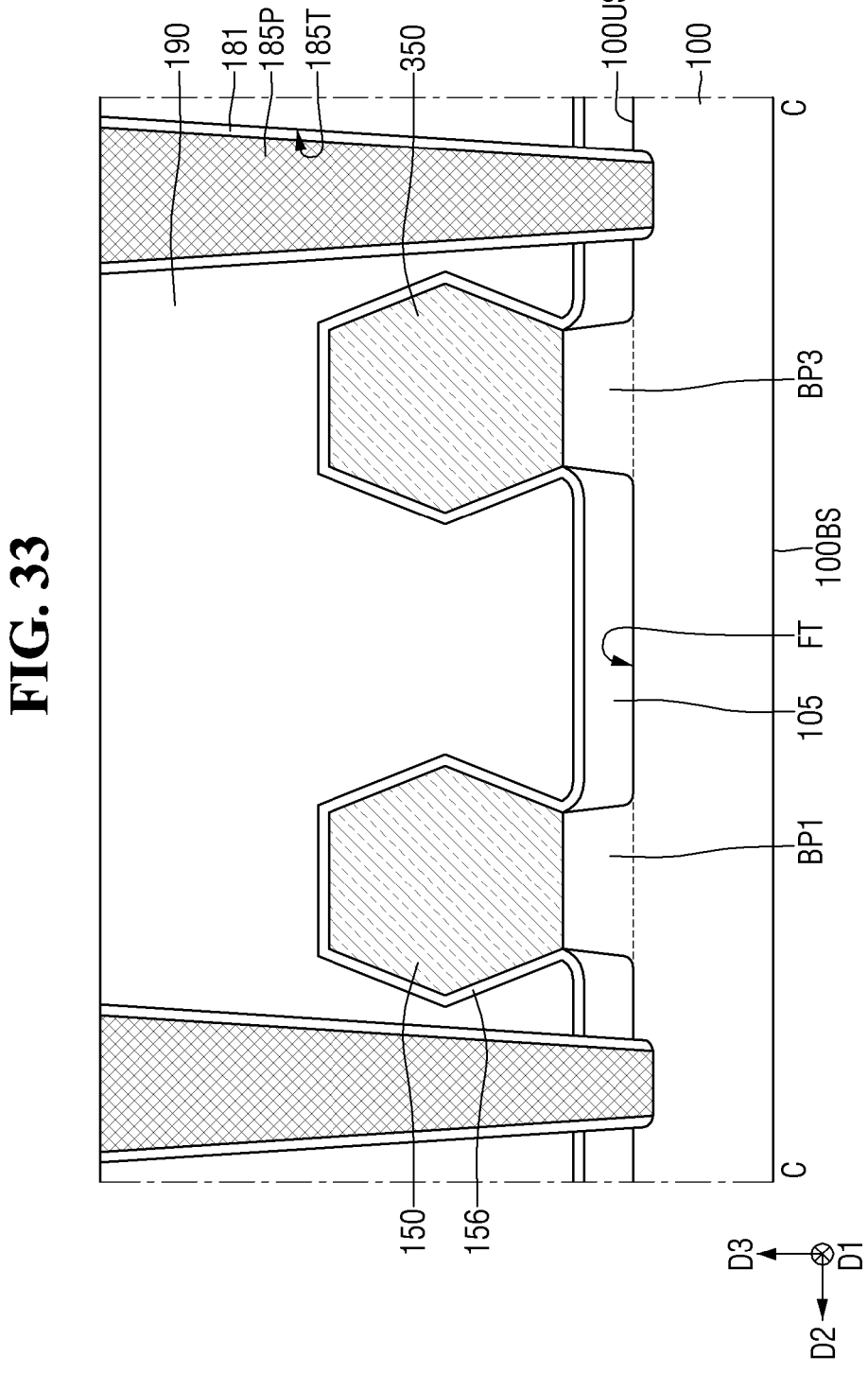
Figure 34:
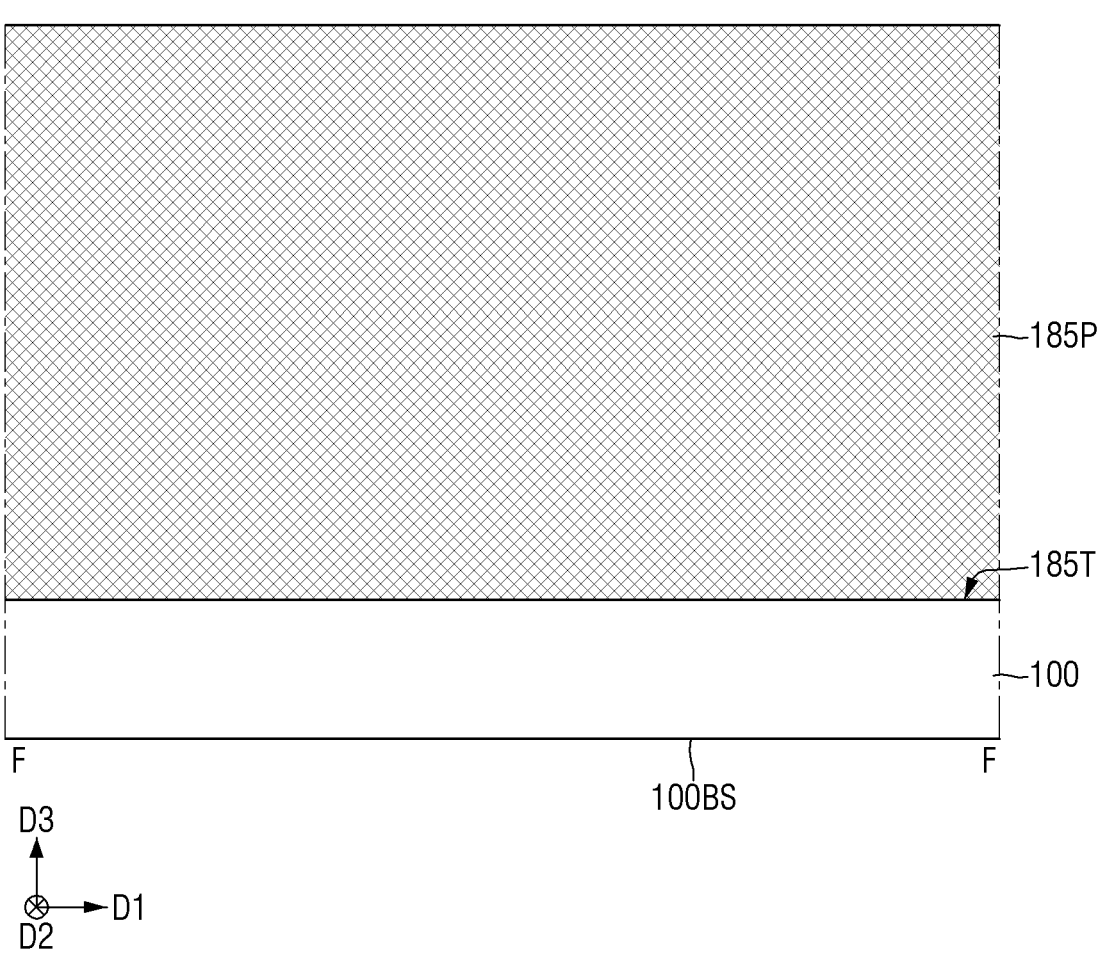

Referring to FIGS. 32 to 34, in an embodiment, the connection via liner 181 is formed along a sidewall of the first connection via trench 185T. The connection via liner 181 extends in the first direction D1.

A connection via conductive layer 185P is formed in the first connection via trench 185T. The connection via conductive layer 185P fills the first connection via trench 185T. The connection via conductive layer 185P is formed on the connection via liner 181.

Figure 35:
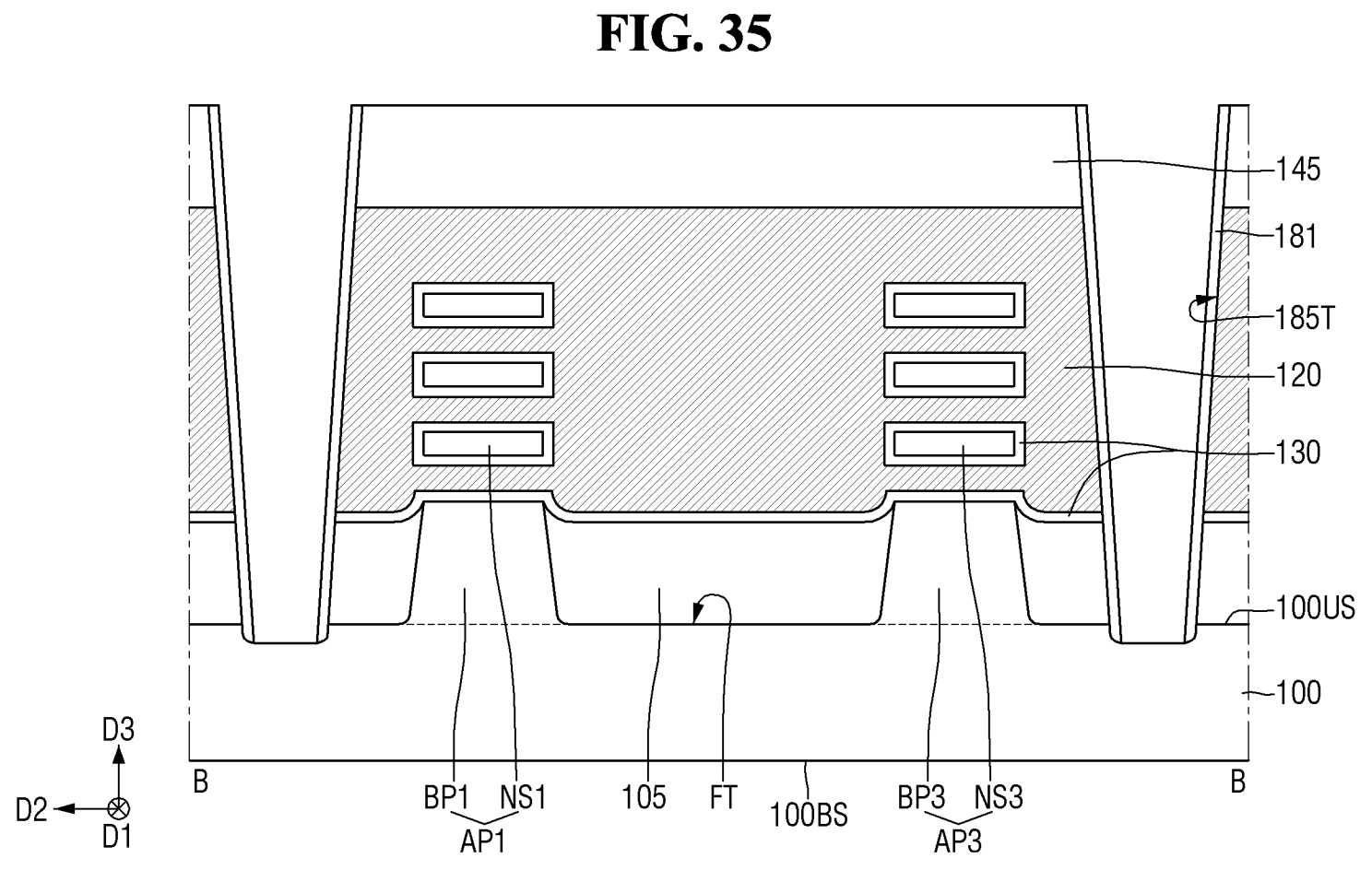
Figure 36:
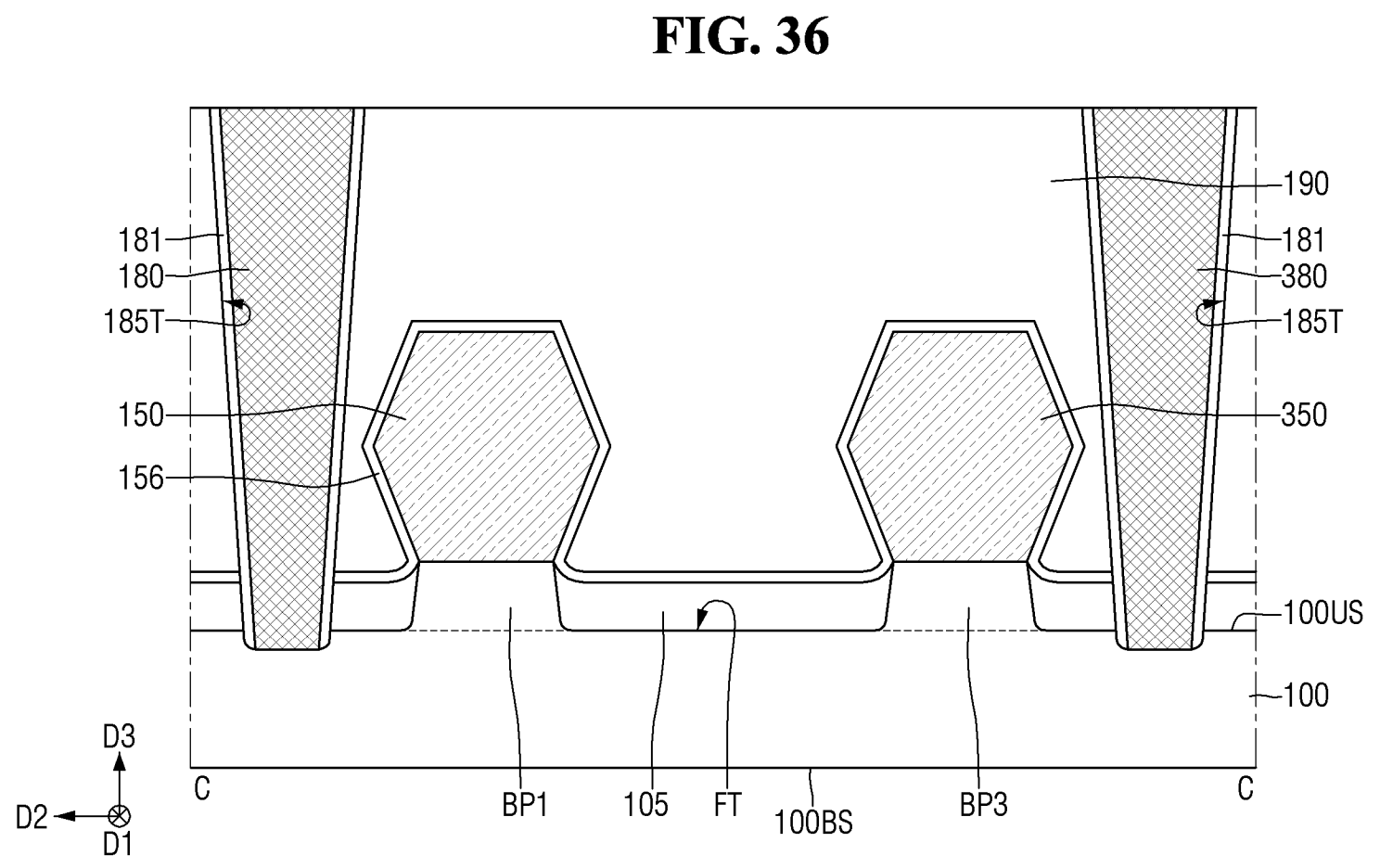
Figure 37:
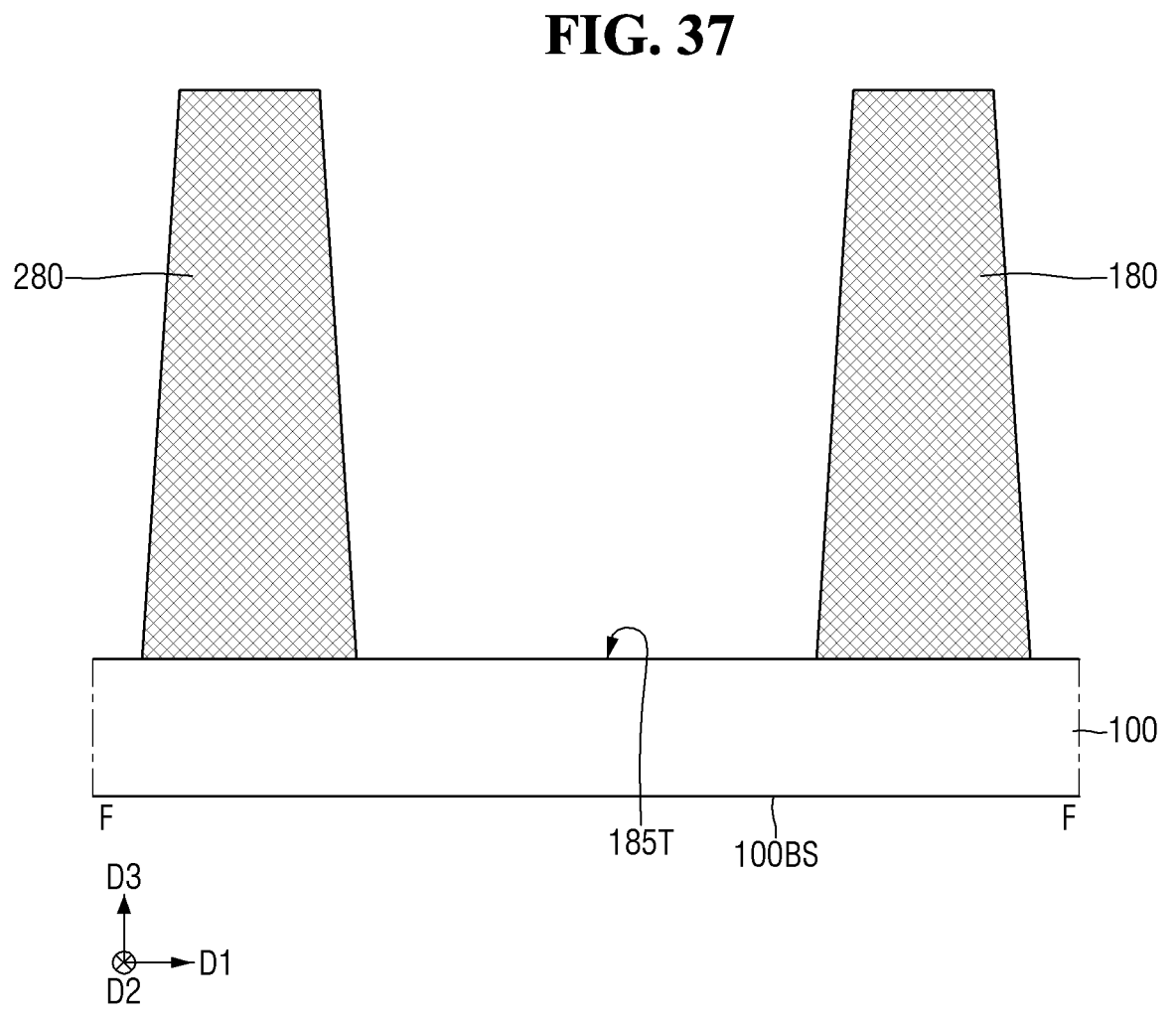

Referring to FIGS. 35 to 37, in an embodiment, the connection via conductive layer 185P is patterned, so that the first contact connection via 180 and the second contact connection via 280 are formed.

The first contact connection via 180 and the second contact connection via 280 are formed by etching a portion of the connection via conductive layer 185P. The first contact connection via 180 and the second contact connection via 280 are formed in the first connection via trench 185T.

While the connection via conductive layer 185P is being patterned, the connection via liner 181 is not removed. However, embodiments are not necessarily limited thereto, and in some embodiments, the connection via liner 181 is removed.

Figure 38:
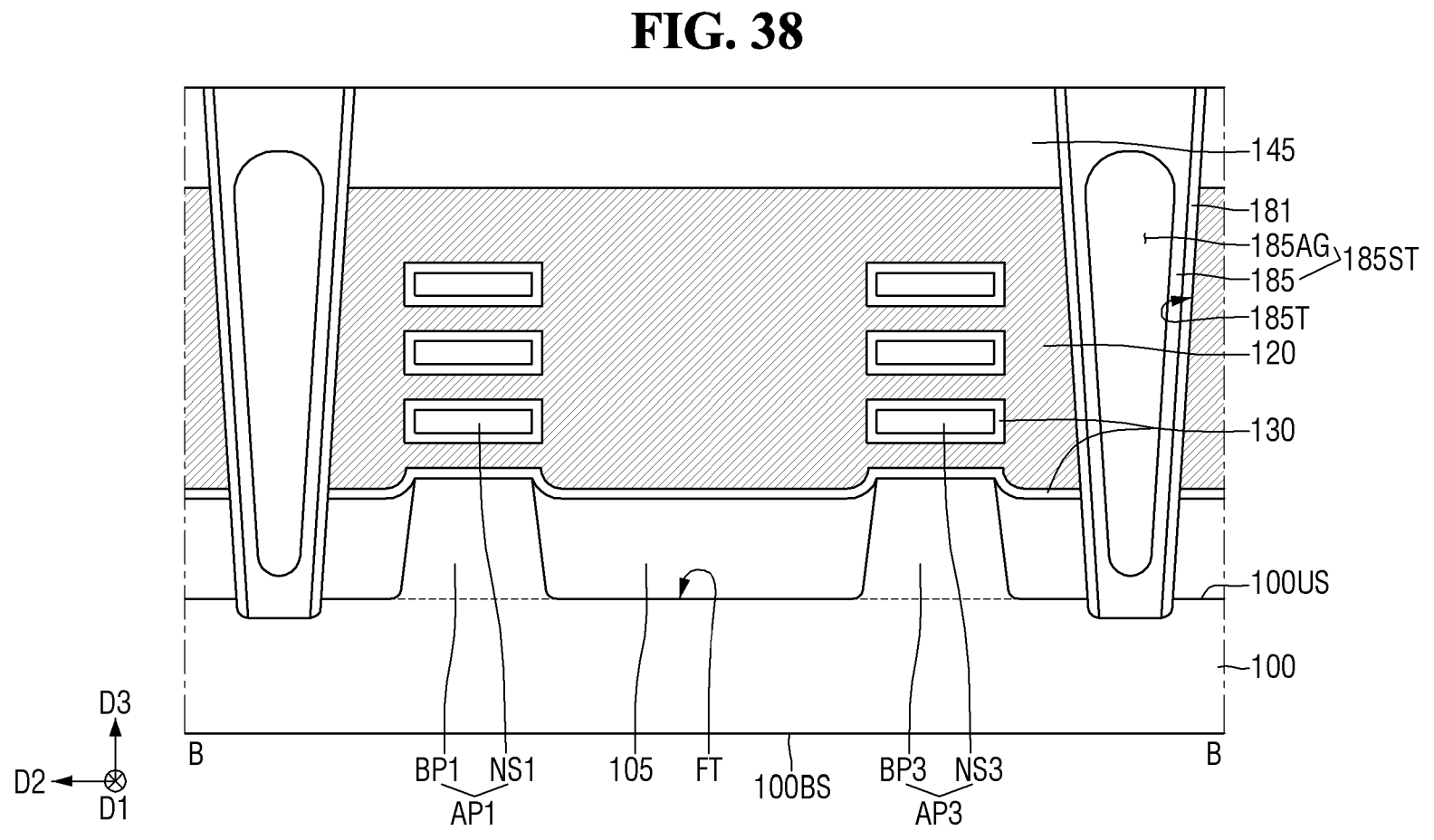
Figure 39:
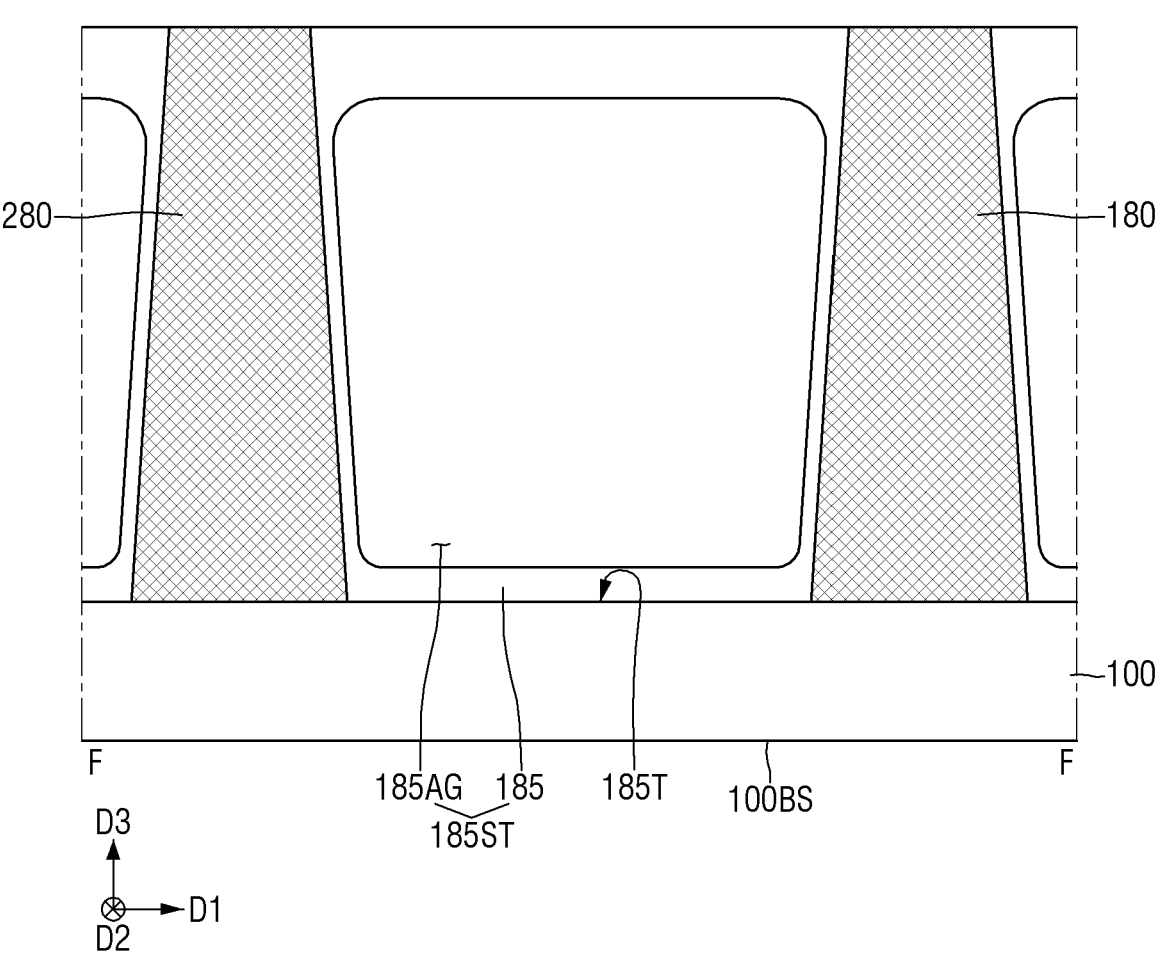

Referring to FIGS. 38 and 39, in an embodiment, the first air gap structure 185ST is formed in the first connection via trench 185T.

The first air gap structure 185ST is formed between the first contact connection via 180 and the second contact connection via 280. The first air gap structure 185ST is in contact with the first contact connection via 180 and the second contact connection via 280.

The first air gap liner 185 is formed in the first connection via trench 18ST. The first air gap liner 185 is formed using a deposition method with poor step coverage. While the first air gap liner 185 is being formed, the first air gap 185AG is formed in the first air gap liner 185.

The second upper interlayer insulating layer 191 and the front wiring structure 195 may be formed on the first air gap structure 185ST and the first gate capping pattern 145. After the front wiring structure 195 is formed, a portion of the substrate 100 is removed. As a result, a thickness of the substrate 100 may be reduced.

The first buried conductive pattern 70 and the second buried conductive pattern 80 are formed in the substrate 100. In addition, the first rear wiring line 50 and the second rear wiring line 60 may be formed.

Figure 40:
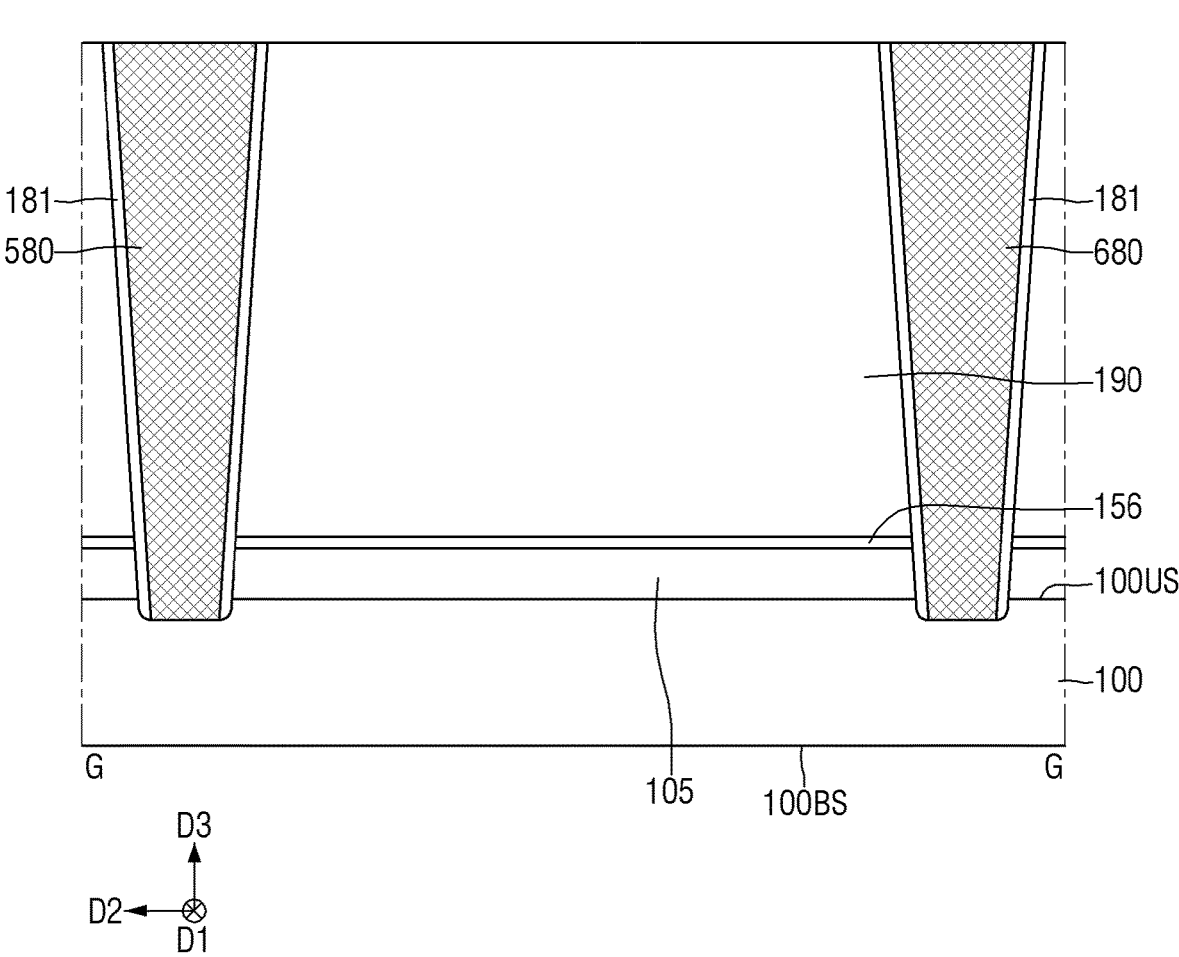
FIGS. 40 to 42 illustrate intermediate steps of a method for manufacturing a semiconductor device according to some embodiments.
Figure 41:
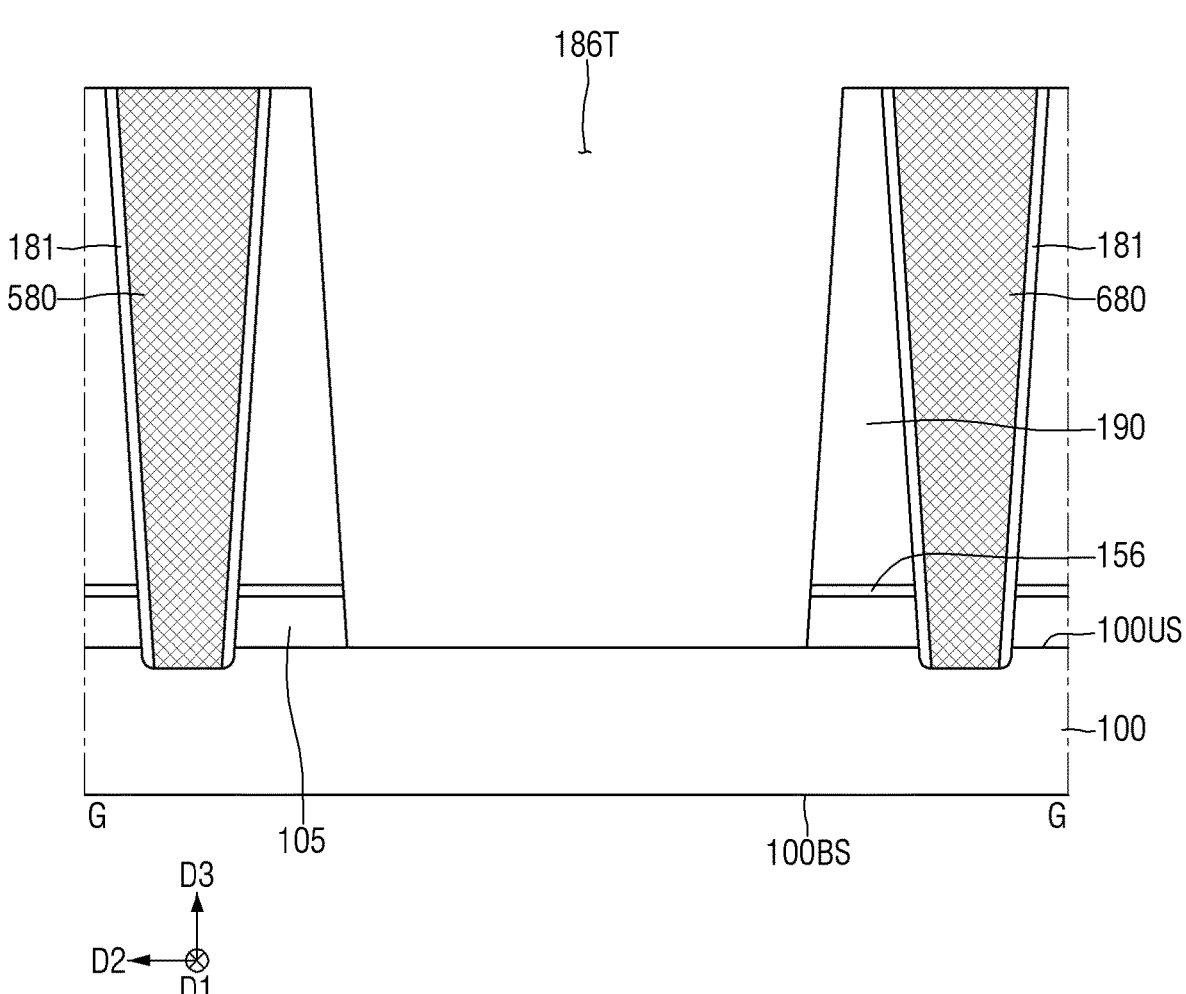
Figure 42:
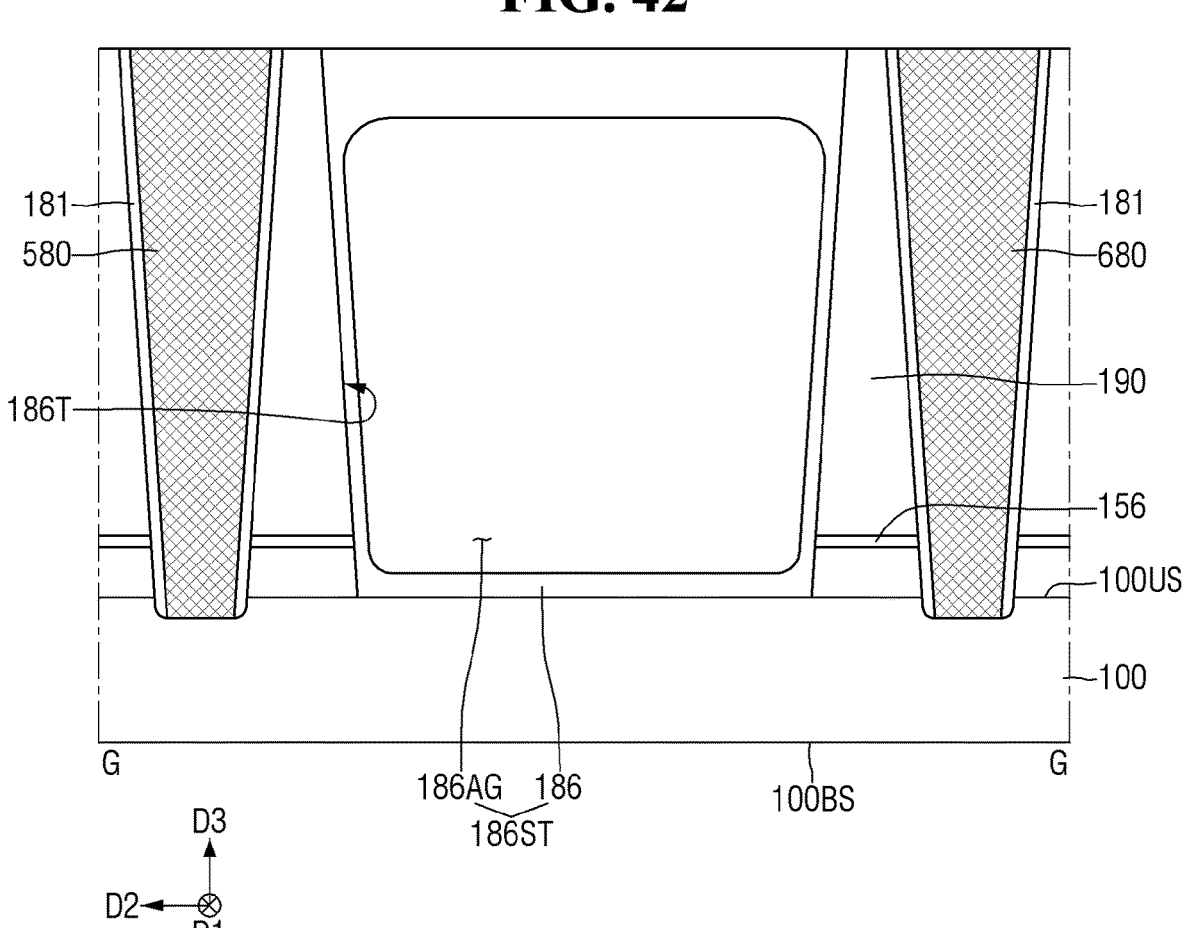

FIGS. 40 to 42 illustrate intermediate steps of a method for manufacturing a semiconductor device according to some embodiments. A semiconductor device described with reference to FIGS. 20 to 25 may be manufactured using FIGS. 40 to 42.

Referring to FIGS. 20 and 40, in an embodiment, the fifth contact connection via 580 and the sixth contact connection via 680 are formed between the first sub-element isolation structure 165_1 and the second sub-element isolation structure 165_2.

The fifth contact connection via 580 and the sixth contact connection via 680 are formed in the first upper interlayer insulating layer 190 between the first sub-element isolation structure 165_1 and the second sub-element isolation structure 165_2. The fifth contact connection via 580 and the sixth contact connection via 680 extend into the substrate 100.

Referring to FIG. 41, in an embodiment, a second connection via trench 186T is formed between the fifth contact connection via 580 and the sixth contact connection via 680.

The second connection via trench 186T is formed in the first upper interlayer insulating layer 190 and the field insulating layer 105. The second connection via trench 186T exposes the substrate 100. However, embodiments are not necessarily limited thereto, and in some embodiments, the second connection via trench 186T does not expose the substrate 100.

Referring to FIG. 42, in an embodiment, the second air gap structure 186ST is formed in the second connection via trench 186T.

The second air gap structure 186ST is formed between the fifth contact connection via 580 and the sixth contact connection via 680. The second air gap liner 186 is formed in the second connection via trench 186T. The second air gap liner 186 is formed using a deposition method with poor step coverage. While the second air gap liner 186 is being formed, the second air gap 186AG is formed in the second air gap liner 186.

In concluding the detailed description, those skilled in the art will appreciate that many variations and modifications can be made to embodiments without substantially departing from the principles of the present inventive concept. Therefore, embodiments of the disclosure are used in a generic and descriptive sense only and not for purposes of limitation.

What is claimed is:

1. A semiconductor device, comprising:
a substrate that includes a first surface and a second surface that are opposite to each other in a first direction;
a first source/drain pattern disposed on the first surface of the substrate;
a second source/drain pattern disposed on the first surface of the substrate and that is spaced apart from the first source/drain pattern in a second direction;
a first source/drain contact disposed on the first source/drain pattern and that is connected to the first source/drain pattern;
a second source/drain contact disposed on the second source/drain pattern and that is connected to the second source/drain pattern;
a rear wiring line disposed on the second surface of the substrate;
a first contact connection via that connects the rear wiring line with the first source/drain contact;

a second contact connection via that connects the rear wiring line with the second source/drain contact and is spaced apart from the first contact connection via in the second direction; and
an air gap structure disposed between the first contact connection via and the second contact connection via.

2. The semiconductor device of claim 1, further comprising a gate electrode disposed on the first surface of the substrate and that extends in a third direction,
wherein the gate electrode is disposed between the first source/drain pattern and the second source/drain pattern.

3. The semiconductor device of claim 2, wherein a width of the first contact connection via in the second direction at a first height from the rear wiring line is greater than that of the first contact connection via in the second direction at a second height from the rear wiring line, and
the first height is lower than the second height.

4. The semiconductor device of claim 3, wherein a width of the first contact connection via in the third direction at the first height from the rear wiring line is less than that of the first contact connection via in the third direction at the second height from the rear wiring line.

5. The semiconductor device of claim 2, further comprising a gate isolation structure disposed between the first contact connection via and the second contact connection via,
wherein the gate electrode includes a long sidewall that extends in the third direction and a short sidewall that extends in the second direction, and
the short sidewall of the gate electrode faces the gate isolation structure.

6. The semiconductor device of claim 1, further comprising:
a first element isolation structure disposed on the first surface of the substrate and that extends in the second direction; and
a second element isolation structure disposed on the first surface of the substrate and that extends in the second direction and is spaced apart from the first element isolation structure in a third direction,
wherein the first contact connection via and the second contact connection via are disposed between the first element isolation structure and the second element isolation structure.

7. The semiconductor device of claim 6, further comprising a front wiring structure disposed on the first surface of the substrate,
wherein the front wiring structure includes a front wiring line that extends in the third direction, and
the front wiring line connects the first source/drain contact with the first contact connection via.

8. The semiconductor device of claim 1, further comprising a buried conductive pattern disposed in the substrate and disposed between the first contact connection via and the rear wiring line.

9. A semiconductor device, comprising:
a substrate that includes a first surface and a second surface that are opposite to each other in a first direction;
a first fin-type pattern that protrudes from the first surface of the substrate in the first direction and extends in a second direction;
a second fin-type pattern that protrudes from the first surface of the substrate in the first direction, extends in the second direction and is spaced apart from the first fin-type pattern in the second direction;

a gate structure disposed on the first fin-type pattern, wherein the gate structure extends in a third direction and includes a gate electrode and a gate insulating layer, wherein the gate electrode includes a long sidewall extended in the third direction and a short sidewall extended in the second direction;

a first source/drain pattern disposed on the first fin-type pattern and that is connected to the first fin-type pattern;

a second source/drain pattern disposed on the second fin-type pattern and that is connected to the second fin-type pattern;

a first source/drain contact disposed on the first source/drain pattern and that is connected to the first source/drain pattern;

a second source/drain contact disposed on the second source/drain pattern and that is connected to the second source/drain pattern:

a rear wiring line disposed on the second surface of the substrate;

a first contact connection via that connects the rear wiring line with the first source/drain contact and overlaps the first source/drain contact in the third direction;

a second contact connection via that connects the rear wiring line with the second source/drain contact and overlaps the second source/drain contact in the third direction; and an air gap structure disposed between the first contact connection via and the second contact connection via.

10. The semiconductor device of claim 9, wherein each of the first contact connection via and the second contact connection via includes a first sidewall and a second sidewall that are opposite to each other in the second direction, the first sidewall of the first contact connection via faces the first sidewall of the second contact connection via, and a distance between the first sidewall of the first contact connection via and the first sidewall of the second contact connection via increases with increasing distance from the rear wiring line.

11. The semiconductor device of claim 10, wherein a width of the first contact connection via in the third direction at a first height from the rear wiring line is less than that of the first contact connection via in the third direction at a second height from the rear wiring line, and the first height is lower than the second height.

12. The semiconductor device of claim 10, wherein the gate insulating layer does not extend in the first direction along the short sidewall of the gate electrode.

13. The semiconductor device of claim 10, wherein the gate insulating layer extends in the first direction along the short sidewall of the gate electrode.

14. The semiconductor device of claim 10, further comprising a gate isolation structure that faces the short sidewall of the gate electrode.

15. The semiconductor device of claim 10, further comprising a plurality of sheet patterns disposed on the first fin-type pattern, wherein the gate electrode and the gate insulating layer surround the sheet pattern.

16. The semiconductor device of claim 10, further comprising an element isolation structure disposed on the first surface of the substrate and that extends in the third direction, wherein the element isolation structure separates the first fin-type pattern from the second fin-type pattern.

17. The semiconductor device of claim 10, further comprising a buried conductive pattern disposed in the substrate and disposed between the first contact connection via and the rear wiring line.

18. A semiconductor device, comprising:

a substrate that includes a first surface and a second surface that are opposite to each other in a first direction;

a first element isolation structure disposed on the first surface of the substrate and that extends in a second direction;

a second element isolation structure disposed on the first surface of the substrate and that extends in the second direction and is spaced apart from the first element isolation structure in a third direction;

a first fin-type pattern that protrudes from the first surface of the substrate in the first direction and extends in the third direction;

a second fin-type pattern that protrudes from the first surface of the substrate in the first direction and that extends in the third direction and is spaced apart from the first fin-type pattern in the second direction;

a gate electrode disposed on the first fin-type pattern and that extends in the second direction;

a first source/drain pattern disposed on the first fin-type pattern and that is connected to the first fin-type pattern;

a second source/drain pattern disposed on the second fin-type pattern and that is connected to the second fin-type pattern;

a first source/drain contact disposed on the first source/drain pattern and that is connected to the first source/drain pattern;

a second source/drain contact disposed on the second source/drain pattern and that is connected to the second source/drain pattern;

first and second rear wiring lines disposed on the second surface of the substrate;

a first contact connection via connected to the first rear wiring line between the first element isolation structure and the second element isolation structure;

a second contact connection via connected to the second rear wiring line between the first element isolation structure and the second element isolation structure and that is spaced apart from the first contact connection via in the second direction;

an air gap structure disposed between the first contact connection via and the second contact connection via;

a first front wiring line disposed on the first element isolation structure and the second element isolation structure and that extends in the third direction and connects the first contact connection via with the first source/drain contact; and a second front wiring line disposed on the first element isolation structure and the second element isolation structure and that extends in the third direction and connects the second contact connection via with the second source/drain contact.

19. The semiconductor device of claim 18, wherein the first fin-type pattern and the second fin-type pattern are not disposed between the first element isolation structure and the second element isolation structure.

20. The semiconductor device of claim 18, further comprising a plurality of sheet patterns disposed on the first fin-type pattern, wherein the gate electrode surrounds the sheet patterns.

* * * * *